US011271160B2

(12) United States Patent
Lau et al.

(10) Patent No.: US 11,271,160 B2
(45) Date of Patent: Mar. 8, 2022

(54) RINSE-REMOVAL OF INCUBATED NANOTUBES THROUGH SELECTIVE EXFOLIATION

(71) Applicant: Massachusetts Institute of Technology, Cambridge, MA (US)

(72) Inventors: Christian Lau, Boston, MA (US); Max Shulaker, Weston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/320,741

(22) Filed: May 14, 2021

(65) Prior Publication Data
US 2021/0351354 A1 Nov. 11, 2021

Related U.S. Application Data

(63) Continuation of application No. PCT/US2019/063932, filed on Dec. 2, 2019.
(Continued)

(51) Int. Cl.
*H01L 51/00* (2006.01)
*H01L 51/05* (2006.01)
(Continued)

(52) U.S. Cl.
CPC ........ *H01L 51/0025* (2013.01); *C01B 32/174* (2017.08); *H01L 51/0048* (2013.01);
(Continued)

(58) Field of Classification Search
CPC ............. H01L 51/0025; H01L 51/0048; H01L 51/0558; H01L 51/107; H01L 27/283;
(Continued)

(56) References Cited

U.S. PATENT DOCUMENTS 6,191,724 B1 2/2001 McEwan
6,462,929 B2 10/2002 Compton et al.
(Continued)

FOREIGN PATENT DOCUMENTS

| EP | 0190070 B1 | 8/1992 |
| WO | 2014113722 A1 | 7/2014 |
| WO | 2017001406 A3 | 4/2017 |

OTHER PUBLICATIONS

A formal semantics of the RISC-V ISA in Haskell Github. Accessed at https://github.com/mit-plv/riscv-semantics on Feb. 13, 2020. 3 pages.
(Continued)

*Primary Examiner* — Hrayr A Sayadian
(74) *Attorney, Agent, or Firm* — Smith Baluch LLP

(57) ABSTRACT

A technology called RINSE (Removal of Incubated Nanotubes through Selective Exfoliation) is demonstrated. RINSE removes carbon nanotube (CNT) aggregates in CNFETs without compromising CNFET performance. In RINSE, CNTs are deposited on a substrate, coated with a thin adhesive layer, and sonicated. The adhesive layer is strong enough to keep the individual CNTs on the substrate, but not the larger CNT aggregates. When combined with a CNFET CMOS process as disclosed here, record CNFET CMOS yield and uniformity can be realized.

23 Claims, 68 Drawing Sheets

Related U.S. Application Data

(60) Provisional application No. 62/773,419, filed on Nov. 30, 2018.

(51) Int. Cl.
*C01B 32/174* (2017.01)
*H01L 51/10* (2006.01)
*H01L 27/28* (2006.01)
*B82Y 40/00* (2011.01)

(52) U.S. Cl.
CPC ........ *H01L 51/0558* (2013.01); *H01L 51/107* (2013.01); *B82Y 40/00* (2013.01); *C01B 2202/22* (2013.01); *C01P 2004/13* (2013.01); *C01P 2004/64* (2013.01); *H01L 27/283* (2013.01)

(58) Field of Classification Search
CPC ............... C01B 32/174; C01B 2202/22; C01P 2004/13; C01P 2004/64
USPC .......................................................... 438/99
See application file for complete search history.

(56) References Cited

U.S. PATENT DOCUMENTS

| | | | |
|---|---|---|---|
| 7,598,544 B2 | 10/2009 | Bertin et al. | |
| 7,859,385 B2 | 12/2010 | Bertin et al. | |
| 8,557,659 B2 | 10/2013 | Teo et al. | |
| 8,685,815 B2 | 4/2014 | Ahn et al. | |
| 8,772,141 B2 | 7/2014 | Afzali-Ardakani et al. | |
| 8,785,911 B2 | 7/2014 | Chen et al. | |
| 8,946,007 B2 | 2/2015 | Doris et al. | |
| 9,209,288 B2 | 12/2015 | Avci et al. | |
| 9,613,879 B2 | 4/2017 | Hersam et al. | |
| 11,062,067 B2 | 7/2021 | Hills et al. | |
| 2004/0099438 A1 | 5/2004 | Arthur et al. | |
| 2006/0115640 A1* | 6/2006 | Yodh | B82Y 40/00 428/221 |
| 2006/0183278 A1* | 8/2006 | Bertin | H01L 21/823807 438/197 |
| 2006/0204427 A1 | 9/2006 | Ghenciu et al. | |
| 2008/0210987 A1 | 9/2008 | Bondavalli et al. | |
| 2009/0184346 A1 | 7/2009 | Jain | |
| 2010/0111813 A1* | 5/2010 | Fan | B82Y 40/00 423/447.1 |
| 2011/0147715 A1 | 6/2011 | Rogers et al. | |
| 2012/0129273 A1 | 5/2012 | Johnson, Jr. et al. | |
| 2012/0326126 A1 | 12/2012 | Chen et al. | |
| 2014/0017886 A1 | 1/2014 | Teo et al. | |
| 2014/0175376 A1 | 6/2014 | Avci et al. | |
| 2015/0227669 A1 | 8/2015 | Joshi et al. | |
| 2015/0370948 A1 | 12/2015 | Kawa et al. | |
| 2016/0123919 A1 | 5/2016 | Johnson et al. | |
| 2016/0133843 A1 | 5/2016 | Rogers et al. | |
| 2016/0147934 A1 | 5/2016 | Keller et al. | |
| 2016/0190492 A1 | 6/2016 | Li et al. | |
| 2017/0005140 A1 | 1/2017 | Bertin | |
| 2017/0162710 A1 | 6/2017 | Shih et al. | |
| 2017/0179283 A1 | 6/2017 | Pourghaderi et al. | |
| 2017/0294583 A1 | 10/2017 | Liang et al. | |
| 2020/0082032 A1 | 3/2020 | Hills et al. | |
| 2021/0050417 A1 | 2/2021 | Shulaker et al. | |

OTHER PUBLICATIONS

Aly et al., "Energy-efficient abundant-data computing: The N3XT 1,000 x." Computer 48.12 (2015): 24-33.
Aly et al., "The N3XT approach to energy-efficient abundant-data computing." Proceedings of the IEEE 107.1 (2018): 19-48.
Appenzeller, Carbon Nanotubes for High-Performance Electronics—Progress and Prospect. Proc. IEEE 2008, 96, 201-211.
Aria et al., Parameter Space of Atomic Layer Deposition of Ultrathin Oxides on Graphene. ACS Appl. Mater. Interfaces 2016, 8, 30564-30575.
Asanovic et al., The berkeley out-of-order machine (boom): An industry-competitive, synthesizable, parameterized risc-v processor. No. UCB-EECS-2015-167. University of California at Berkeley Berkeley United States, 2015. 5 pages.
Bardon et al., "Extreme scaling enabled by 5 tracks cells: Holistic design-device co-optimization for FinFETs and lateral nanowires." Electron Devices Meeting (IEDM), 2016 IEEE International. IEEE, 2016.
Batude et al., "Advances, challenges and opportunities in 3D CMOS sequential integration." 2011 International Electron Devices Meeting. IEEE, 2011. 4 pages.
Boots et al., "Identification of microorganisms based on headspace analysis of volatile organic compounds by gas chromatography-mass spectrometry." Journal of breath research 8.2 (2014): 027106. 13 pages.
Bos et al., "The volatile metabolic fingerprint of ventilator-associated pneumonia." Intensive care medicine 40.5 (2014): 761-762.
Bos et al., "Volatile metabolites of pathogens: a systematic review." PLoS pathog 9.5 (2013): e1003311. 8 pages.
Brady et al., "Polyfluorene-sorted, carbon nanotube array field-effect transistors with increased current density and high on/off ratio." ACS nano 8.11 (2014): 11614-11621.
Brady et al., "Quasi-ballistic carbon nanotube array transistors with current density exceeding Si and GaAs." Science advances 2.9 (2016): e1601240. 10 pages.
Cao et al., "Arrays of single-walled carbon nanotubes with full surface coverage for high-performance electronics." Nature nanotechnology 8.3 (2013): 180. 7 pages.
Cao et al., "Carbon nanotube transistors scaled to a 40-nanometer footprint." Science 356.6345 (2017): 1369-1372.
Cao et al., "End-bonded contacts for carbon nanotube transistors with low, size-independent resistance." Science350.6256 (2015): 68-72.
Cao et al., "Medium-scale carbon nanotube thin-film integrated circuits on flexible plastic substrates." Nature 454.7203 (2008): 495-500.
Chen et al., "Externally assembled gate-all-around carbon nanotube field-effect transistor." IEEE electron device letters 29.2 (2008): 183-185.
Chen et al., The Role of Metal-Nanotube Contact in the Performance of Carbon Nanotube Field-Effect Transistors. Nano Lett. 2005, 5, 1497-1502.
Clark et al., "ASAP7: A 7-nm finFET predictive process design kit." Microelectronics Journal 53 (2016): 105-115.
Cook, "Ventilator associated pneumonia: perspectives on the burden of illness." Intensive care medicine 26.1 (2000): S031-S037.
Deng et al., "Carbon nanotube transistor circuits: Circuit-level performance benchmarking and design options for living with imperfections." Solid-State Circuits Conference, 2007. ISSCC 2007. Digest of Technical Papers. IEEE International. IEEE, 2007. 3 pages.
Desai et al., "MoS2 transistors with 1-nanometer gate lengths." Science 354.6308 (2016): 99-102.
Design Compiler Graphical. Synopsys, Inc. Accessed at https://www.synopsys.com/implementation-and-signoff/rtl-synthesis-test/design-compiler-graphical.html on Mar. 2, 2021. 6 pages.
Ding et al., "CMOS-based carbon nanotube pass-transistor logic integrated circuits." Nature communications 3.1 (2012): 1-7.
Ding et al., "Y-contacted high-performance n-type single-walled carbon nanotube field-effect transistors: scaling and comparison with Sc-contacted devices." Nano letters 9.12 (2009): 4209-4214.
Farmer et al., "Atomic layer deposition on suspended single-walled carbon nanotubes via gas-phase noncovalent functionalization." Nano letters 6.4 (2006): 699-703.
Filipiak et al., "Molecular analysis of volatile metabolites released specifically by *Staphylococcus aureus* and *Pseudomonas aeruginosa*." BMC microbiology 12.1 (2012): 1-16.
Fowler et al., "Critical care capacity in Canada: results of a national cross-sectional study." Critical care 19.1 (2015): 1-8.

(56) References Cited

OTHER PUBLICATIONS

Fowler et al., "Surveillance for lower airway pathogens in mechanically ventilated patients by metabolomic analysis of exhaled breath: a case-control study." Thorax 70.4 (2015): 320-325.
Franklin et al., "Carbon nanotube complementary wrap-gate transistors." Nano letters 13.6 (2013): 2490-2495.
Franklin et al., "Scalable and fully self-aligned n-type carbon nanotube transistors with gate-all-around." Electron Devices Meeting (IEDM), 2012 IEEE International. IEEE, 2012. 4 pages.
Franklin et al., "Sub-10 nm carbon nanotube transistor." Nano letters 12.2 (2012): 758-762.
Geier et al., "Controlled n-type doping of carbon nanotube transistors by an organorhodium dimer." Nano letters 16.7 (2016): 4329-4334.
Geier et al., Subnanowatt Carbon Nanotube Complementary Logic Enabled by Threshold Voltage Control. Nano Lett. 2013, 13, 4810-4814.
Gouma et al., "Novel isoprene sensor for a flu virus breath monitor." Sensors 17.1 (2017): 199. 7 pages.
Ha et al., Highly Uniform and Stable N-Type Carbon Nanotube Transistors by Using Positively Charged Silicon Nitride Thin Films. Nano Lett. 2015, 15, 392-397.
Hahn et al., "A scaled replacement metal gate InGaAs-on-Insulator n-FinFET on Si with record performance." Electron Devices Meeting (IEDM), 2017 IEEE International. IEEE, 2017. 4 pages.
Han et al., "High-speed logic integrated circuits with solution-processed self-assembled carbon nanotubes." Nature nanotechnology 12.9 (2017): 861. 7 pages.
Heinze et al., Carbon Nanotubes as Schottky Barrier Transistors. Phys. Rev. Lett. 2002, 89, 106801. 4 pages.
High Purity, Electronically Separated Nanomaterials. NanoIntegris. Accessed at http://nanointegris.com/ on Feb. 13, 2020. 8 pages.
Hills et al., "Rapid Co-Optimization of Processing and Circuit Design to Overcome Carbon Nanotube Variations." IEEE Trans. on CAD of Integrated Circuits and Systems 34.7 (2015): 1082-1095.
Hills et al., "TRIG: hardware accelerator for inference-based applications and experimental demonstration using carbon nanotube FETs." Proceedings of the 55th Annual Design Automation Conference. 2018. 10 pages.
Hills et al., "Understanding energy efficiency benefits of carbon nanotube field-effect transistors for digital VLSI." IEEE Transactions on Nanotechnology 17.6 (2018): 1259-1269.
Humphreys et al., "Electronic nose analysis of bronchoalveolar lavage fluid." European journal of clinical investigation 41.1 (2011): 52-58.
IC Compiler II. Synopsys, Inc. Accessed at https://www.synopsys.com/implementation-and-signoff/physical-implementation/ic-compiler.html on Mar. 2, 2021. 6 pages.
International Search Report and Written Opinion in International Application No. PCT/US2019/050286 dated May 19, 2020, 16 pages.
International Search Report and Written Opinion in International Patent Application No. PCT/US19/15595 dated Apr. 19, 2019, 14 pages.
International Search Report and Written Opinion in International Patent Application No. PCT/US2019/036006 dated Oct. 16, 2019, 13 pages.
International Search Report and Written Opinion in International Patent Application No. PCT/US2019/052675 dated Jan. 14, 2020, 16 pages.
Geier et al., "Solution-processed carbon nanotube thin-film complementary static random access memory." Nature nanotechnology 10.11 (2015): 944. 6 pages.
Hills et al., Modern microprocessor built from complementary carbon nanotube transistors. Nature 572.7771 (2019): 595-602.
International Search Report and Written Opinion in International Patent Application No. PCT/US2019/063932 dated Feb. 19, 2020, 14 pages.
Li et al., "Facile method for enhancing conductivity of printed carbon nanotubes electrode via simple rinsing process." Organic Electronics 47 (2017): 174-180.
Javey et al., "Ballistic carbon nanotube field-effect transistors." nature 424.6949 (2003): 654-657.
Joo et al., Dose-Controlled, Floating Evaporative Self-Assembly and Alignment of Semiconducting Carbon Nanotubes from Organic Solvents. Langmuir 2014, 30, 3460-3466.
Kalil et al., "Executive summary: management of adults with hospital-acquired and ventilator-associated pneumonia: 2016 clinical practice guidelines by the Infectious Diseases Society of America and the American Thoracic Society." Clinical Infectious Diseases 63.5 (2016): 575-582.
Kalil et al., "Management of adults with hospital-acquired and ventilator-associated pneumonia: 2016 clinical practice guidelines by the Infectious Diseases Society of America and the American Thoracic Society." Clinical Infectious Diseases 63.5 (2016): e61-e111.
Kang et al., CMOS digital integrated circuits. Tata McGraw-Hill Education, 2003. 83 pages.
Khan et al., "Science and research policy at the end of Moore's law." Nature Electronics 1.1 (2018): 14-21.
Kim et al., "Atomic layer deposited Al 2 O 3 for gate dielectric and passivation layer of single-walled carbon nanotube transistors." Applied physics letters 90.16 (2007): 163108. 4 pages.
Koenig et al., "Ventilator-associated pneumonia: diagnosis, treatment, and prevention." Clinical microbiology reviews 19.4 (2006): 637-657.
Kollef et al., "Economic impact of ventilator-associated pneumonia in a large matched cohort." (2012). 9 pages.
Kuhn et al., The Ultimate CMOS Device and Beyond. In IEEE Int. Electron Devices Meet.; 2012; vol. 8.1.1?8.1.4 pages.
KUHN,. "Considerations for ultimate CMOS scaling." IEEE transactions on Electron Devices 59.7 (2012): 1813-1828.
Kuti et al., "Impact of inappropriate antibiotic therapy on mortality in patients with ventilator-associated pneumonia and blood stream infection: a meta-analysis." Journal of critical care 23.1 (2008): 91-100.
La Tulipe et al., "Upside-down FETS." SOI Conference, 2008. SOI IEEE International. IEEE, 2008. 2 pages.
Lau et al., "Tunable n-type doping of carbon nanotubes through engineered atomic layer deposition HfOX films." ACS nano 12.11 (2018): 10924-10931.
Lee et al., "A compact virtual-source model for carbon nanotube FETs in the sub-10-nm regime—Part I: Intrinsic elements." IEEE transactions on electron devices 62.9 (2015): 3061-3069.
Library Design. Silvaco, Inc. Accessed at https://silvaco.com/services/library-design/ on Mar. 2, 2021. 4 pages.
Liebmann et al., "Overcoming scaling barriers through design technology cooptimization." VLSI Technology, 2016 IEEE Symposium on. IEEE, 2016. 2 pages.
Lin et al., "ACCNT—A metallic-CNT-tolerant design methodology for carbon-nanotube VLSI: Concepts and experimental demonstration." IEEE Transactions on Electron Devices 56.12 (2009): 2969-2978.
Liu et al., Carbon Nanotube-Based Three-Dimensional Monolithic Optoelectronic Integrated System. Nat. Commun. 2017, 8, 15649. 8 pages.
Machado et al., "Cost-effectiveness of linezolid versus vancomycin in mechanical ventilation-associated nosocomial pneumonia caused by methicillin-resistant *Staphylococcus aureus*." Brazilian Journal of Infectious Diseases 9.3 (2005): 191-200.
Markov et al., "Progress and challenges in VLSI placement research." Proceedings of the IEEE 103.11 (2015): 1985-2003.
McClellan et al., Effective N-Type Doping of Monolayer MoS2 by AlOx. In 2017 75th Annual Device Research Conference (DRC); IEEE, 2017; 1-2.
Melsen et al., "Attributable mortality of ventilator-associated pneumonia: a meta-analysis of individual patient data from randomised prevention studies." The Lancet infectious diseases 13.8 (2013): 665-671.
Mistry, 10 nm Technology Leadership. Leading at the edge technology and manufacturing day 2017. Intel. Accessed at https://

(56) References Cited

OTHER PUBLICATIONS newsroom.intel.com/newsroom/wp-content/uploads/sites/11/2017/03/Kaizad-Mistry-2017-Manufacturing.pdf. 37 pages.
Muscedere et al., "Mortality, attributable mortality, and clinical events as end points for clinical trials of ventilator-associated pneumonia and hospital-acquired pneumonia." Clinical infectious diseases 51.Supplement_1 (2010): S120-S125.
Nakhleh et al., "Diagnosis and classification of 17 diseases from 1404 subjects via pattern analysis of exhaled molecules." ACS nano 11.1 (2017): 112-125.
Narasimha et al., "A 7nm CMOS technology platform for mobile and high performance compute application." Electron Devices Meeting (IEDM), 2017 IEEE International. IEEE, 2017. 4 pages.
Niemetz, et al., Boolector 2.0. Journal on Satisfiability, Boolean Modeling and Computation 9 (2015) 53-58.
Nourbakhsh et al., "MoS2 field-effect transistor with sub-10 nm channel length." Nano letters 16.12 (2016): 7798-7806.
NVIDIA RISC-V Story. NVIDIA 4th RISC-V Workshop Jul. 2016. Accessed at https://riscv.org/wp-content/uploads/2016/07/Tue1100_Nvidia_RISCV_Story_V2.pdf. 15 pages.
Open Source RISC-V Cores and Tools. Bluespec. Accessed at https://bluespec.com/ on Feb. 13, 2020. 5 pages.
OpenSPARC Overview. Oracle Accessed at http://www.opensparc.net/opensparc-t2 on Feb. 13, 2020. 1 pages.
Patil et al., "VMR: VLSI-compatible metallic carbon nanotube removal for imperfection-immune cascaded multi-stage digital logic circuits using carbon nanotube FETs." 2009 IEEE International Electron Devices Meeting (IEDM). IEEE, 2009. 4 pages.
Patil et al., "Wafer-scale growth and transfer of aligned single-walled carbon nanotubes." IEEE Transactions on Nanotechnology 8.4 (2009): 498-504.
Patterson, "50 Years of computer architecture: From the mainframe CPU to the domain-specific tpu and the open RISC-V instruction set." 2018 IEEE International Solid-State Circuits Conference-(ISSCC). IEEE, 2018. 5 pages.
Phillips et al., "Variation in volatile organic compounds in the breath of normal humans." Journal of Chromatography B: Biomedical Sciences and Applications 729.1-2 (1999): 75-88.
Prakash et al., Understanding Contact Gating in Schottky Barrier Transistors from 2D Channels. Sci. Rep. 2017, 7, 12596. 9 pages.
PrimeTime Static Timing Analysis. Synopsys, Inc. Accessed at https://www.synopsys.com/implementation-and-signoff/signoff/primetime.html on Mar. 2, 2021. 7 pages.
Qiu et al., "Scaling carbon nanotube complementary transistors to 5-nm gate lengths." Science355.6322 (2017): 271-276.
Rai et al., Air Stable Doping and Intrinsic Mobility Enhancement in Monolayer Molybdenum Disulfide by Amorphous Titanium Suboxide Encapsulation. Nano Lett. 2015, 15, 4329-4336.
Rai et al., Interfacial-Oxygen-Vacancy Mediated Doping of MoS2 by high-k dielectrics. In 2015 73rd Annual Device Research Conference (DRC); IEEE, 2015; 189-190.
Rana et al., "A review on recent advances of CNTs as gas sensors." Sensor Review (2017). 12 pages.
Sabry et al., Energy-Efficient Abundant-Data Computing: The N3XT 1,000x. Computer (Long. Beach. Calif). 2015, 48, 24-33.
Safdar et al., "The pathogenesis of ventilator-associated pneumonia: its relevance to developing effective strategies for prevention." Respiratory care 50.6 (2005): 725-741.
Schnabel et al., "Electronic nose analysis of exhaled breath to diagnose ventilator-associated pneumonia." Respiratory medicine 109.11 (2015): 1454-1459.
Semiconductor Industry Association. "International Technology Roadmap for Semiconductors (2013)." Downloaded from http://www.itrs2.net/itrs-reports.html on Feb. 24, 2020. 237 pages.
Sentaurus Device. Synopsys, Inc.. Accessed at https://www.synopsys.com/silicon/tcad/device-simulation/sentaurus-device.html on Mar. 2, 2021. 3 pages.
Seo et al., "A 10nm platform technology for low power and high performance application featuring FINFET devices with multi workfunction gate stack on bulk and SOI." VLSI Technology (VLSI-Technology): Digest of Technical Papers, 2014 Symposium on. IEEE, 2014. 2 pages.
Shahrjerdi et al., "High-performance air-stable n-type carbon nanotube transistors with erbium contacts." ACS nano 7.9 (2013): 8303-8308.
Sherazi et al., "Track height reduction for standard-cell in below 5nm node: how low can you go?." Design-Process-Technology Co-optimization for Manufacturability XII. vol. 10588. International Society for Optics and Photonics, 2018. 14 pages.
Shulaker et al., "Carbon nanotube circuit integration up to sub-20 nm channel lengths." ACS nano 8.4 (2014): 3434-3443.
Shulaker et al., "Carbon nanotube computer." Nature 501.7468 (2013): 526-530.
Shulaker et al., "Efficient metallic carbon nanotube removal for highly-scaled technologies." 2015 IEEE International Electron Devices Meeting (IEDM). IEEE, 2015. 4 pages.
Shulaker et al., "Experimental demonstration of a fully digital capacitive sensor interface built entirely using carbon-nanotube FETs." 2013 IEEE International Solid-State Circuits Conference Digest of Technical Papers. IEEE, 2013. 3 pages.
Shulaker et al., "Linear increases in carbon nanotube density through multiple transfer technique." Nano letters 11.5 (2011): 1881-1886.
Shulaker et al., "Monolithic 3D integration of logic and memory: Carbon nanotube FETs, resistive RAM, and silicon FETs." 2014 IEEE International Electron Devices Meeting. IEEE, 2014. 4 pages.
Shulaker et al., "Monolithic three-dimensional integration of carbon nanotube FETs with silicon CMOS." 2014 Symposium on VLSI Technology (VLSI-Technology): Digest of Technical Papers. IEEE, 2014. 2 pages.
Shulaker et al., "Sensor-to-digital interface built entirely with carbon nanotube FETs." IEEE Journal of Solid-State Circuits 49.1 (2013): 190-201.
Shulaker et al., "Three-dimensional integration of nanotechnologies for computing and data storage on a single chip." Nature 547.7661 (2017): 74. 19 pages.
Shulaker et al., High-Performance Carbon Nanotube Field-Effect Transistors. In 2014 IEEE International Electron Devices Meeting; IEEE, 2014; 33.6.1-33.6.4.
Si et al., "Scalable preparation of high-density semiconducting carbon nanotube arrays for high-performance field-effect transistors." ACS nano 12.1 (2018): 627-634.
Spectre Simulation Platform. Cadence Design Systems, Inc. Accessed at https://www.cadence.com/en_US/home/tools/custom-ic-analog-rf-design/circuit-simulation/spectre-simulation-platform.html on Mar. 2, 2021. 3 pages.
Spike, a RISC-V ISA Simulator. Github. Accessed at https://github.com/riscv/riscv-isa-sim on Feb. 13, 2020. 6 pages.
Suriyasena Liyanage et al., VLSI-Compatible Carbon Nanotube Doping Technique with Low Work-Function Metal Oxides. Nano Lett. 2014, 14, 1884-1890.
Tang et al., "Flexible CMOS integrated circuits based on carbon nanotubes with sub-10 ns stage delays." Nature Electronics 1.3 (2018): 191-196.
Tans et al., "Room-temperature transistor based on a single carbon nanotube." Nature 393.6680 (1998): 49-52.
TCAD—Raphael. Synopsys, Inc. Accessed at https://www.synopsys.com/silicon/tcad/interconnect-simulation/raphael.html on Mar. 2, 2021. 4 pages.
Tracer—Electron scattering and process effects quantified. GenISys GmbH 2017. Accessed at https://www.genisys-gmbh.com/tracer.html on Mar. 2, 2021. 6 pages.
TruNarc. HazmatLINK. Accessed at http://www.hazmatlink.com/trunarc.html on Mar. 2, 2021. 2 pages.
Tulevski et al., "High purity isolation and quantification of semiconducting carbon nanotubes via column chromatography." ACS nano 7.4 (2013): 2971-2976.
Tulevski et al., "Toward high-performance digital logic technology with carbon nanotubes." ACS nano 8.9 (2014): 8730-8745.
Understand, Predict, and Optimize Physics-Based Designs and Processes with COMSOL Multiphysics®. COMSOL Multiphysics®. Accessed at https://www.comsol.com/comsol-multiphysics on Mar. 2, 2021. 16 pages.

(56) References Cited

OTHER PUBLICATIONS

Valsaraj et al., Theoretical and Experimental Investigation of Vacancy-Based Doping of Monolayer MoS 2 on Oxide. 2D Mater. 2015, 2, 045009. 12 pages.

Venkatachalam et al., "The diagnostic dilemma of ventilator-associated pneumonia in critically ill children." Pediatric Critical Care Medicine 12.3 (2011): 286-296.

Vinet et al., "3D monolithic integration: Technological challenges and electrical results." Microelectronic Engineering88.4 (2011): 331-335.

Wang et al., "Growing highly pure semiconducting carbon nanotubes by electrotwisting the helicity." Nature Catalysis 1.5 (2018): 326-331.

Wang et al., "National trends in patient safety for four common conditions, 2005-2011." N Engl J Med 370 (2014): 341-351.

Wei et al. "A non-iterative compact model for carbon nanotube FETs incorporating source exhaustion effects." 2009 IEEE International Electron Devices Meeting (IEDM). IEEE, 2009. 4 pages.

Western Digital to Accelerate the Future of Next-Generation Computing Architectures for Big Data and Fast Data Environments. Western Digital Nov. 28, 2017. Accessed at https://www.westerndigital.com/company/newsroom/press-releases/2017/2017-11-28-western-digital-to-accelerate-the-future-of-next-generation-computing-architectures-for-big-data-and-fast-data-environments. 7 pages.

Wolf, RISC-V Formal Verification Framework. Github. Accessed at https://github.com/cliffordwolf/riscv-formal. 2 pages.

Wolf, SymbiYosys (sby)—Front-end for Yosys-based formal verification flows. Github. Accessed at https://github.com/YosysHQ/SymbiYosys on Feb. 13, 2020. 1 pages.

Won et al., "Zipping, entanglement, and the elastic modulus of aligned single-walled carbon nanotube films." Proceedings of the National Academy of Sciences 110.51 (2013): 20426-20430.

Wong et al., "Memory leads the way to better computing." Nature nanotechnology 10.3 (2015): 191-194.

Wu et al., "Brain-inspired computing exploiting carbon nanotube FETs and resistive RAM: Hyperdimensional computing case study." 2018 IEEE International Solid-State Circuits Conference—(ISSCC). IEEE, 2018, pp. 492-494.

Wu et al., "Hyperdimensional computing exploiting carbon nanotube FETs, resistive RAM, and their monolithic 3D integration." IEEE Journal of Solid-State Circuits 53.11 (2018): 3183-3196.

Xu et al., "Efficient and reversible electron doping of semiconductor-enriched single-walled carbon nanotubes by using decamethylcobaltocene." Scientific reports 7.1 (2017): 1-10.

Yakimets et al., "Power aware FinFET and lateral nanosheet FET targeting for 3nm CMOS technology." Electron Devices Meeting (IEDM), 2017 IEEE International. IEEE, 2017. 4 pages.

Yang et al., "High-performance complementary transistors and medium-scale integrated circuits based on carbon nanotube thin films." ACS nano 11.4 (2017): 4124-4132.

Yoshida et al., "Highly conductive metal gate fill integration solution for extremely scaled RMG stack for 5 nm & beyond." Electron Devices Meeting (IEDM), 2017 IEEE International. IEEE, 2017. 4 pages.

Zhang et al., "Air-stable conversion of separated carbon nanotube thin-film transistors from p-type to n-type using atomic layer deposition of high-κ oxide and its application in CMOS logic circuits." Acs Nano 5.4 (2011): 3284-3292.

Zhang et al., "Carbon nanotube correlation: promising opportunity for CNFET circuit yield enhancement." Proceedings of the 47th Design Automation Conference. 2010. 4 pages.

Zhang et al., "Doping-free fabrication of carbon nanotube based ballistic CMOS devices and circuits." Nano Letters 7.12 (2007): 3603-3607.

Zhang et al., "High-performance carbon nanotube complementary electronics and integrated sensor systems on ultrathin plastic foil." ACS nano 12.3 (2018): 2773-2779.

Zhang et al., "Selective etching of metallic carbon nanotubes by gas-phase reaction." Science 314.5801 (2006): 974-977.

Zhao et al., "Sub-10 nm diameter InGaAs vertical nanowire MOSFETs." Electron Devices Meeting (IEDM), 2017 IEEE International. IEEE, 2017. 4 pages.

Zhong et al., "Solution-processed carbon nanotubes based transistors with current density of 1.7 mA/μm and peak transconductance of 0.8 mS/μm." 2017 IEEE International Electron Devices Meeting (IEDM). IEEE, 2017. 5 pages.

* cited by examiner

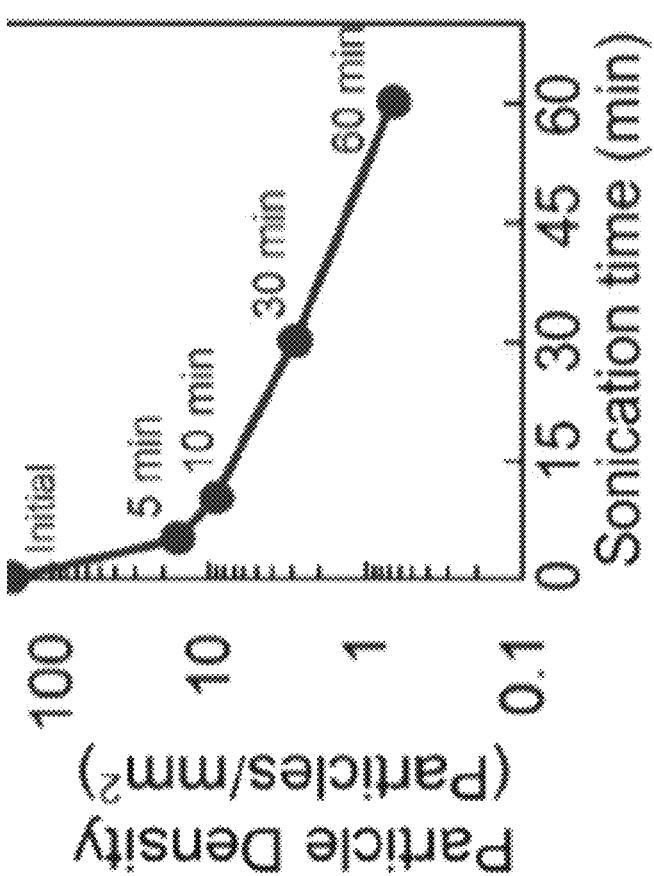
FIG. 6C
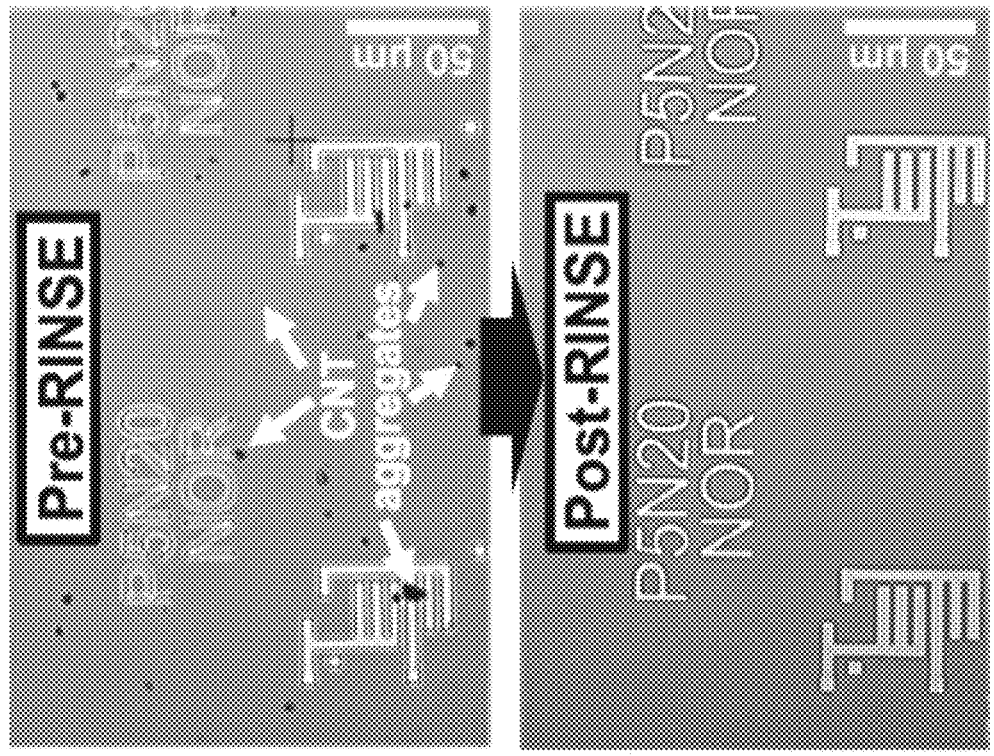
FIG. 6A
FIG. 6B $SNMH = V_{OH} - V_{IH}$
$SNML = V_{IL} - V_{OL}$
$SNM = \min(SNMH, SNML)$
$Gain = \max(-\Delta V_{OUT}/\Delta V_{IN})$
$Swing = \dfrac{V_{OUT,MAX} - V_{OUT,MIN}}{V_{DD}}$

| Al | Sb | As | Ba | Be | Bi | B | Br | Cd | Ca |
|----|----|----|----|----|----|----|----|----|----|
| Ce | Cs | Cr | Co | Cu | Dy | Er | Eu | Gd | Ga |
| Ge | Au | Hf | Ho | In | I | Ir | Fe | La | Pb |
| Li | Lu | Mg | Mn | Hg | Mo | Nd | Ni | Nb | Os |
| Pb | P | Pt | K | Pr | Re | Rh | Rb | Ru | Sm |
| Sc | Se | Ag | Na | Sr | Ta | Te | Tb | Tl | Th |
| Tm | Sn | Ti | W | U | V | Yb | Y | Zn | Zr |

FIG. 19B-contd.
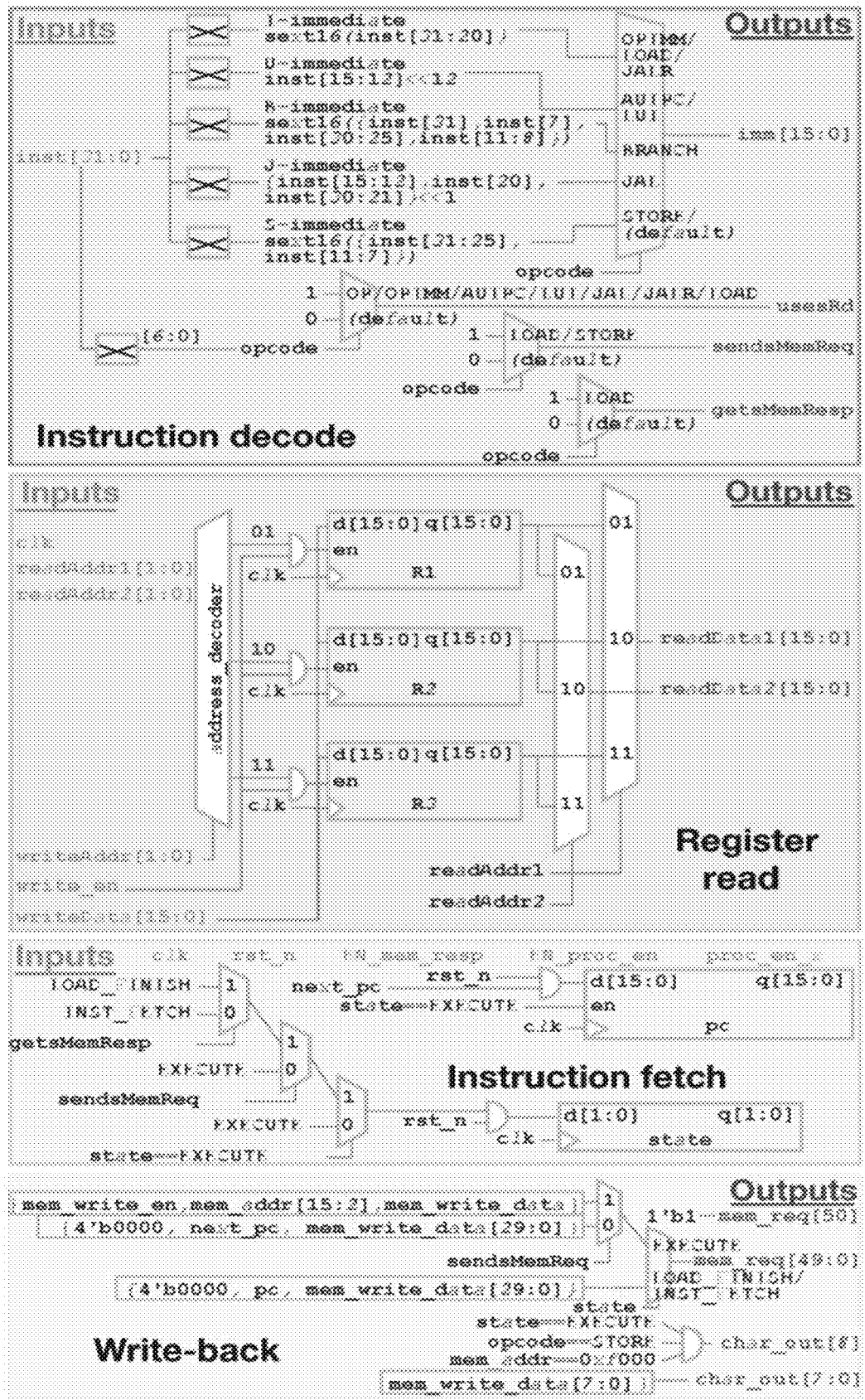

FIG. 21B
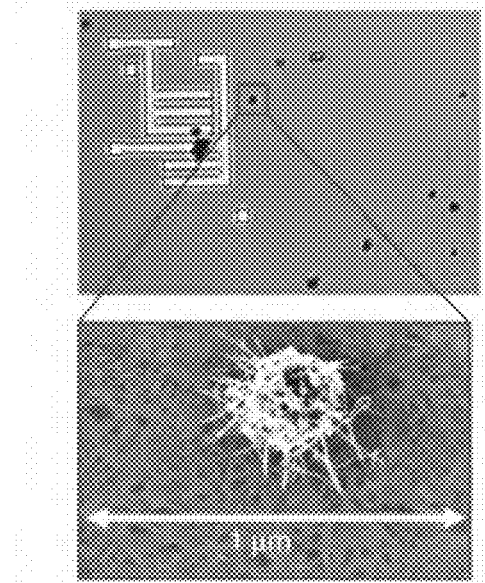
FIG. 21C
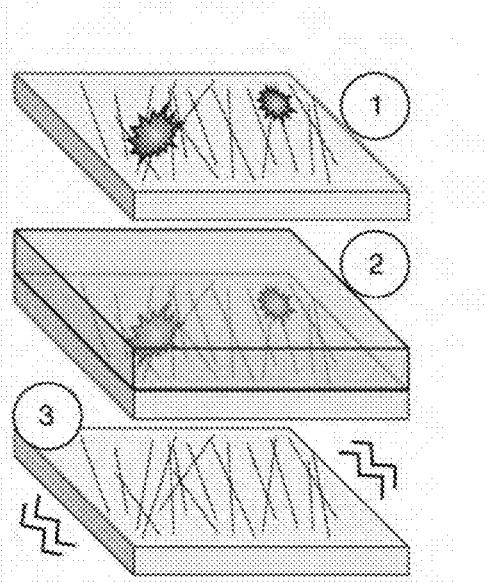
FIG. 21D
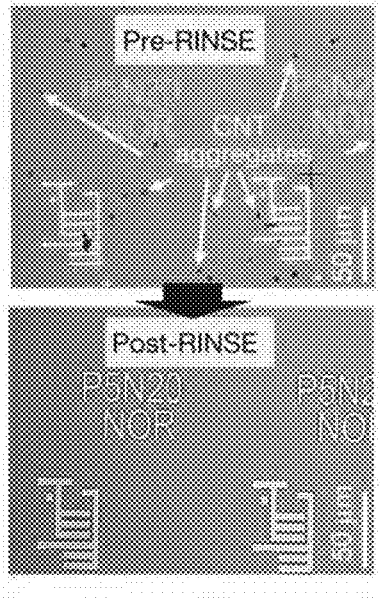
FIG. 21E
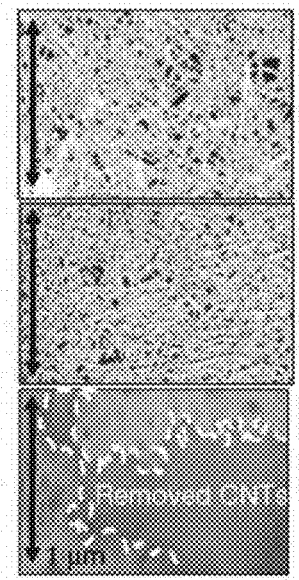
FIG. 21F
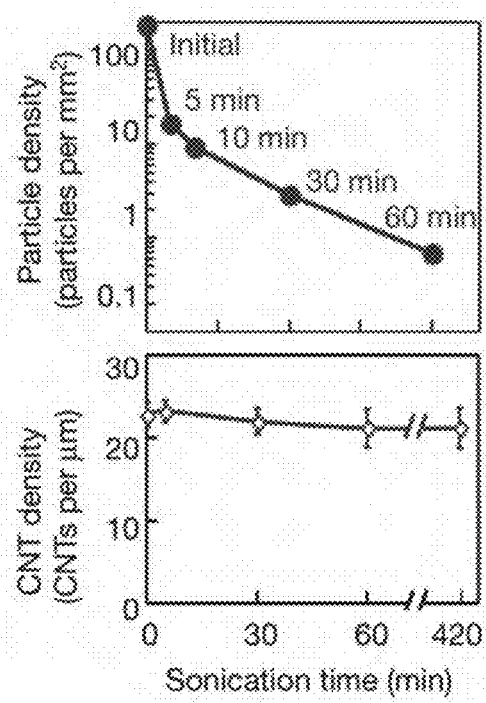
FIG. 21G

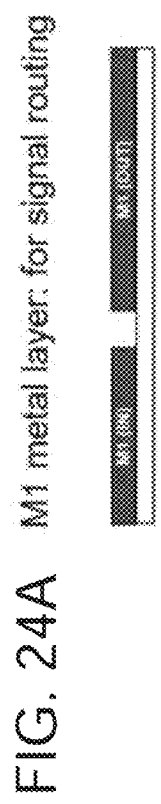
FIG. 24A  M1 metal layer: for signal routing
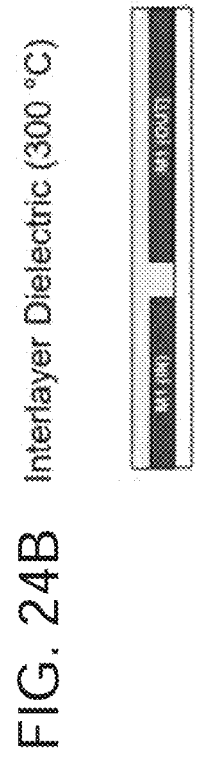
FIG. 24B  Interlayer Dielectric (300 °C)
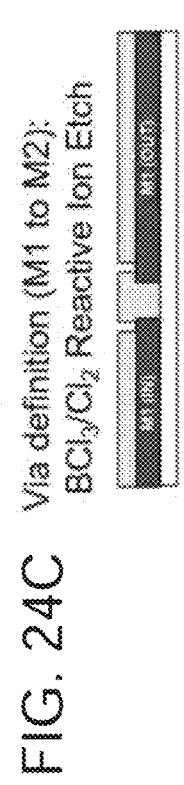
FIG. 24C  Via definition (M1 to M2): $BCl_3/Cl_2$ Reactive Ion Etch
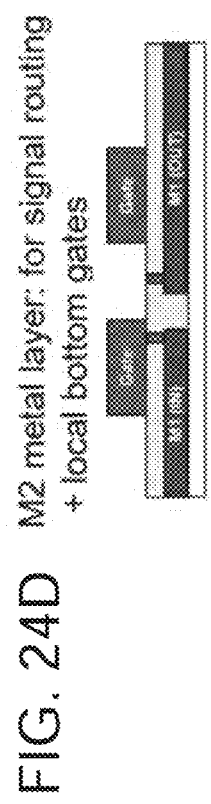
FIG. 24D  M2 metal layer: for signal routing + local bottom gates

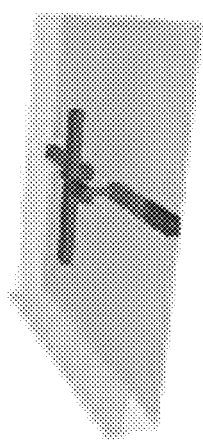
FIG. 24E  Gate dielectric:
Atomic layer deposition (ALD):
($Al_2O_3$ + $HfO_2$, 300 °C)
FIG. 24F  Via definition (M2 to M3):
$BCl_3/Cl_2$ Reactive Ion Etch
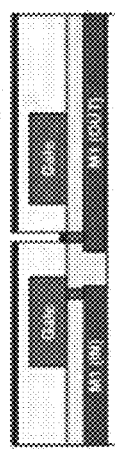
FIG. 24G  CNT deposition:
~99.99% s-CNT solution
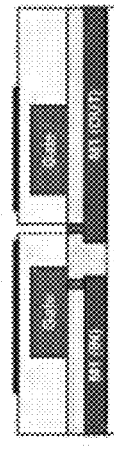
FIG. 24H  Active Etch: remove CNTs outside CNFETs
$O_2$ plasma etch

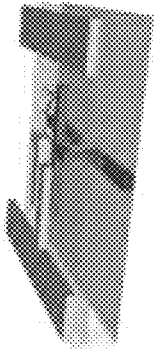
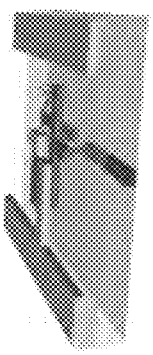
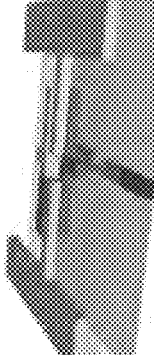
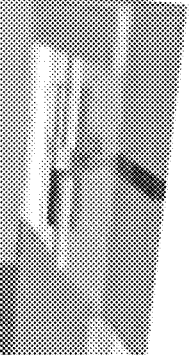
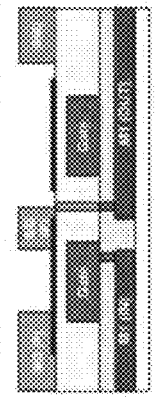
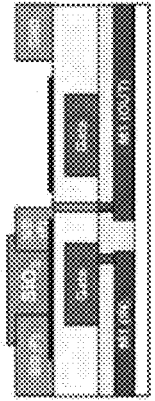
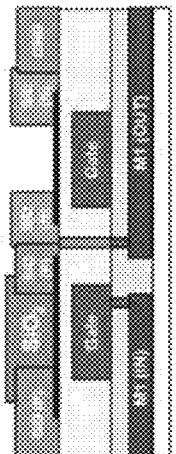
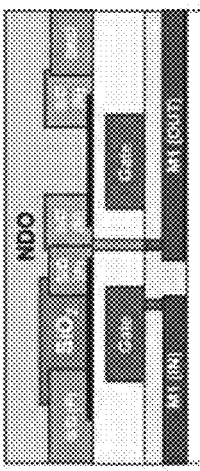
FIG. 24I — M3 metal layer for PMOS source/drain: 0.6 nm Titanium / 85 nm Platinum
FIG. 24J — PMOS passivation: 100 nm SiO$_2$
FIG. 24K — M4 metal layer: NMOS source/drain: 90 nm Titanium
FIG. 24L — Nonstoichiometric doping oxide (NDO): ALD HfO$_x$ (20 nm, 200 °C)

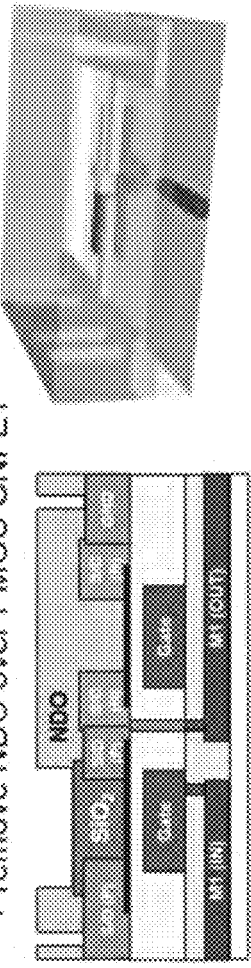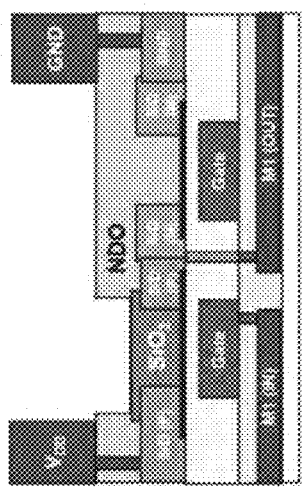
FIG. 24M  Via definition (M4 to M5) + remove NDO over PMOS CNFET
FIG. 24N  M5 metal layer: power distribution

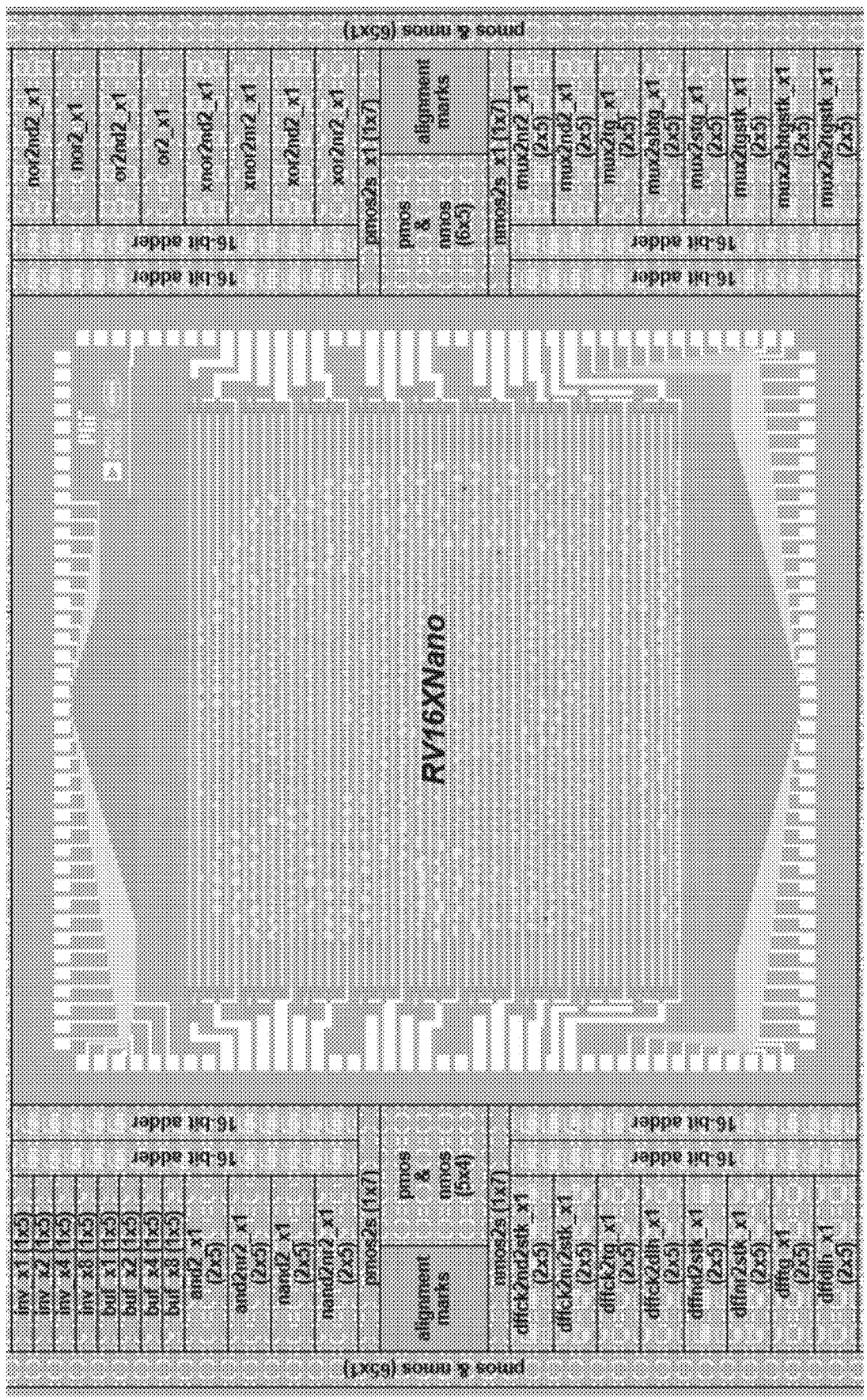
FIG. 25-contd.

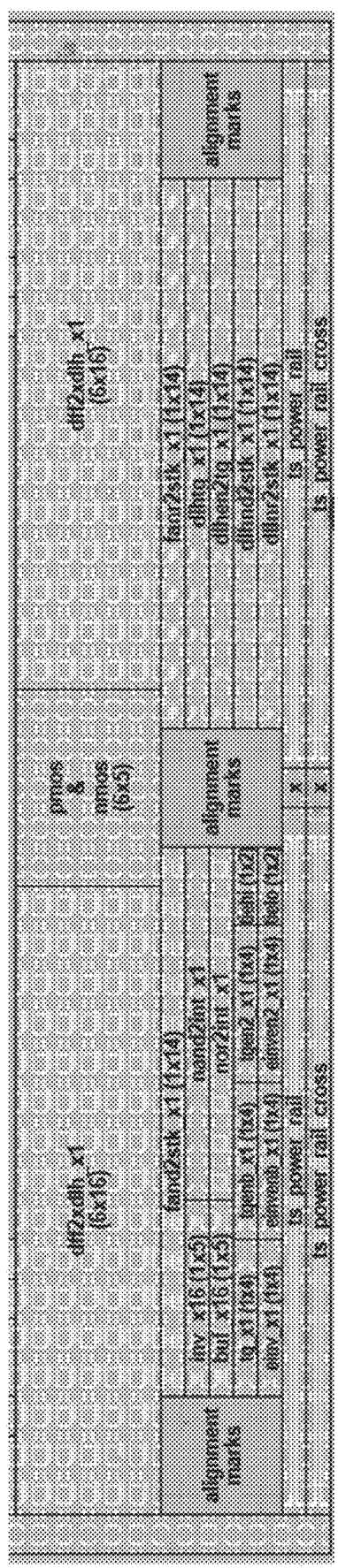
FIG. 25-contd.

FIG. 26-contd.

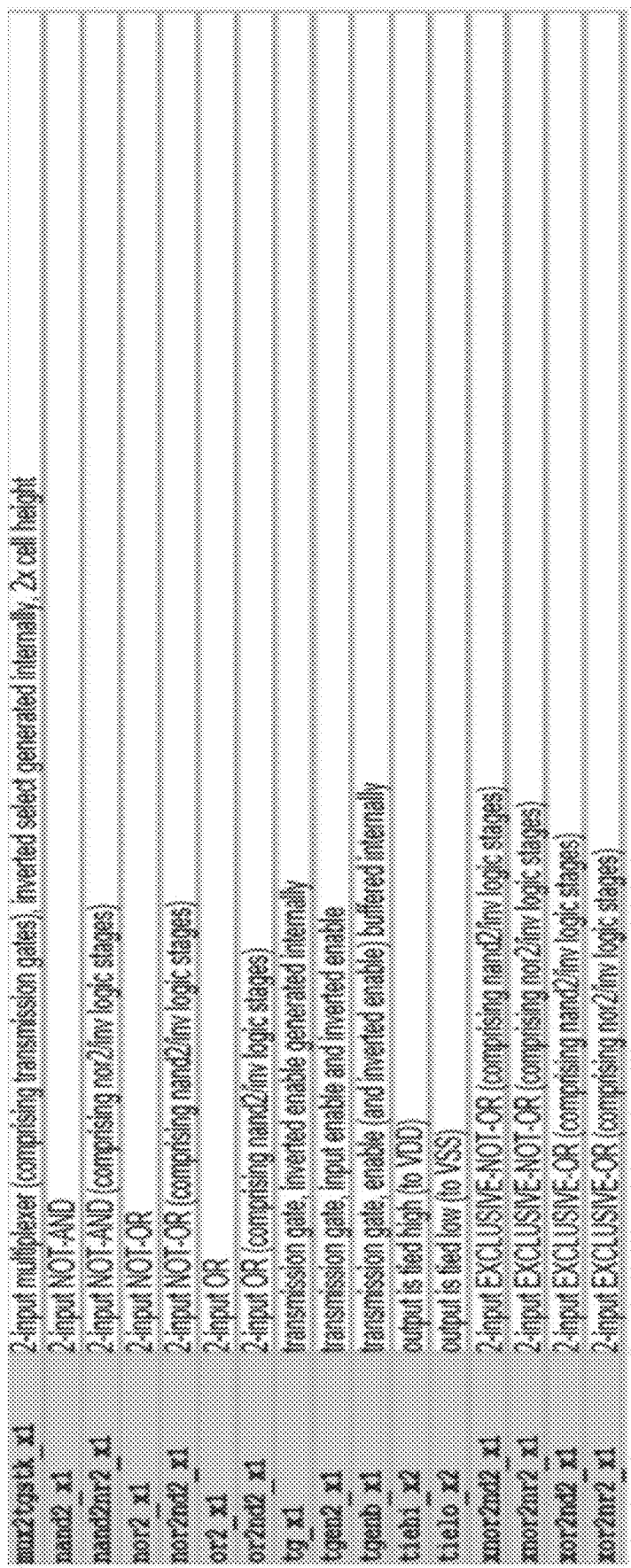
FIG. 26-contd.

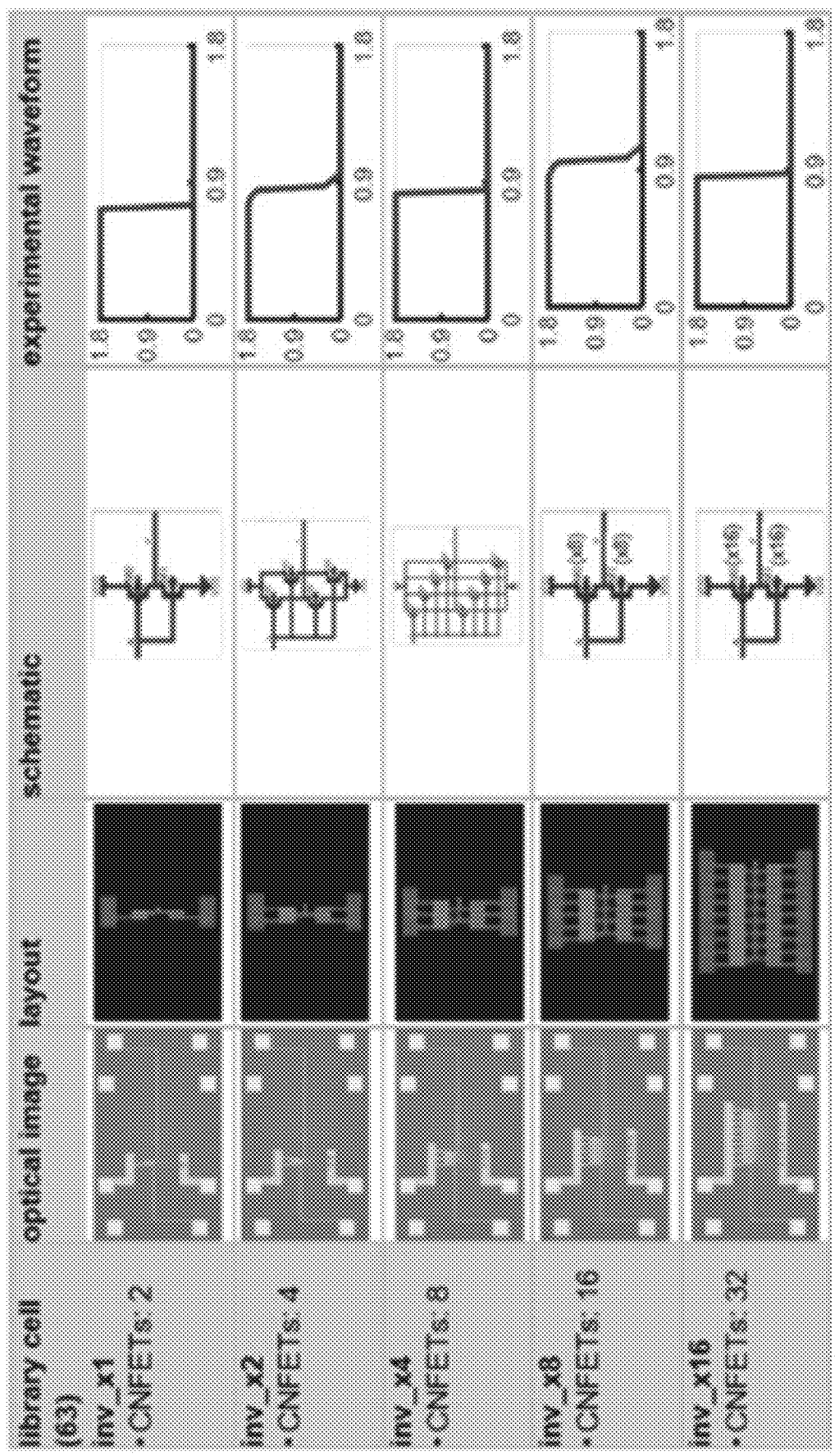
FIG. 26-contd.

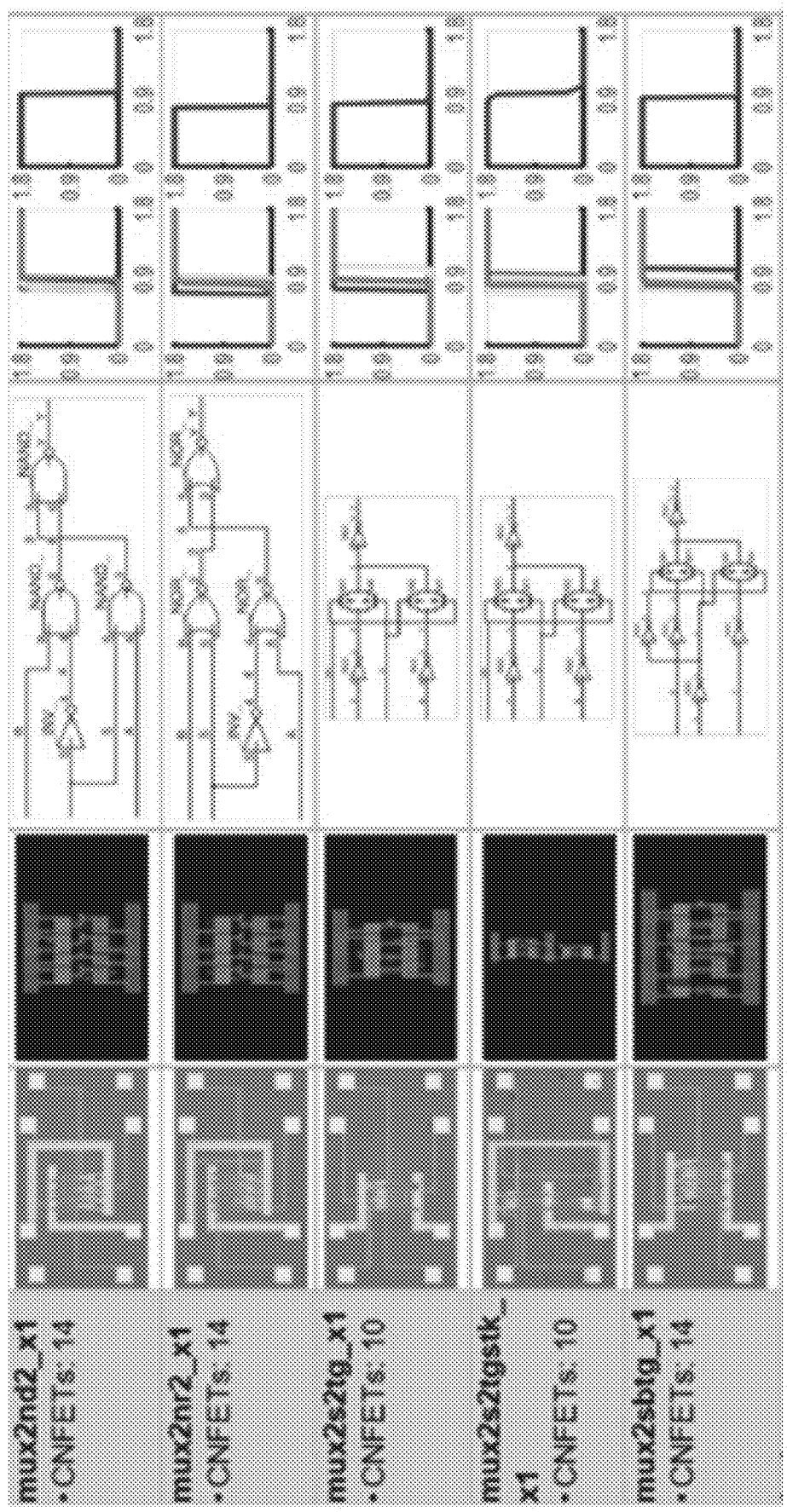
FIG. 26-contd.

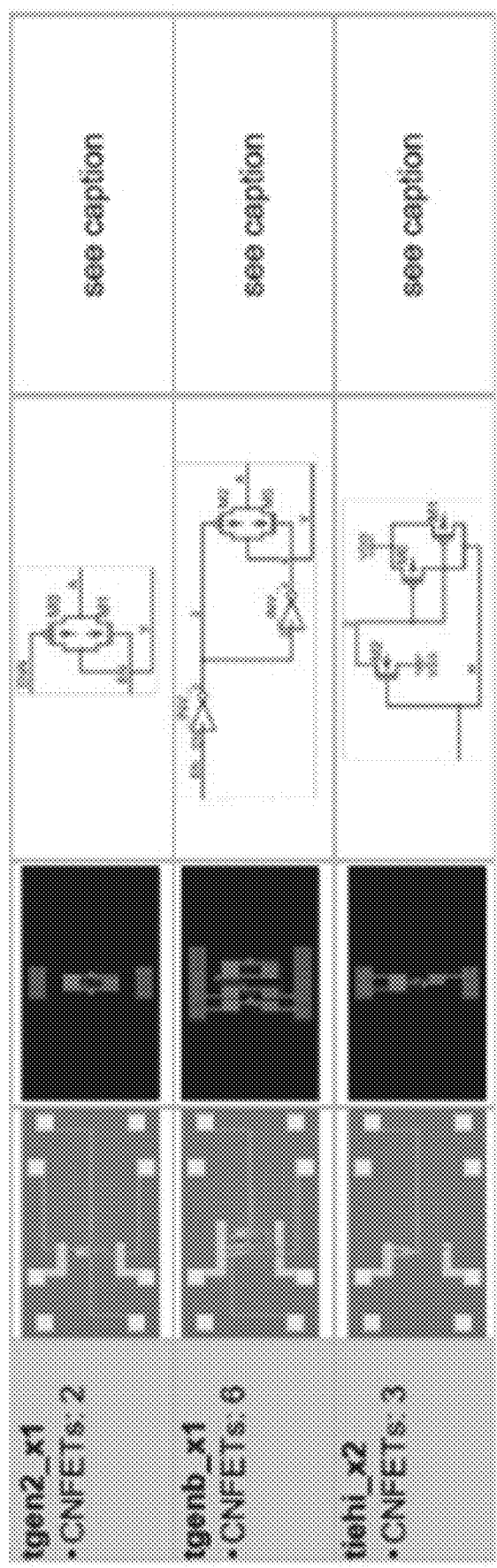
FIG. 26-contd.

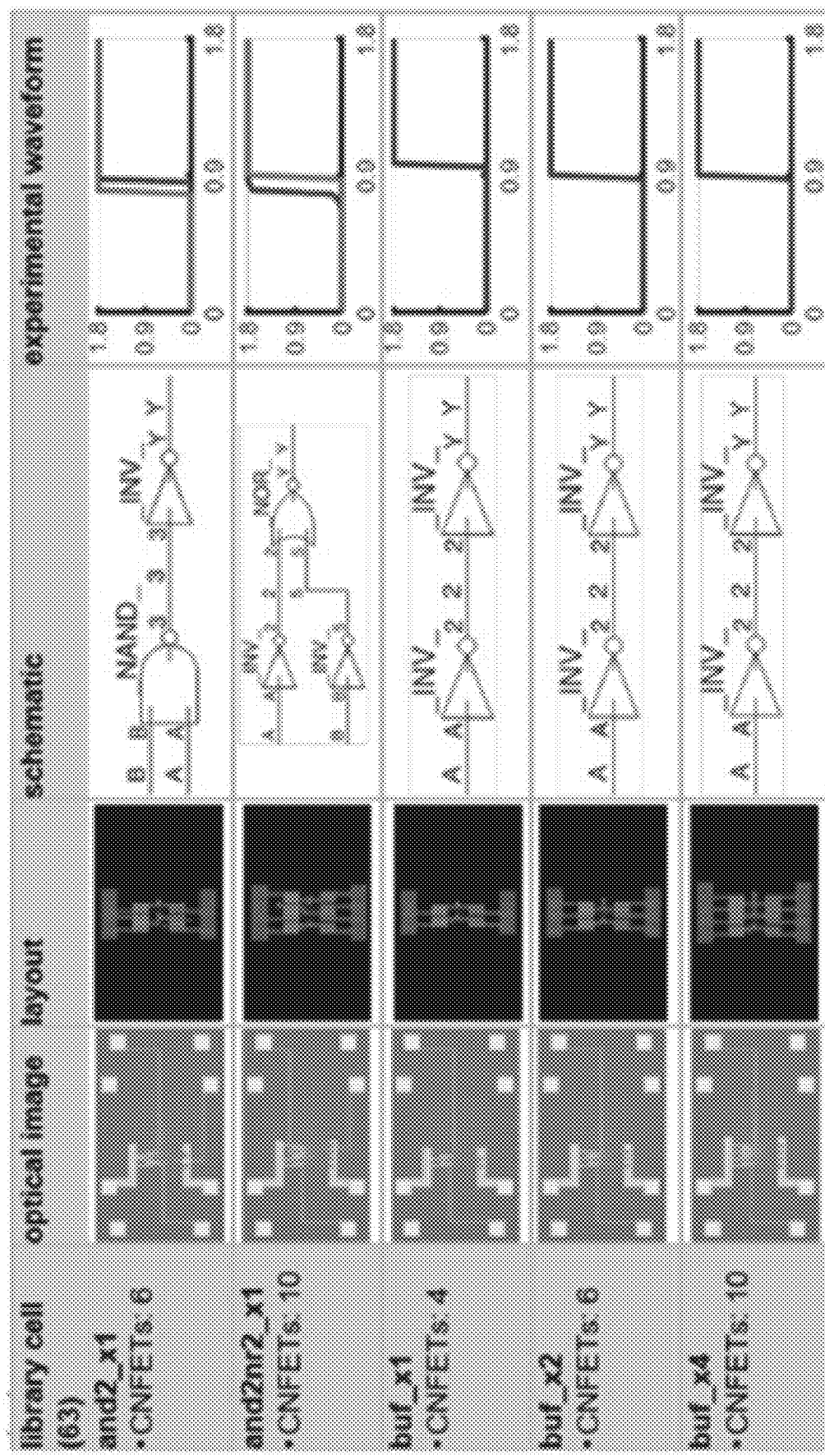
FIG. 26-contd.

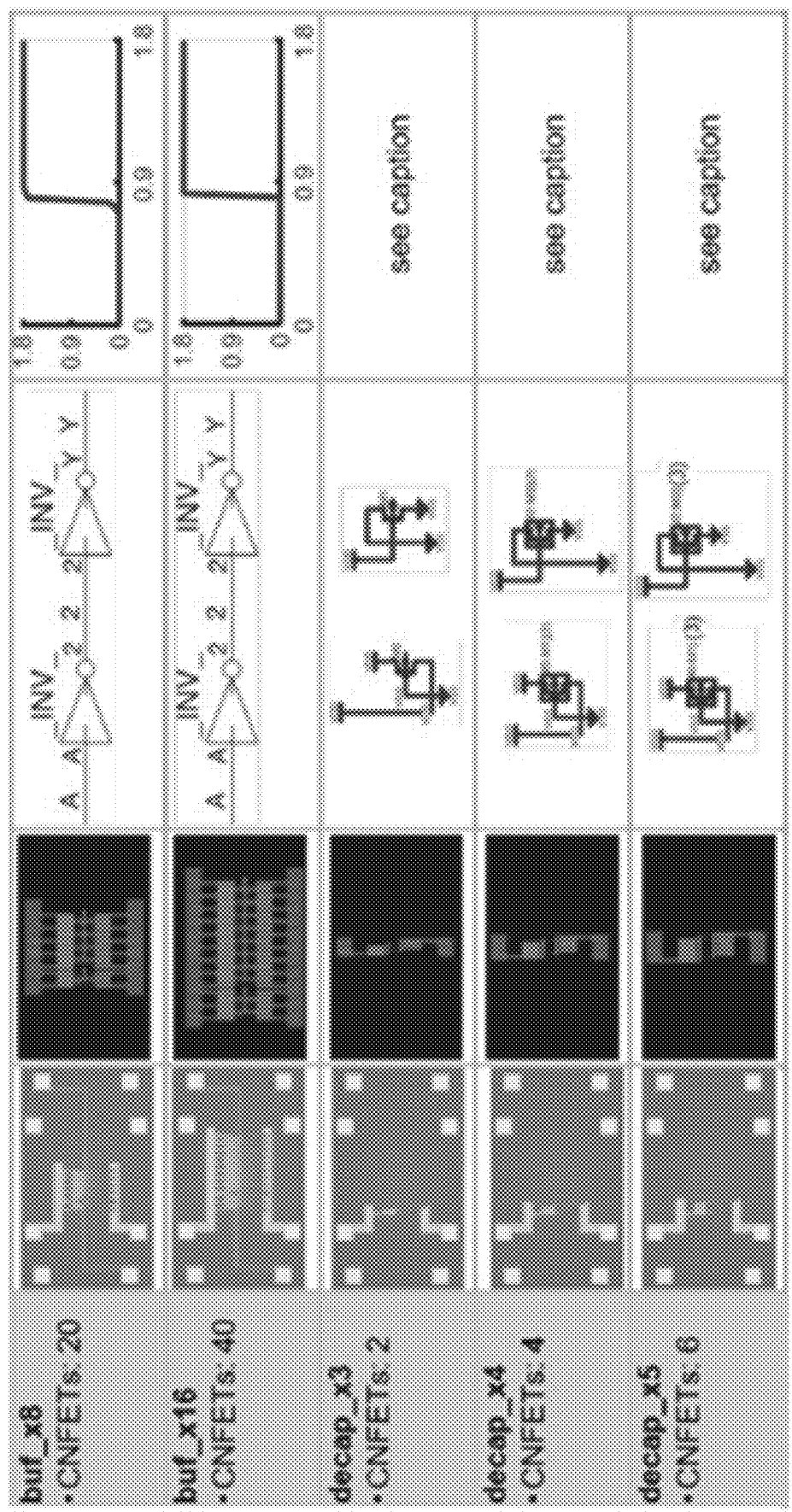
FIG. 26-contd.

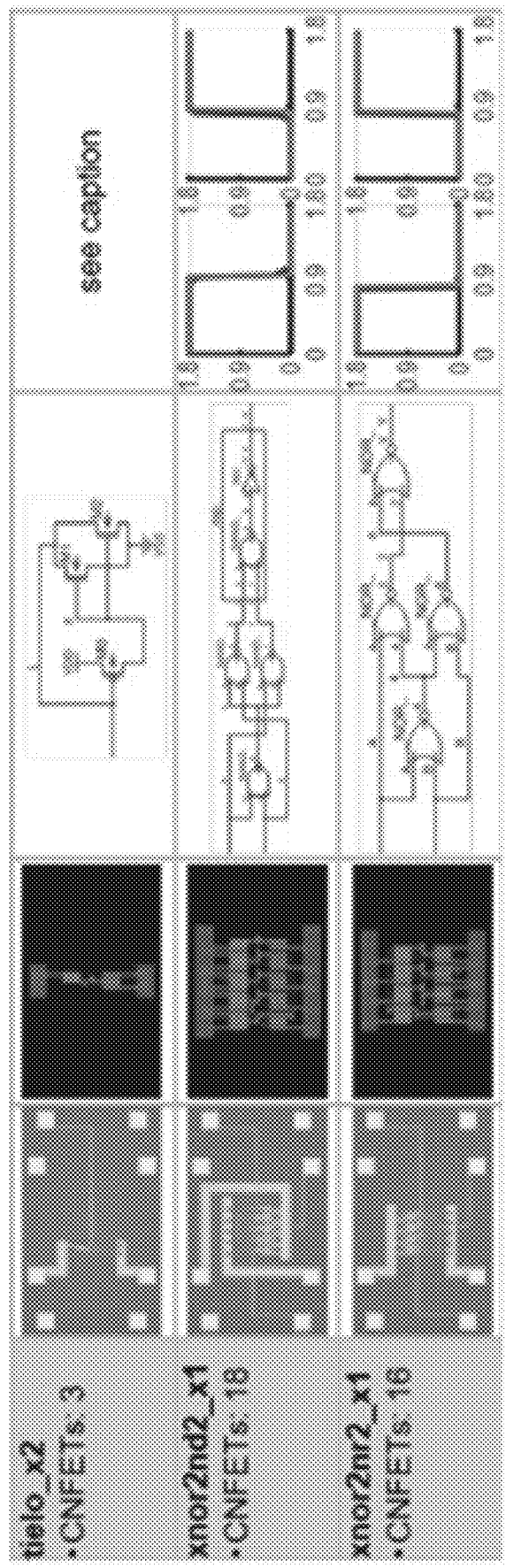
FIG. 26-contd.

FIG. 26-contd.

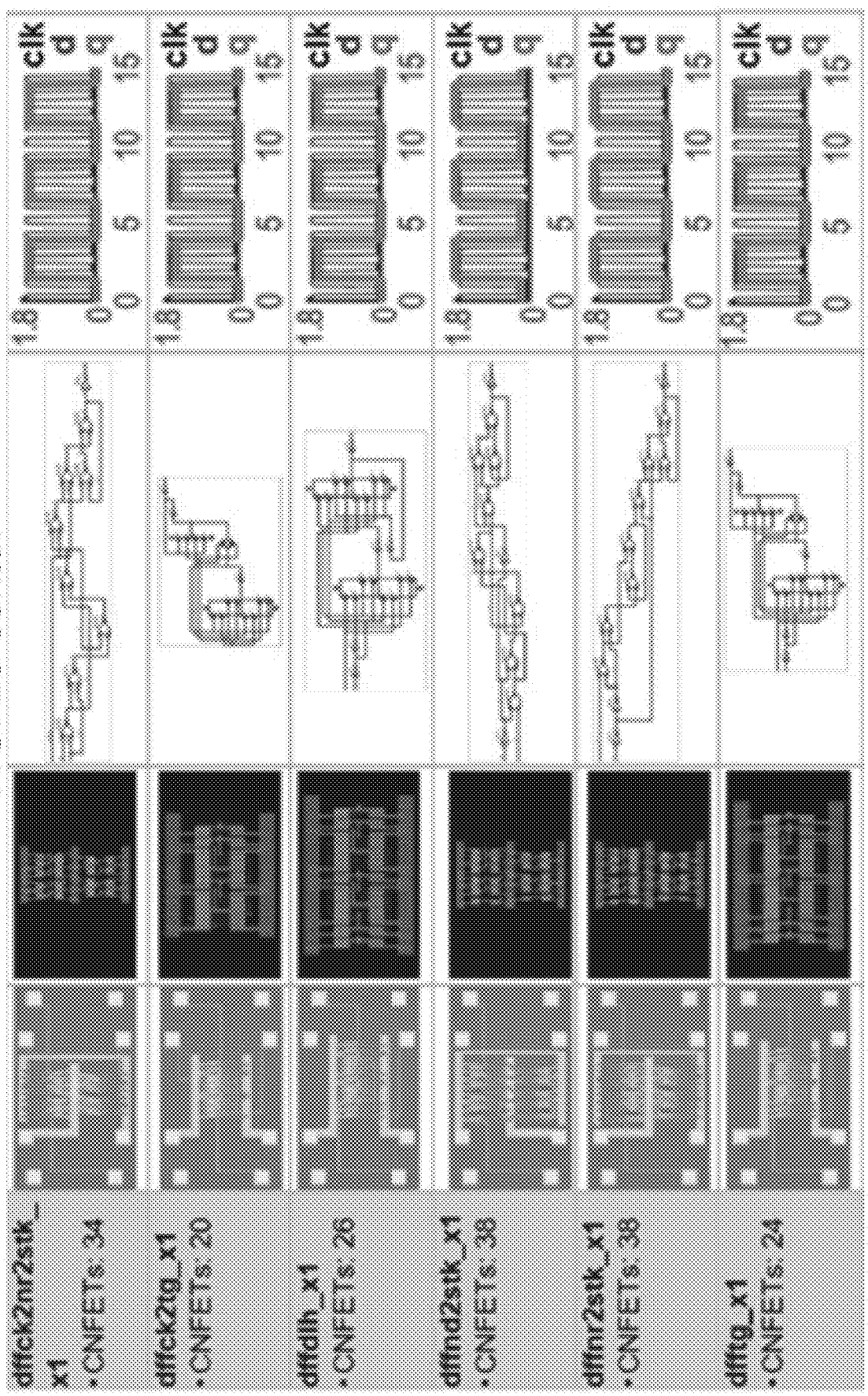
FIG. 26-contd.

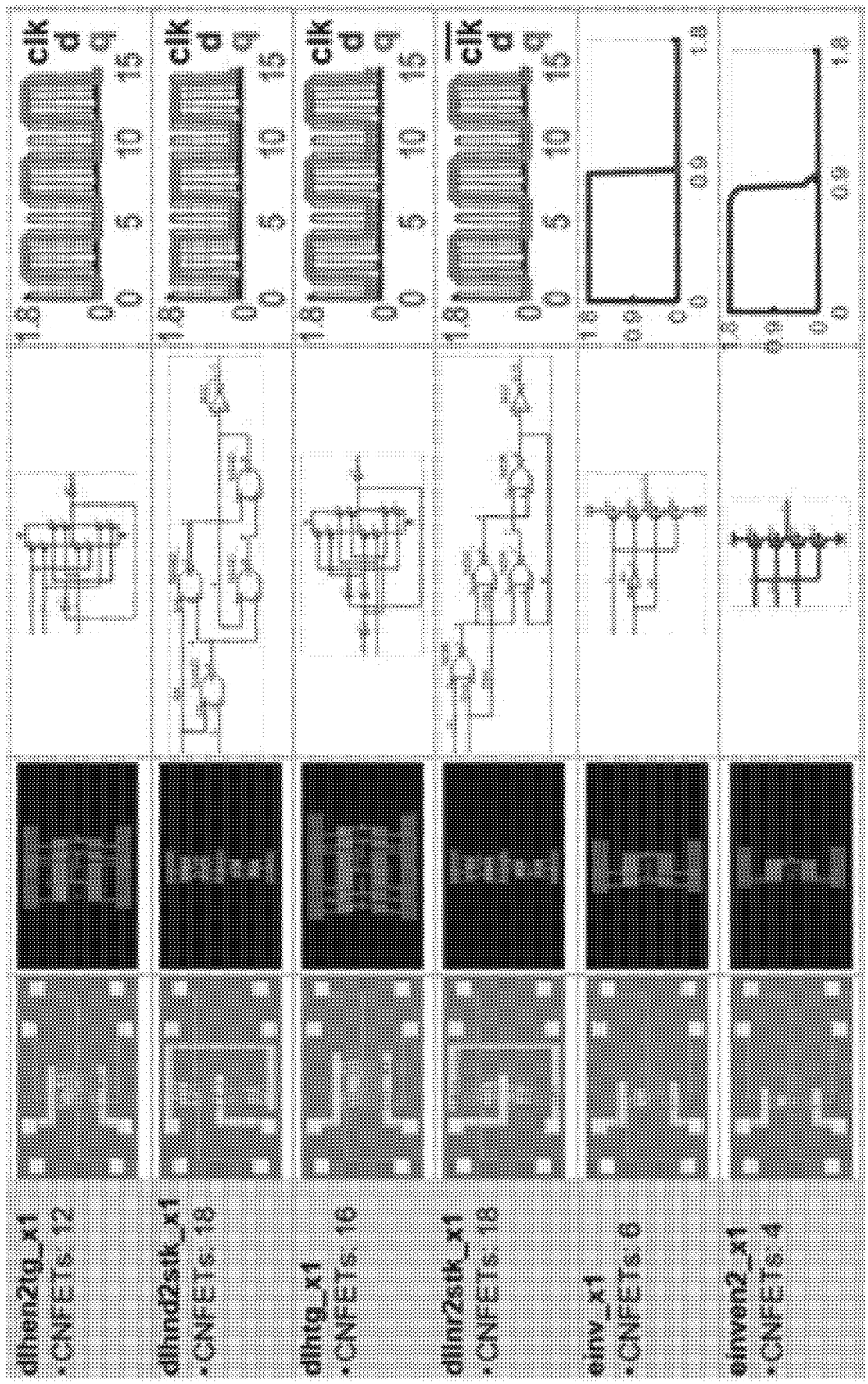
FIG. 26-contd.

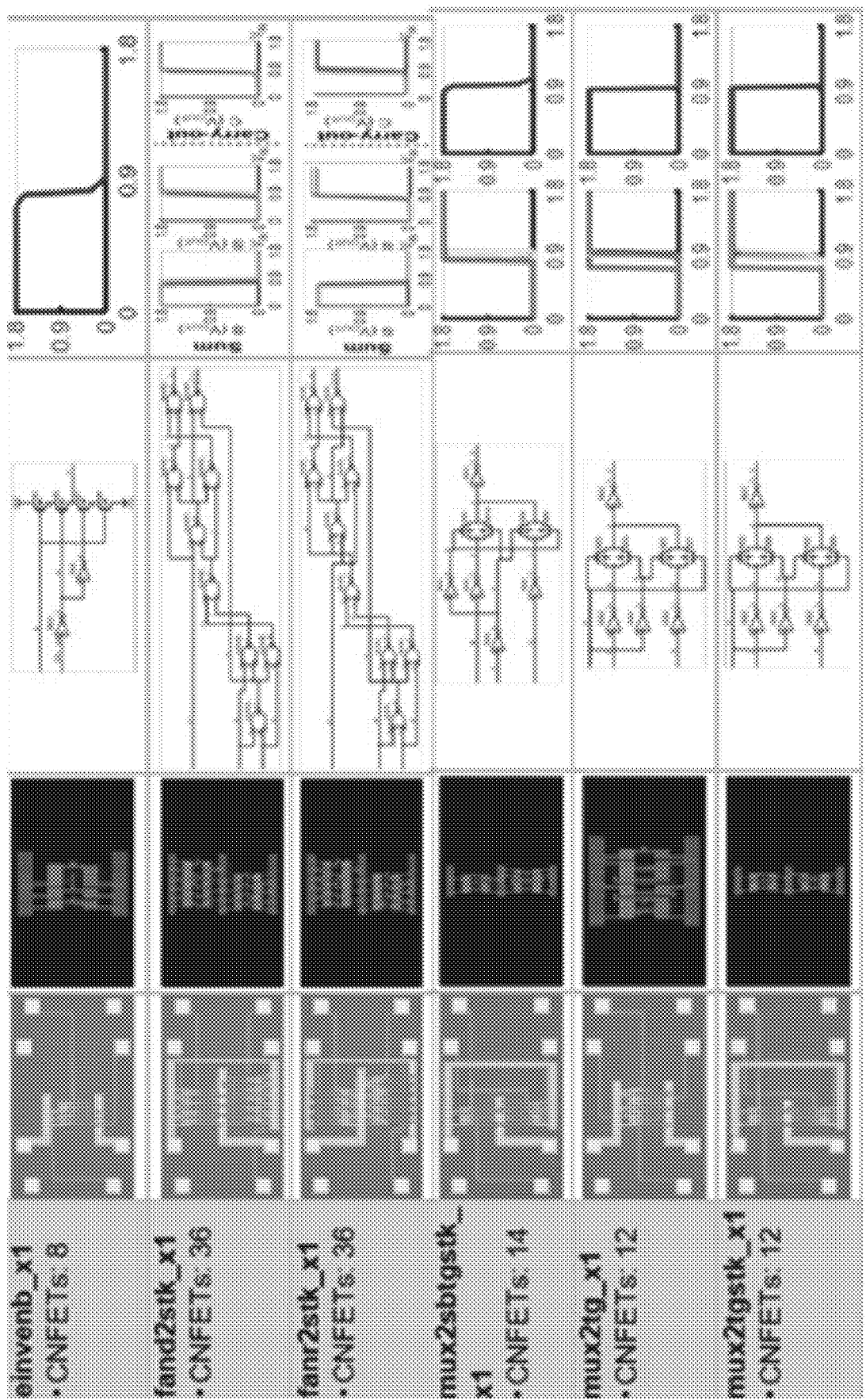
FIG. 26-contd.

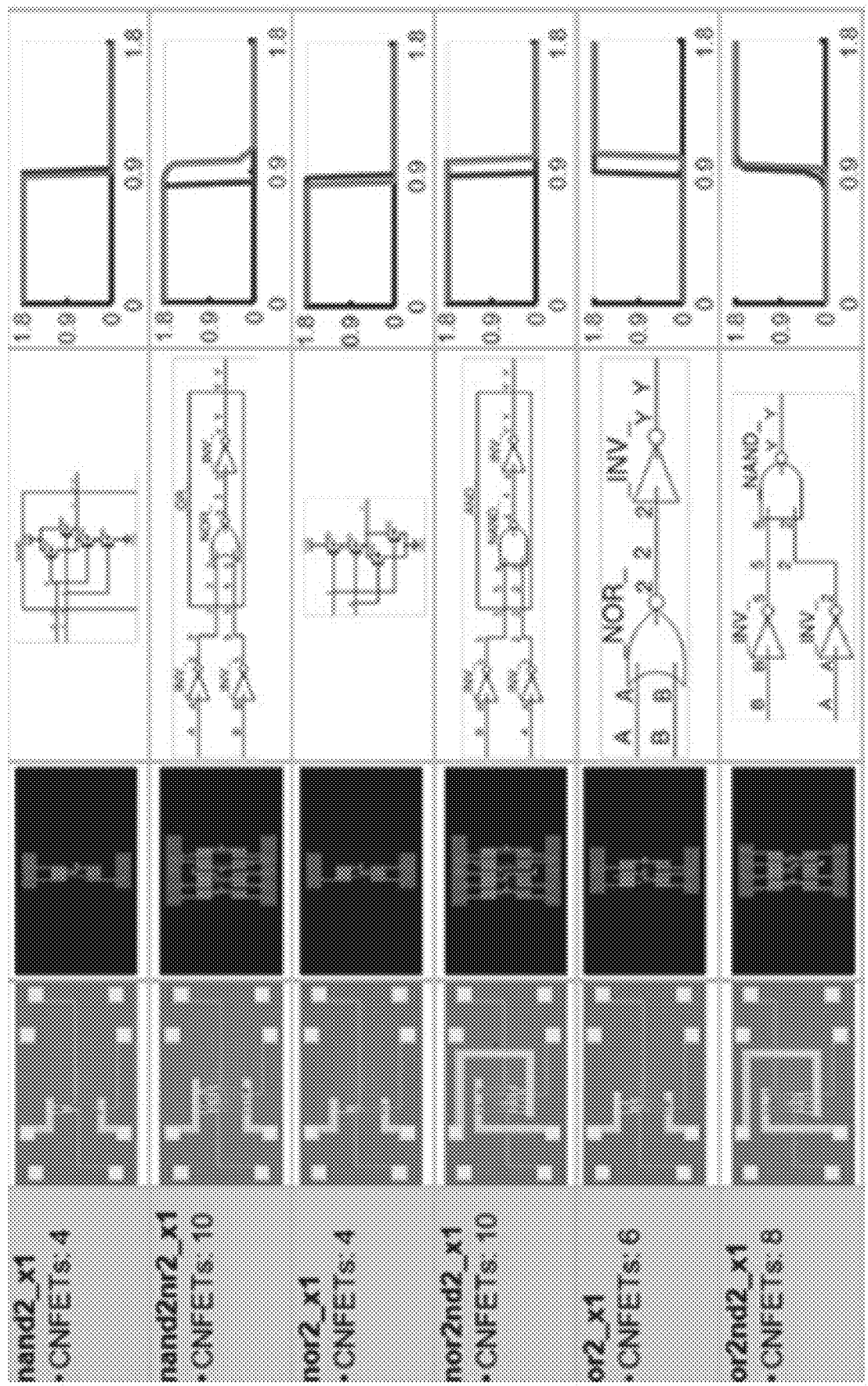
FIG. 26-contd.

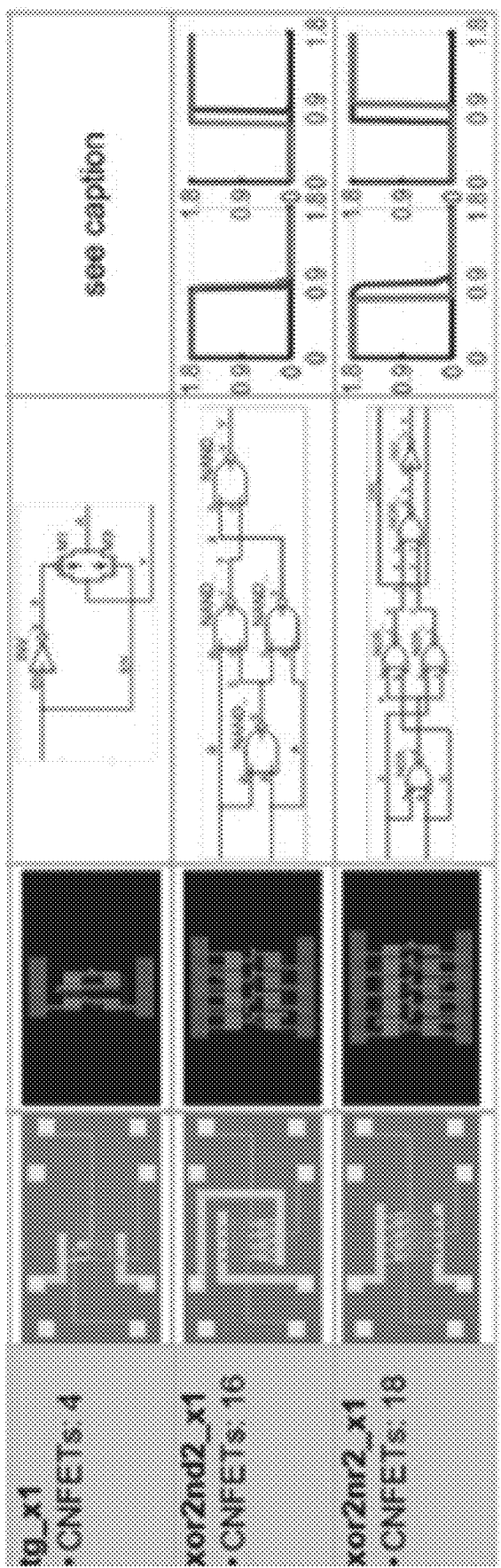
FIG. 26-contd.

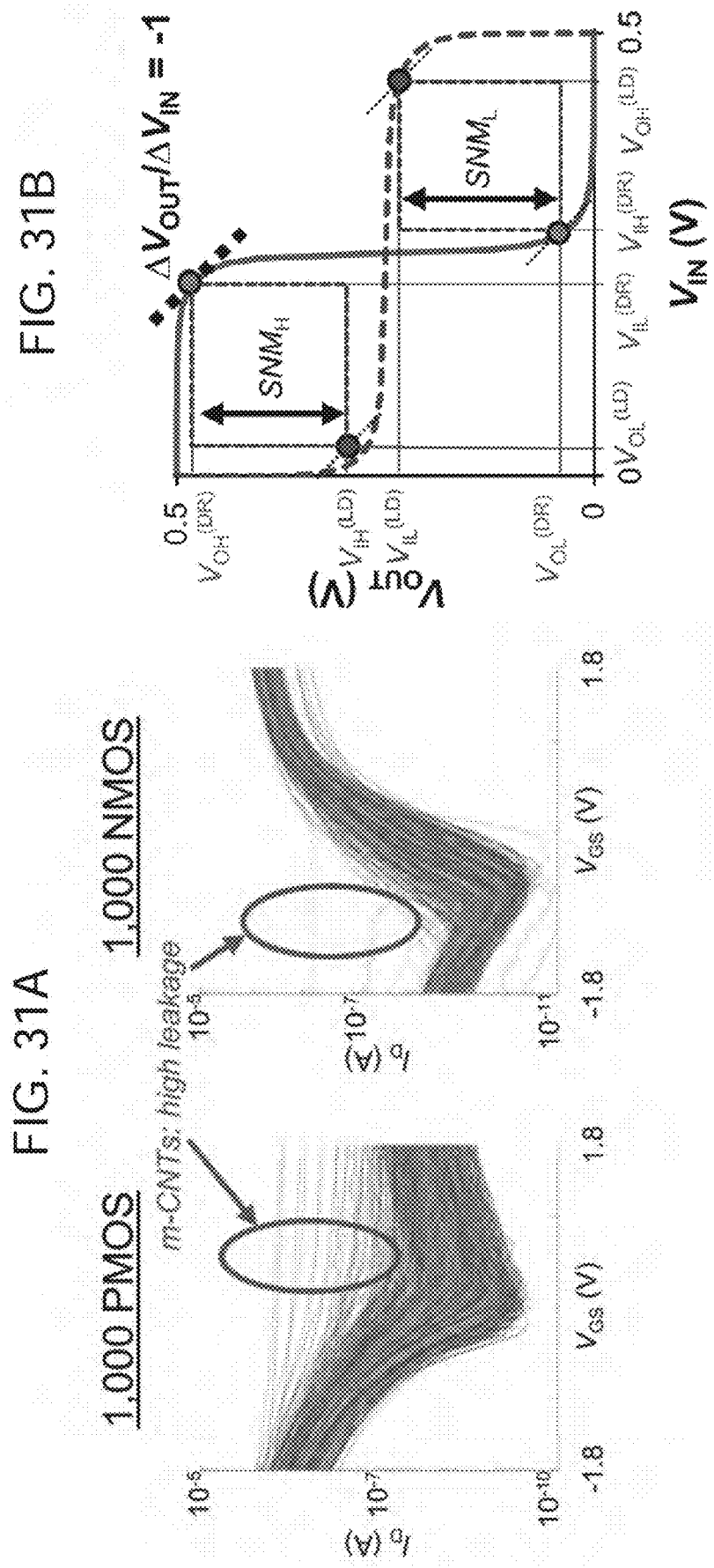

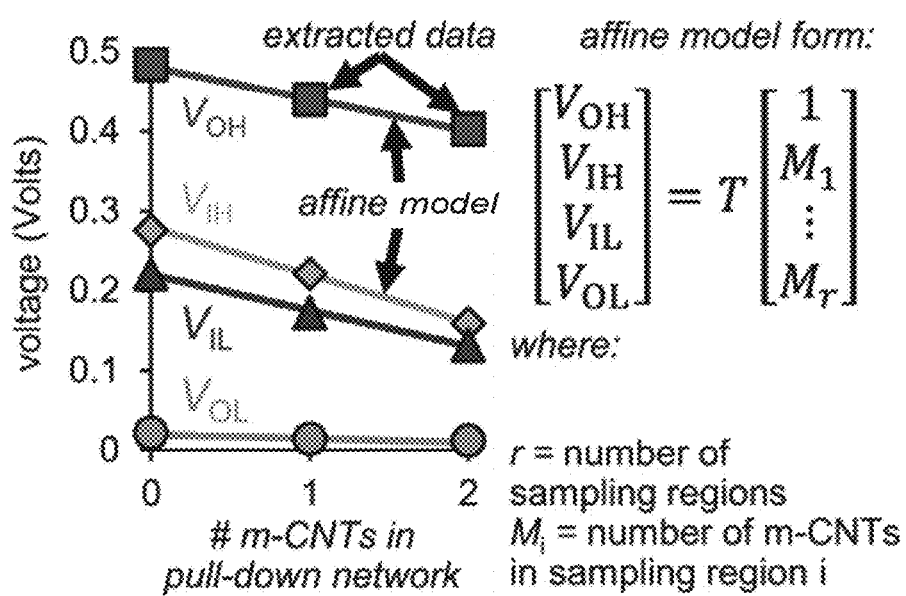

FIG. 32I
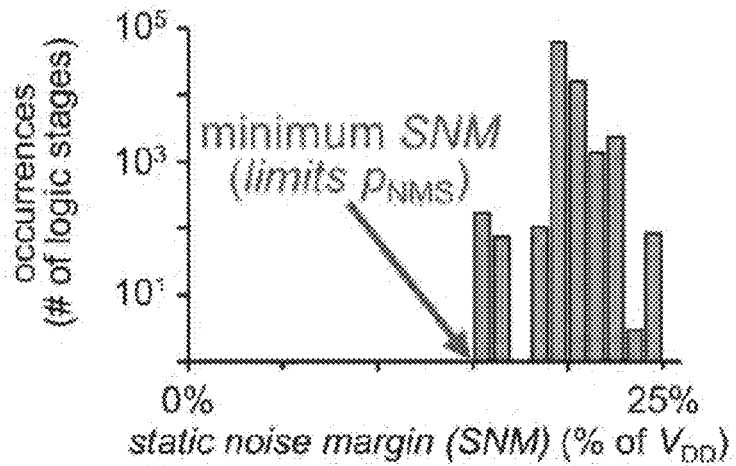
FIG. 32J
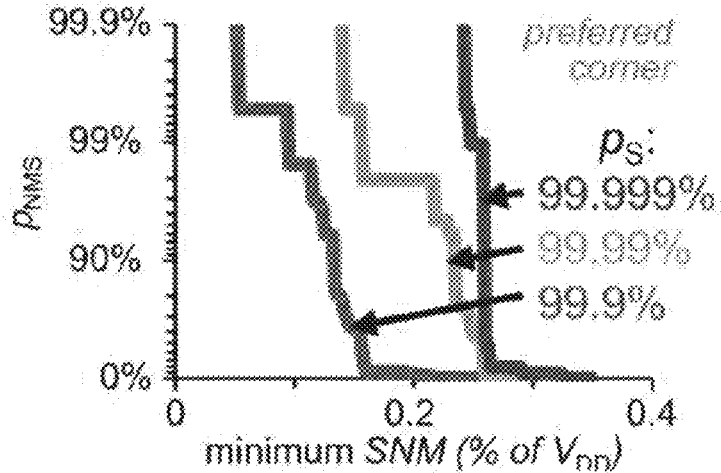
FIG. 32K
| parameter | value |
|---|---|
| technology node | "7 nm" |
| contacted gate pitch | 54 nm |
| gate, contact length | 9 nm, 9 nm |
| contact resistance | 3.3 kΩ/CNT |
| equivalent oxide thickness (EOT) | 0.7 nm |
| CNT pitch, diameter | 2 nm, 1.7 nm |
| m-CNT resistance | 40 kΩ |
| $I_{OFF}$ target | 100 nA/μm |

FIG. 33

| mnemonic | type | summary | assembly |
|---|---|---|---|
| addi | register-immediate arithmetic | add constant, no overflow exception | addi rd, rs1, imm |
| add | register-register arithmetic | addition with 3 GPRs, an overflow exception | add rd, rs1, rs2 |
| addi | register-immediate arithmetic | add constant | addi rd, rs1, imm |
| and | register-register arithmetic | bitwise AND with 3 GPRs | and rd, rs1, rs2 |
| andi | register-immediate arithmetic | bitwise AND with constant | andi rd, rs1, imm |
| auipc | register-immediate arithmetic | load (pc + constant) into GPR | auipc rd, imm |
| beq | conditional branch | branch if 2 GPRs are equal | beq rs1, rs2, imm |
| bgeu | conditional branch | branch based on unsigned comparison of 2 GPRs | bgeu rs1, rs2, imm |
| bltu | conditional branch | branch based on unsigned comparison of 2 GPRs | bltu rs1, rs2, imm |
| bge | conditional branch | branch based on signed comparison of 2 GPRs | bge rs1, rs2, imm |
| blt | conditional branch | branch based on signed comparison of 2 GPRs | blt rs1, rs2, imm |
| bne | conditional branch | branch if 2 GPRs are not equal | bne rs1, rs2, imm |
| jalr | unconditional jmp | jmp to relative address, place return address in GPR | jalr rd, rs1, imm |
| jal | unconditional jmp | jmp to address, place return address in GPR | jal rd, imm |
| lb | memory instruction | load short from memory into GPR | lb rd, imm(rs1) |
| lui | register-immediate arithmetic | load upper bits of constant into GPR | lui rd, imm |
| ori | register-immediate arithmetic | bitwise OR with constant | ori rd, rs1, imm |
| or | register-register arithmetic | bitwise OR with 3 GPRs | or rd, rs1, rs2 |
| sh | memory instruction | store short into memory | sh rs2, imm(rs1) |
| slli | register-immediate arithmetic | shift left logical by constant | slli rd, rs1, imm |
| sll | register-register arithmetic | shift left logical by GPR value | sll rd, rs1, rs2 |
| slti | register-immediate arithmetic | set GPR based on signed comparison of GPR and constant | slti rd, rs1, imm |
| sltiu | register-immediate arithmetic | set GPR based on unsigned comparison of GPR and constant | sltiu rd, rs1, imm |
| slt | register-register arithmetic | set GPR based on signed comparison of 2 GPRs | slt rd, rs1, rs2 |
| sltu | register-register arithmetic | set GPR based on unsigned comparison of 2 GPRs | sltu rd, rs1, rs2 |
| srai | register-immediate arithmetic | shift right arithmetic by constant | srai rd, rs1, imm |
| sra | register-register arithmetic | shift right arithmetic by GPR value | sra rd, rs1, rs2 |
| srli | register-immediate arithmetic | shift right logical by constant | srli rd, rs1, imm |
| srl | register-register arithmetic | shift right logical by GPR value | srl rd, rs1, rs2 |
| sub | register-register arithmetic | subtraction with 3 GPRs, no overflow exception | sub rd, rs1, rs2 |
| xori | register-immediate arithmetic | bitwise XOR with constant | xori rd, rs1, imm |
| xor | register-register arithmetic | bitwise XOR with 3 GPRs | xor rd, rs1, rs2 | format instruction type

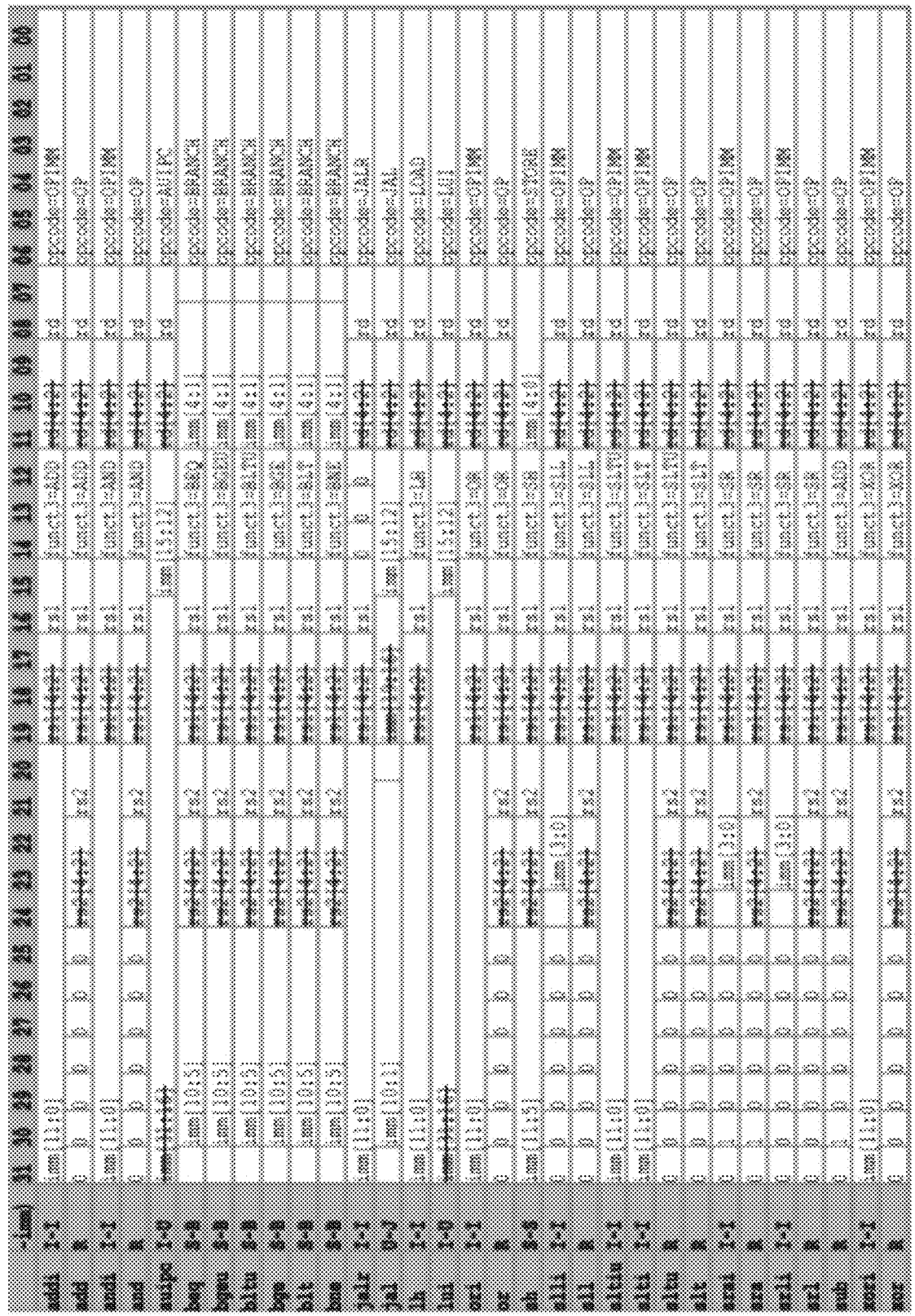
FIG. 33-contd.

RINSE-REMOVAL OF INCUBATED NANOTUBES THROUGH SELECTIVE EXFOLIATION

CROSS-REFERENCE TO RELATED APPLICATIONS

This application is by-pass continuation of International Application No. PCT/US2019/063932 filed Dec. 2, 2019, titled "RINSE-REMOVAL OF INCUBATED NANOTUBES THROUGH SELECTIVE EXFOLIATION," which claims priority to U.S. Provisional Application No. 62/773,419 filed Nov. 30, 2018, titled "REMOVAL OF INCUBATED NANOTUBES THROUGH SELECTIVE EXFOLIATION", each of which is incorporated herein by reference.

BACKGROUND

Carbon nanotube field effect transistors (CNFETs, shown in FIG. 1) are leading candidates for supplementing silicon complementary metal-oxide semiconductor (CMOS) transistors to realize next-generation energy-efficient digital systems. CNFETs are projected to improve the energy-delay product (EDP, a measure of energy efficiency) of digital very large scale integrated (VLSI) circuits by an order of magnitude vs. silicon CMOS. Moreover, CNFETs provide an exciting opportunity to naturally enable monolithic three-dimensional (3D) integrated circuits (ICs), whereby CNFETs are fabricated at low temperature on upper circuit layers (in the back-end-of-line (BEOL), potentially directly over starting silicon CMOS), leading to additional EDP benefits.

While academic and research labs have made important progress with carbon nanotubes (CNTs), there remain at least three major obstacles that have prohibited realizing an HVM-compatible CNT technology. The first obstacle is limited yield: carbon nanotube (CNT) deposition results in CNT aggregates as shown in FIG. 2. These CNT aggregates act as particle contamination, reducing die yield by inhibiting successful deposition of subsequent layers, contaminating CMOS fabrication facilities, and possibly breaking apart to scatter metallic CNTs on the substrate. While several techniques are used to remove these aggregates prior to CNT deposition (e.g., centrifugation or filtering), these techniques are complex, difficult to scale, and could alter the CNTs themselves. And it is impossible to perfectly disperse and subsequently remove all aggregates prior to CNT deposition.

The second obstacle is production of robust, high-yield CNFET CMOS logic. Large-scale CNFET circuits have used positive metal-oxide semiconductor (PMOS)-only logic relying on circuits that are robust to errors, whereas CNFET CMOS demonstrations have been smaller scale (<150 CNFETs) and suffer from variability and lack wafer-scale characterization.

The third obstacle is compatibility with silicon CMOS: contaminants (both from the metal catalyst used during CNT synthesis as well as ions introduced during the semiconducting CNT sorting process) usually far exceed the allowable limits for use in commercial silicon facilities (contaminants introduce additional sources of device variability and failure), and techniques for realizing CNFET CMOS in research facilities are often not compatible with high-volume manufacturing (HVM) due to material or processing constraints. For instance, CNFET CMOS has been primarily realized by using reactive low work-function metals that are considered contaminants in silicon manufacturing facilities. Other methods for CMOS that do not meet HVM requirements include evaporating nanometer-thin layers of reactive metals, followed by allowing it to oxidize in ambient.

SUMMARY

A method of forming a layer of carbon nanotubes on a substrate includes depositing individual carbon nanotubes and at least one carbon nanotube aggregate on the substrate. The method further includes forming an adhesive layer on the individual carbon nanotubes and at least one carbon nanotube aggregate on the substrate. The adhesive layer adheres the individual carbon nanotubes to the substrate. The method further includes mechanically exfoliating the at least one carbon nanotube aggregate from the substrate.

A method of making a carbon nanotube logic device includes depositing individual carbon nanotubes and carbon nanotube aggregates on a substrate, and forming a polydimethyldiglutarimide (PMGI) layer on the substrate, the PMGI layer having a thickness of about 100 nm to about 150 nm. The method also includes submerging the substrate in a solvent for a duration sufficient to remove a portion of the PMGI layer, and to retain a remaining portion of the PMGI layer. The method further includes sonicating the substrate in the solvent to remove the carbon nanotube aggregates from the substrate to yield a substrate surface coated with individual carbon nanotubes and fewer than 10 carbon nanotube aggregates per square millimeter, such that the remaining portion of the adhesive layer aids in maintaining adherence of the individual carbon nanotubes to the substrate during said sonicating.

A method of making a carbon nanotube field effect transistor (CNFET) complementary metal-oxide semiconductor (CMOS) device includes depositing a first channel of individual carbon nanotubes (CNTs) and a second channel of individual CNTs on the substrate, such that at least one carbon nanotube aggregate is also deposited on the substrate. The method further includes forming an adhesive layer on the substrate, the adhesive layer adhering the first channel and the second channel to the substrate. The method also includes mechanically exfoliating the at least one carbon nanotube aggregate from the substrate. The method further includes forming, in electrical contact with the first channel, a first source electrode and a first drain electrode to generate a p-type metal-oxide semiconductor (PMOS) CNFET. The method also includes forming, in electrical contact with the second channel, a second source electrode and a second drain electrode to generate an n-type metal-oxide semiconductor (NMOS) CNFET.

A carbon nanotube logic device includes a substrate, and a first adhesive layer formed on the substrate. The device also includes a channel of individual CNTs deposited on the first adhesive layer. The first adhesive layer promotes adhesion of the channel of individual CNTs to the substrate. The device further includes a second adhesive layer deposited on the substrate and on the channel of individual CNTs to maintain adhesion of the channel of individual CNTs to the substrate.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

Figures 5A, 5B, 5C:
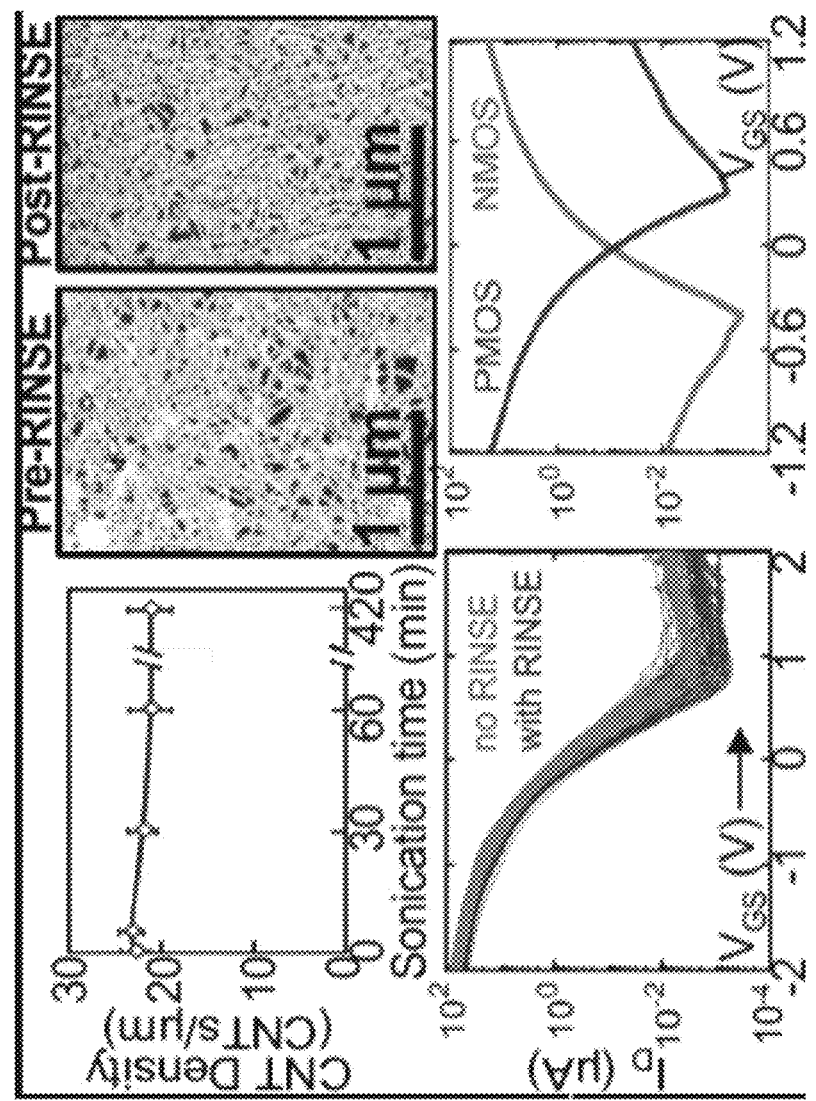
FIG. 5A shows that RINSE does not impact CNTs/CNFETs, and is a plot of CNT density versus sonication time and shows that the CNT density is the same pre- vs. post-RINSE.

FIG. 5B also shows that RINSE does not impact CNTs/CNFETs, and is a plot of CNFET $I_D$-$V_{GS}$ characteristics showing that RINSE causes minimal change FIG. 5C also shows that RINSE does not impact CNTs/CNFETs, and is a plot CNFET $I_D$-$V_{GS}$ characteristics showing that CNFETs can still be doped NMOS after RINSE.

FIG. 6A is an image illustrating CNT aggregates on a substrate, pre-RINSE.

FIG. 6B shows the substrate of FIG. 6A, after RINSE, and illustrates a reduction in CNT aggregates.

FIG. 6C is a plot illustrating that RINSE reduces CNT aggregate density by >250× and can be optimized by modifying sonication power and time.

Figure 7:
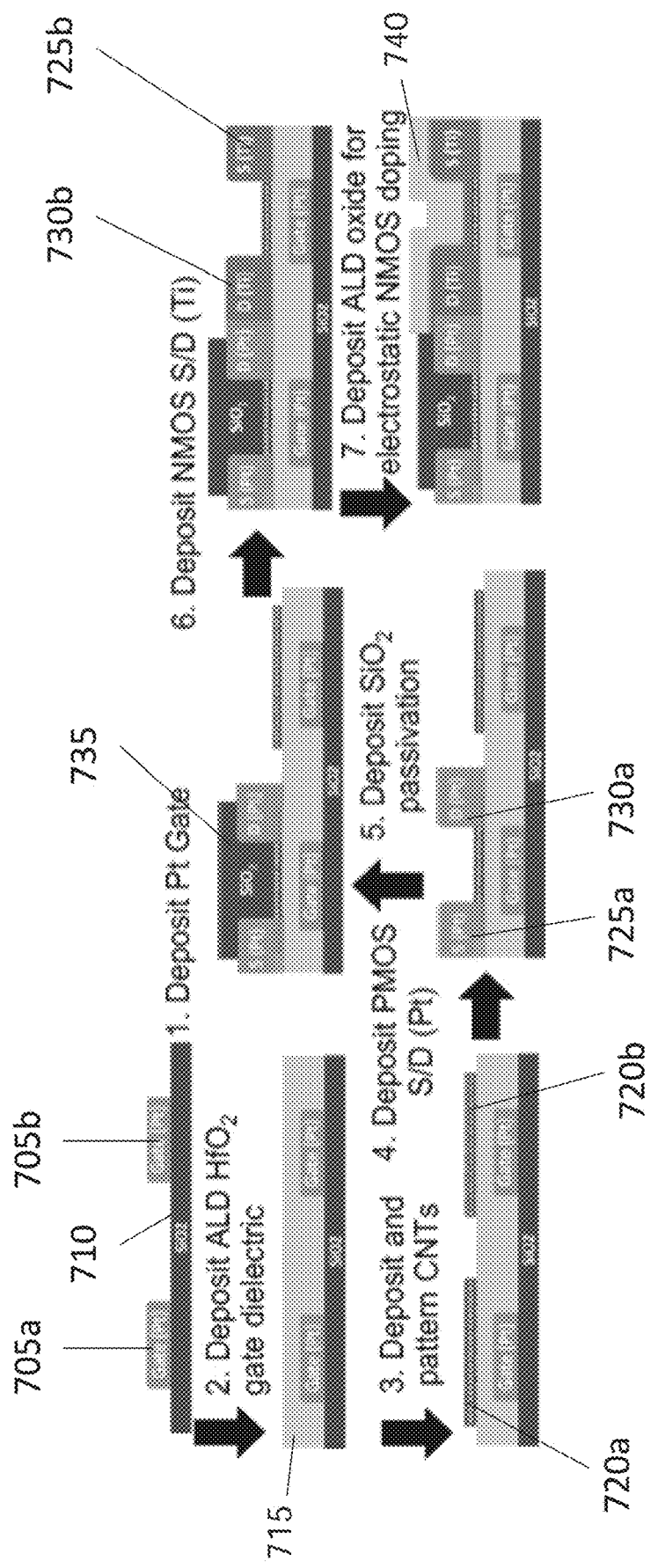

FIG. 7 is an example CNFET CMOS process flow diagram. Both the PMOS and NMOS CNFETs use a back-gate geometry, and the doping to realize the NMOS can be accomplished by (1) metal contact work function engineering (e.g., platinum is used for PMOS source/drain, while titanium is used for NMOS source/drain) or (2) electrostatic doping. In step 1, platinum back-gates are deposited on a $SiO_2$ substrate. In step 2, $HfO_2$ is deposited via atomic layer deposition (ALD). In step 3, CNTs are deposited and patterned, consistent with RINSE. In step 4, platinum source and drain electrodes are deposited for the PMOS. In step 5, a passivation layer of $SiO_2$ is deposited on the PMOS. In step 6, titanium source and drain electrodes are deposited for the NMOS. In step 7, a nonstoichiometric oxide is deposited on the NMOS via ALD. Notably, in step 7, the ALD-deposited oxide electrostatically dopes CNTs in NMOS CNFETs, while CNTs in PMOS are protected by the passivation layer deposited in step 5.

Figure 8:
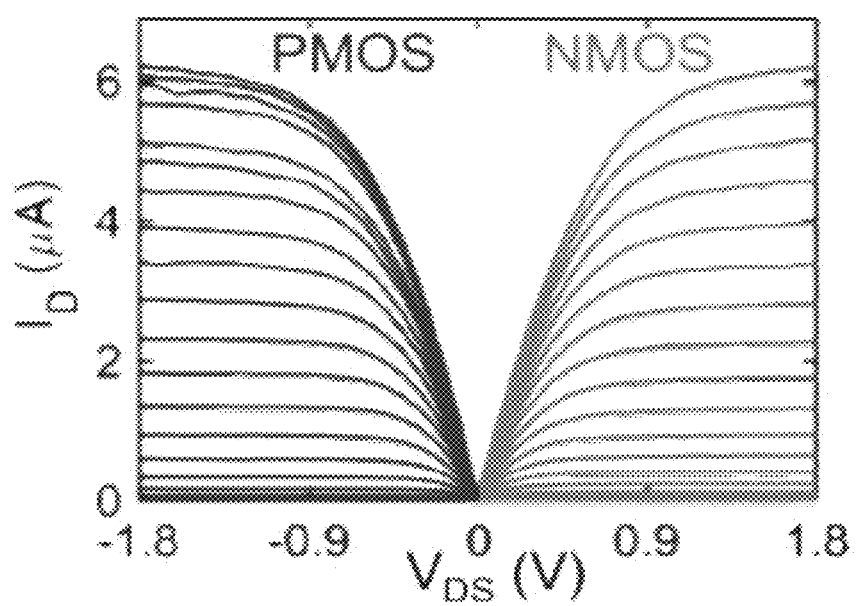

FIG. 8 is a plot of CNFET CMOS $I_D$-$V_{DS}$ characteristics for PMOS and NMOS CNFETs (for varying $V_{GS}$), fabricated following the processing flow in FIGS. 6A-6B, where the length L is about 2 μm and width W is about 2 μm.

Figure 9A:
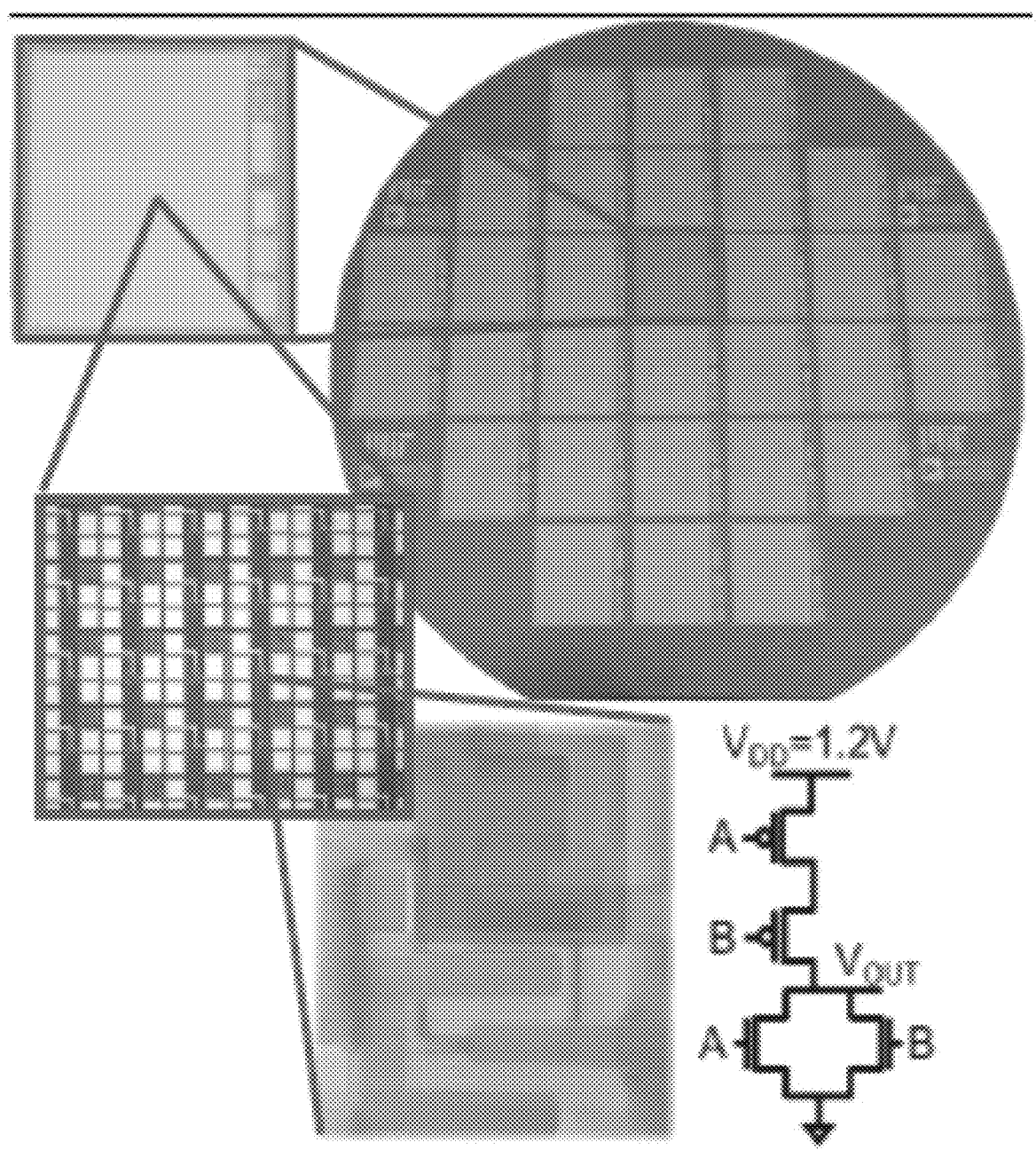

FIG. 9A illustrates wafer-scale CNFET CMOS fabrication and characterization, and illustrates a 150 mm wafer, die area: 2 cm×2 cm. Each die contains 10,400 CNFET CMOS NOR2 gates (and therefore 41,600 CNFETs)

Figure 9B:
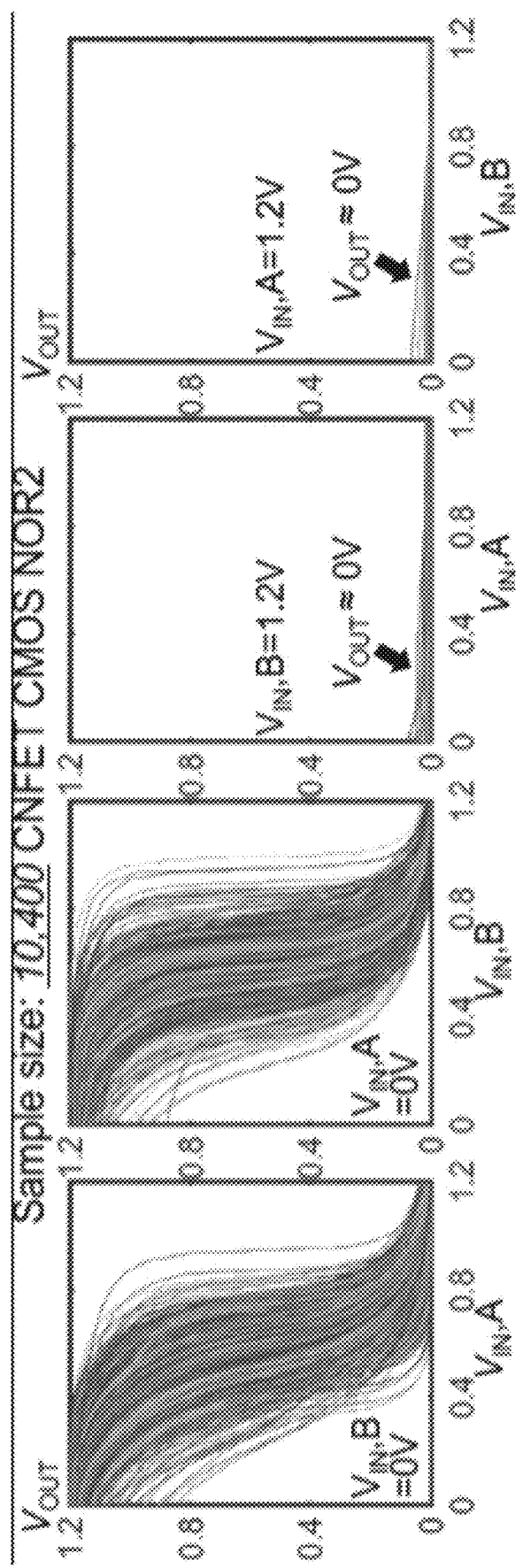

FIG. 9B illustrates experimental measurements of the wafer of FIG. 9A, showing the voltage transfer curves (VTCs) of all 10,400 CNFET CMOS NOR2 gates, without any outliers removed. The functional yield is 10,400/10,400. The first VTC plot (leftmost plot) shows the output voltage ($V_{OUT}$) when input voltage "A" ($V_{IN,A}$) is swept from 0 to 1.2V while input voltage "B" ($V_{IN,B}$) is held constant at 0 V. The second VTC plot shows $V_{OUT}$ when $V_{IN,A}$=0 and $V_{IN,B}$ is swept form 0 to 1.2V. The third VTC plot shows $V_{OUT}$ when $V_{IN,A}$ is swept from 0 to 1.2V while $V_{IN,B}$=1.2V. The fourth VTC plot (rightmost plot), shows $V_{OUT}$ when $V_{IN,B}$ is swept from 0 to 1.2V while $V_{IN,A}$=1.2V.

Figure 10:
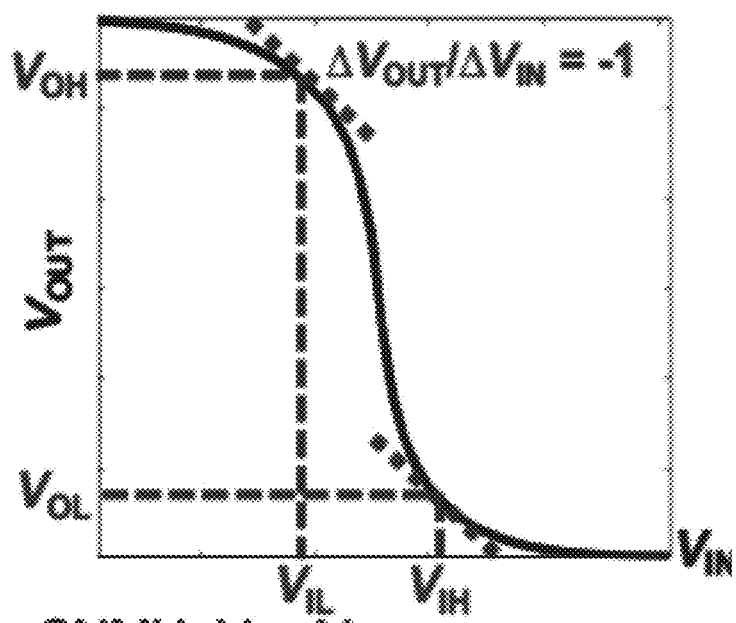

FIG. 10 is a plot illustrating definitions of key metrics extracted from VTC. SNM: static noise margin; H=high, L=low.

Figure 11:
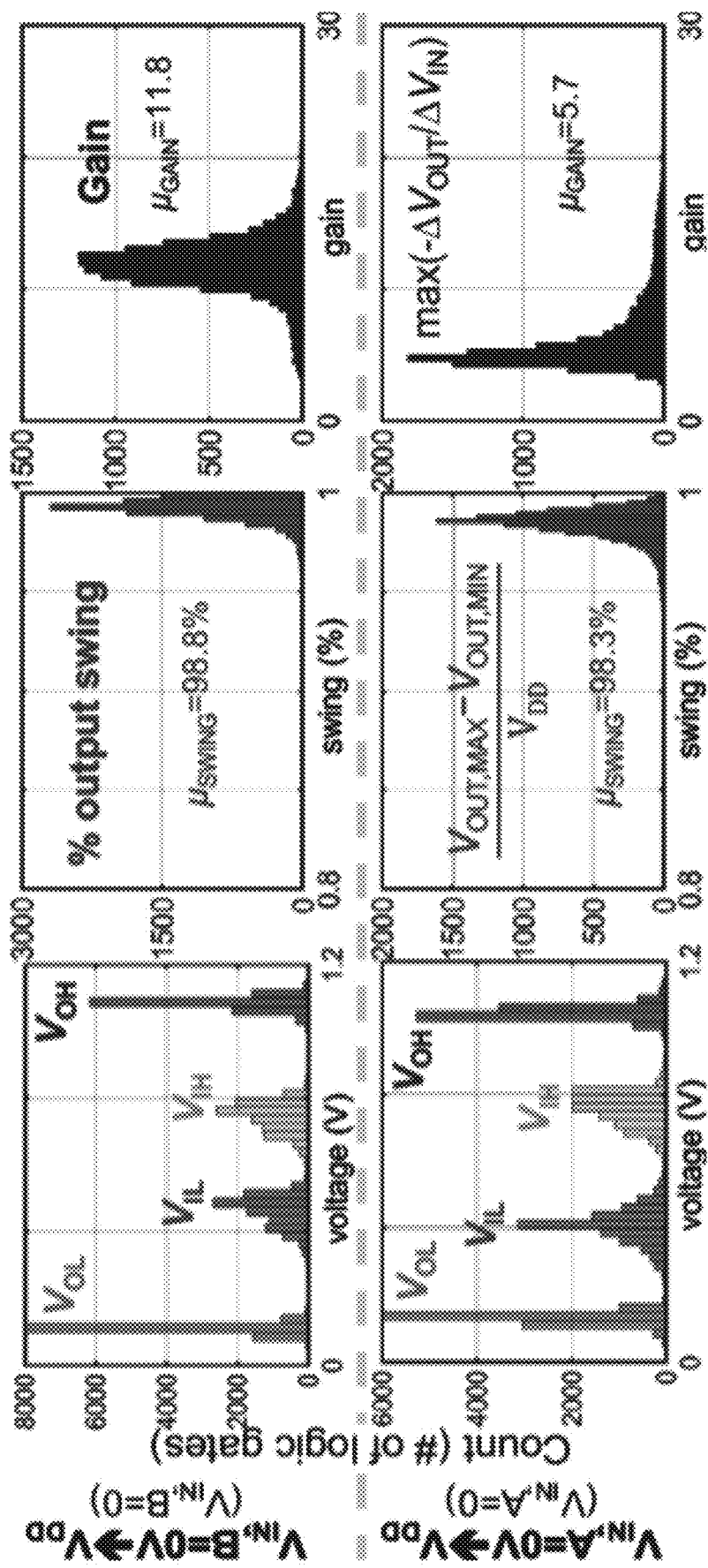

FIG. 11A is a distribution of "output low" voltage ($V_{OL}$), "output high" voltage ($V_{OH}$), "input low" voltage ($V_{IL}$), and "input high" voltage ($V_{IH}$) for the 10,400 CMOS NOR2 logic gates when $V_{IN,B}$=0V and $V_{IN,A}$ is swept from 0 to $V_{DD}$.

FIG. 11B is a distribution of output swing as a percent of $V_{DD}$ when for the 10,400 CMOS NOR2 logic gates when $V_{IN,B}$=0V and $V_{IN,A}$ is swept from 0 to $V_{DD}$.

FIG. 11C is a distribution of gain when for the 10,400 CMOS NOR2 logic gates when $V_{IN,B}$=0V and $V_{IN,A}$ is swept from 0 to $V_{DD}$.

FIG. 11D is a plot of distribution of "output low" voltage ($V_{OL}$), "output high" voltage ($V_{OH}$), "input low" voltage ($V_{IL}$), and "input high" voltage ($V_{IH}$) for the 10,400 CMOS NOR2 logic gates when $V_{IN,A}$=0V and $V_{IN,B}$ is swept from 0 to $V_{DD}$.

FIG. 11E is a distribution of output swing as a percent of $V_{DD}$ when for the 10,400 CMOS NOR2 logic gates when $V_{IN,A}$=0V and $V_{IN,B}$ is swept from 0 to $V_{DD}$.

FIG. 11F is a distribution of gain when for the 10,400 CMOS NOR2 logic gates when $V_{IN,A}$=0V and $V_{IN,B}$ is swept from 0 to $V_{DD}$. FIGS. 11A-11F generally show the metrics defined in FIG. 10 for the 10,400 CNFET CMOS NOR2 logic gates measured in FIG. 9. $V_{DD}$ is 1.2 V.

Figure 12:
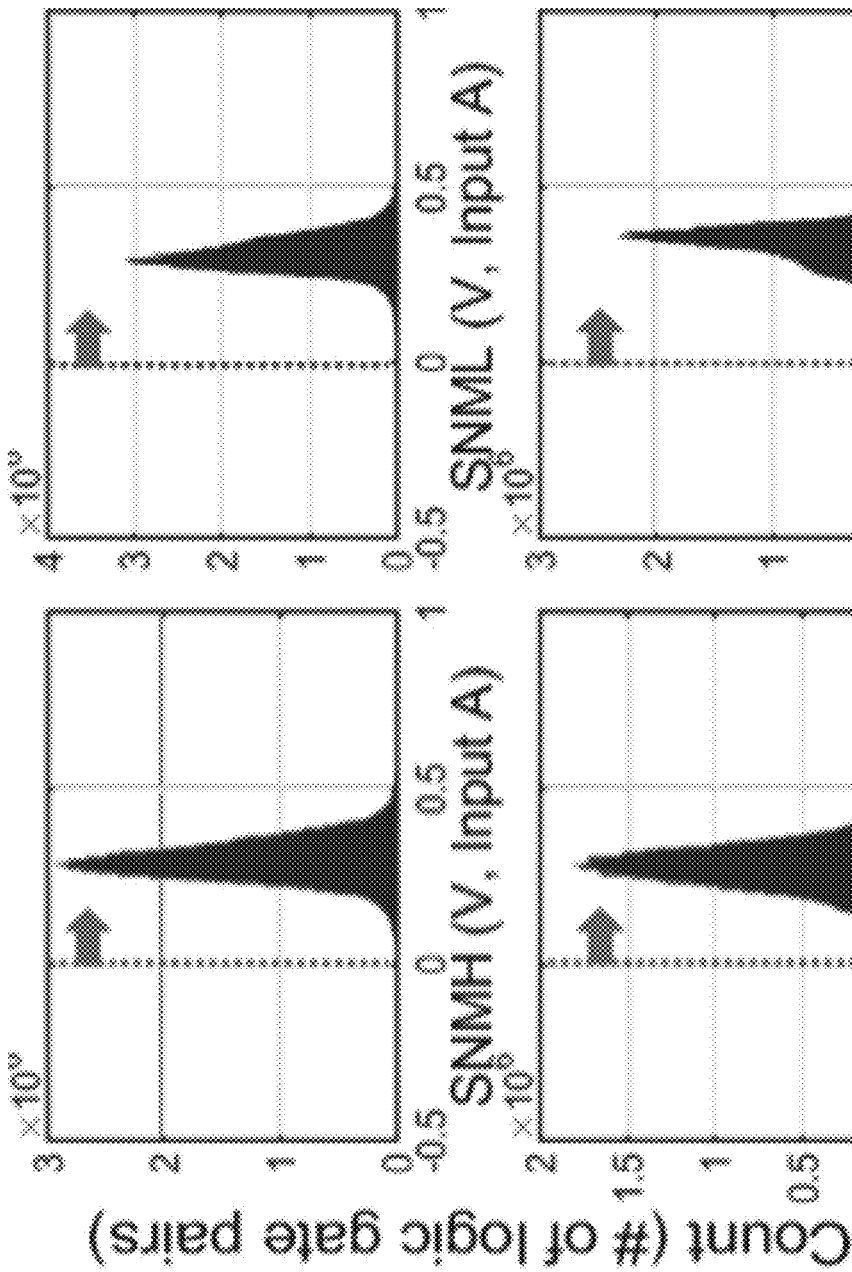

FIG. 12A is a distribution of the static noise margin high values (SNMH) for input A.

FIG. 12B is a distribution of the static noise margin low values (SNML) for input A.

FIG. 12C is a distribution of the static noise margin high values (SNMH) for input B.

FIG. 12D is a distribution of the static noise margin low values (SNML) for input B. Generally, FIGS. 12A-12D show histograms of SNM extracted by analyzing >100 million logic gate pairs (cascading every pair of NOR2 gates above, using the equations from FIG. 10). The percentages of cascaded gate pairs that have positive SNM are: 99.90% (SNMH,A) 99.94% (SNML,A) 99.98% (SNMH,B) 99.92% (SNML,B). $V_{DD}$ is 1.2 V.

Figure 13:
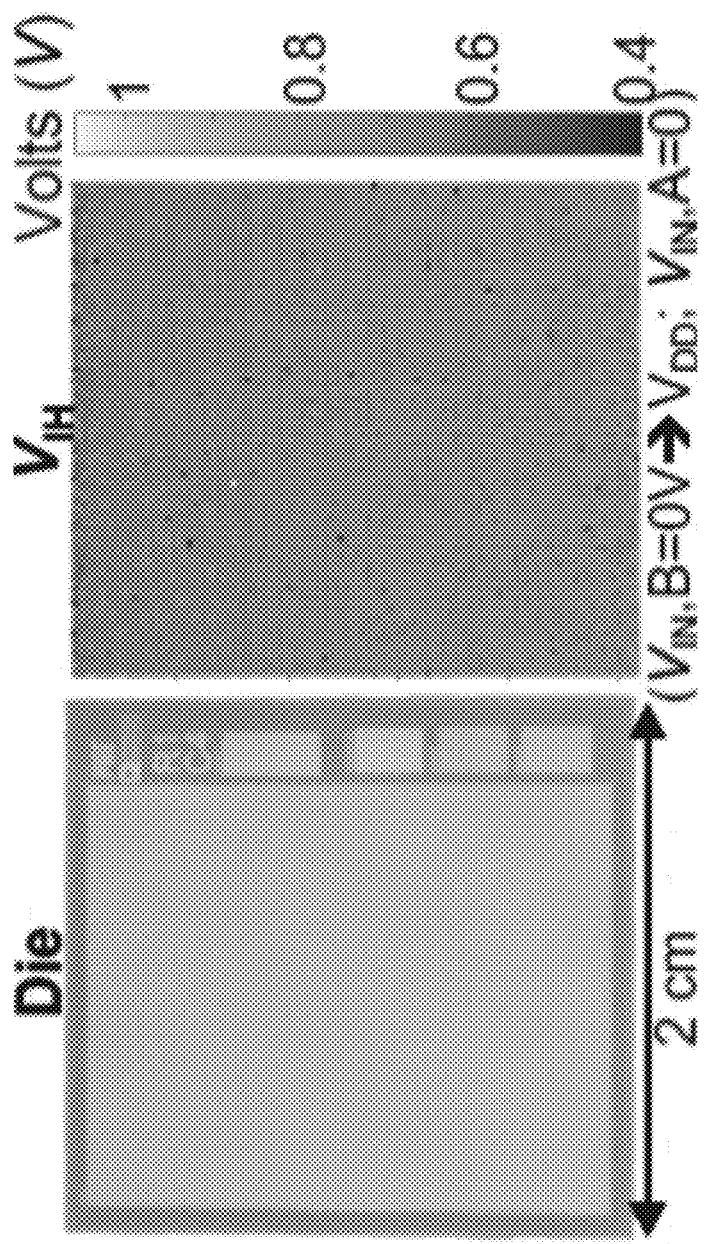

FIG. 13 illustrates spatial dependence of $V_{IH}$ (as an example parameter to compute SNM). Each pixel represents the $V_{IH}$ of the NOR2 at that location in the die. $V_{IH}$ increases across the die (increasing from top to bottom). The change in $V_{IH}$ corresponds with slight changes in CNFET threshold voltage. The fact that the threshold voltage variations are not uniformly distributed, but rather have spatial dependence, illustrates that a portion of the threshold voltage variations (and therefore variation in SNM) is due to wafer-level processing-related variations (CNT deposition is more uniform across the 150 mm wafer). Optimizing uniformity of the ALD oxide deposition used for electrostatic doping could further improve SNM for realizing VLSI circuits.

Figures 14A, 14B:
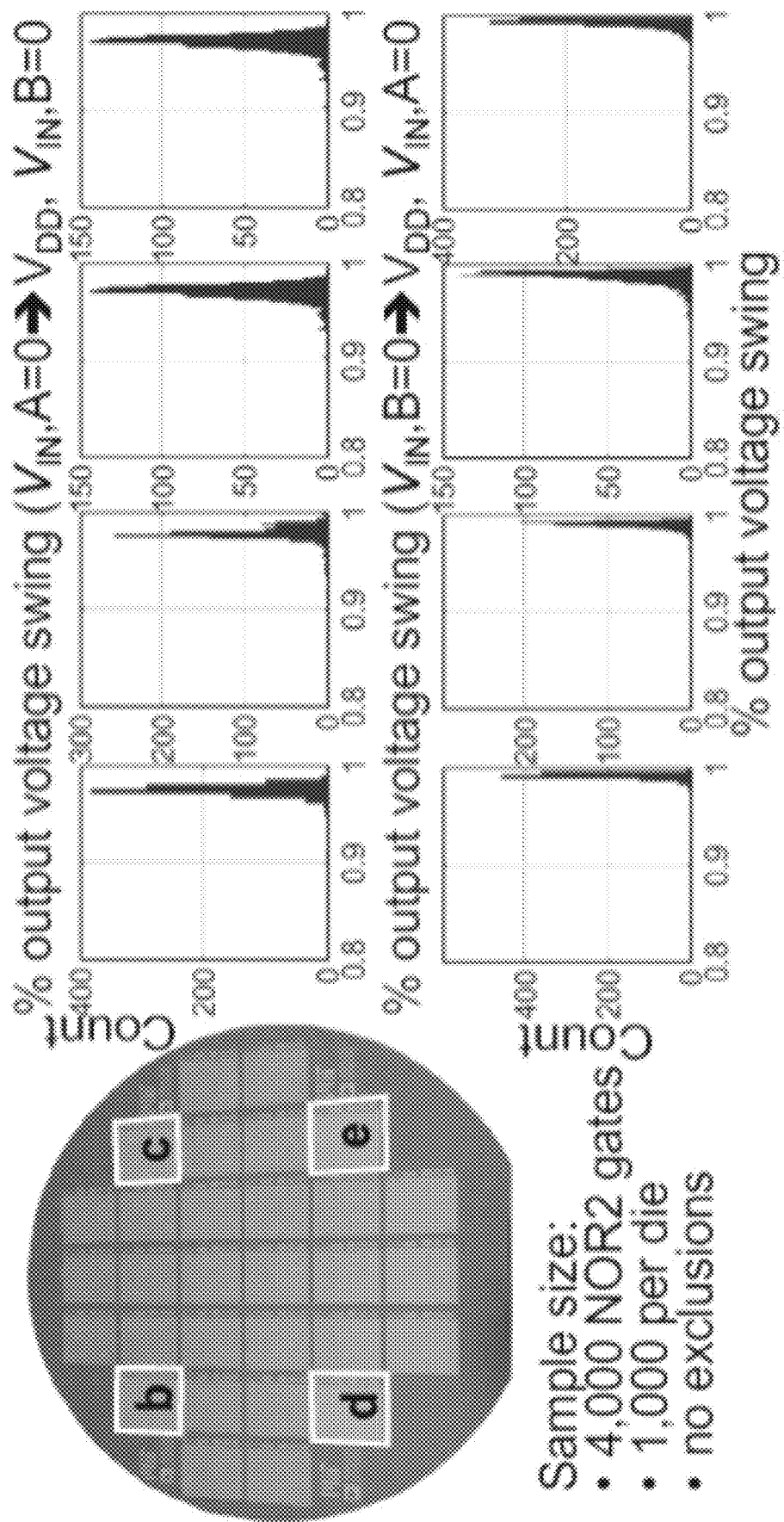

FIG. 14A illustrates four dies across a 150 mm wafer, each die includes 10,400 CNFETs.

FIG. 14B shows wafer-scale CNFET CMOS characterization of the dies of FIG. 14A. 1000 CNFET CMOS NOR2 logic gates are sampled randomly from the ensemble of 10,400 CNFETs in each die. No outliers are removed. The top four distributions in FIG. 14B correspond to the four sampling locations and show distributions of output voltage swings for the 1000 CNFET CMOS NOR2 gates when $V_{IN,A}$ is swept from 0 to $V_{DD}$ and $V_{IN,B}$=0. The bottom four distributions in FIG. 14B also correspond to the four sampling locations and show distributions of output voltage swings for the 1000 CNFET CMOS NOR2 gates when $V_{IN,B}$ is swept from 0 to $V_{DD}$ and $V_{IN,A}$=0. Yield and performance variations are negligible across wafer as illustrated by the distribution of the output voltage swing.

Figure 15:
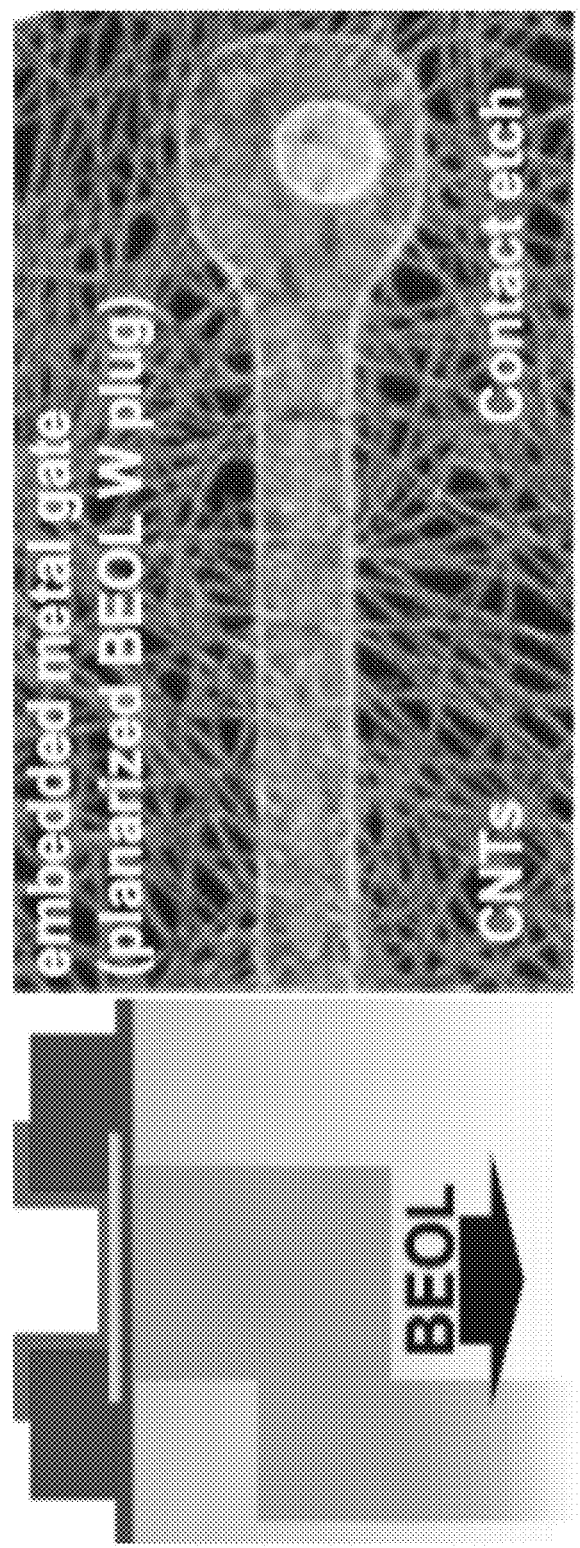

FIG. 15 illustrates a pilot implementation of CNFETs within a commercial silicon manufacturing facility. CNFETs were fabricated on upper circuit layers (conventional planarized Tungsten plugs were used as embedded back-gates and all CNFET-related fabrication is low temperature: <400° C.). The SEM image shows an embedded metal gate covered with gate dielectric and CNTs.

Figures 16, 17:
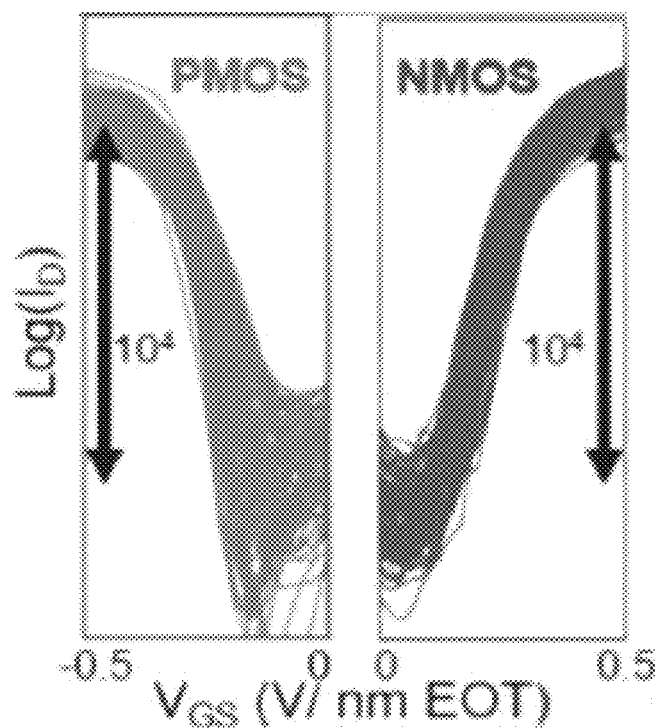

FIG. 16 illustrates plots of experimental $I_D$-$V_{GS}$ of 100 PMOS (left plot) and 100 NMOS (right plot) CNFETs fabricated in a commercial facility.

FIG. 17 shows that customized CNT solution preparations successfully remove chemical contaminants from the solution, confirmed with laser-ablation ICP-MS. The 70 elements listed in FIG. 17 had contamination below the detectable limits and within the requirements for introducing CNTs within commercial silicon fabrication facilities.

Figures 18A, 18B:
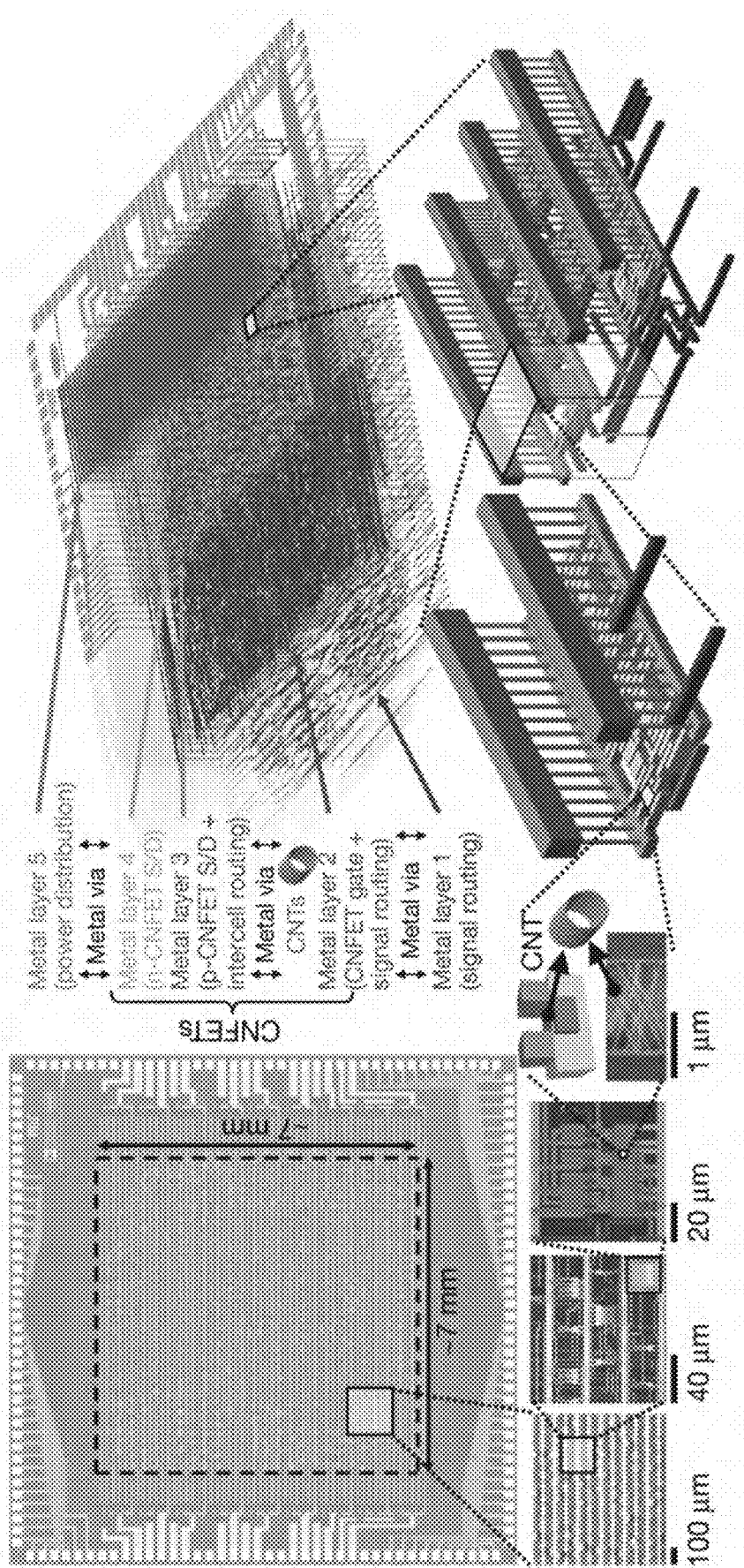

FIG. 18A is an image of a fabricated RV16X-NANO chip. The die area is 6.912 mm×6.912 mm, with input/output pads placed around the periphery. Scanning electron microscopy images with increasing magnification are shown inset. RV16X-NANO is fabricated entirely from CNFET CMOS, in a wafer-scalable, VLSI-compatible, and silicon-CMOS compatible fashion.

FIG. 18B is a three-dimensional to-scale rendered schematic of the RV16X-NANO physical layout (all dimensions are to scale except for the z axis, which is magnified to clarify each individual vertical layer). RV16X-NANO leverages a new three-dimensional (3D) physical architecture in which the CNFETs are physically located in the middle of the stack, with metal routing both above and below.

Figure 19A:
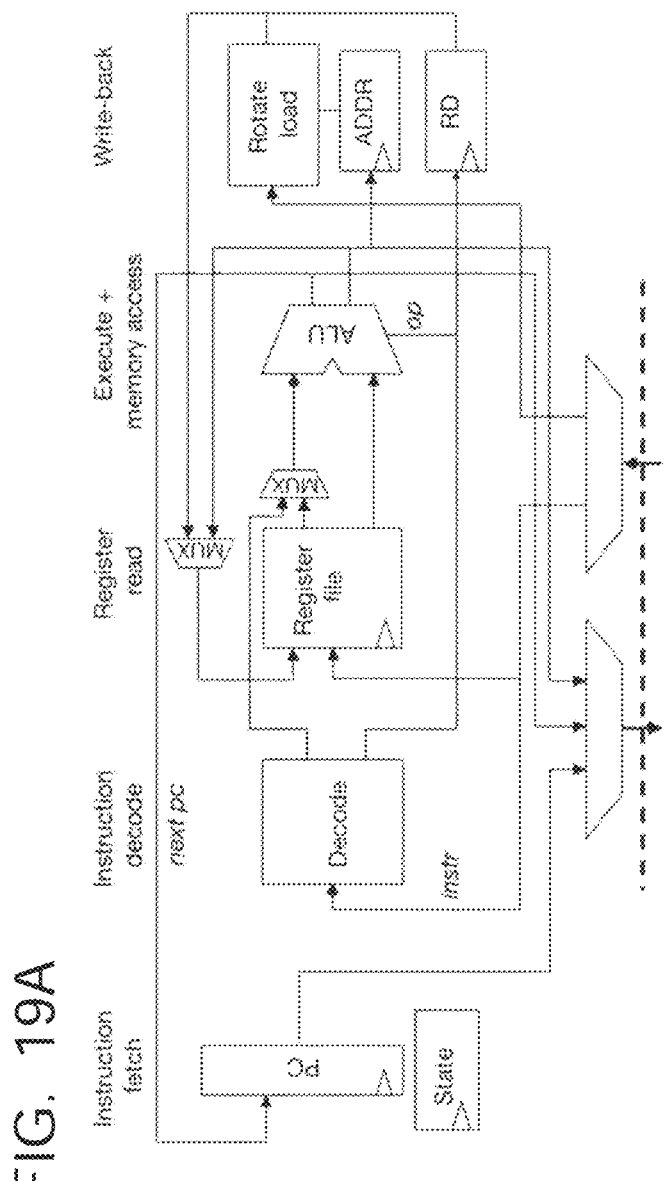

FIG. 19A is a block diagram of the architecture and design of RV16X-NANO, showing the organization of RV16X-NANO, including the instruction fetch, instruction decode, register read, execute+memory access, and write-back stages.

Figure 19B:
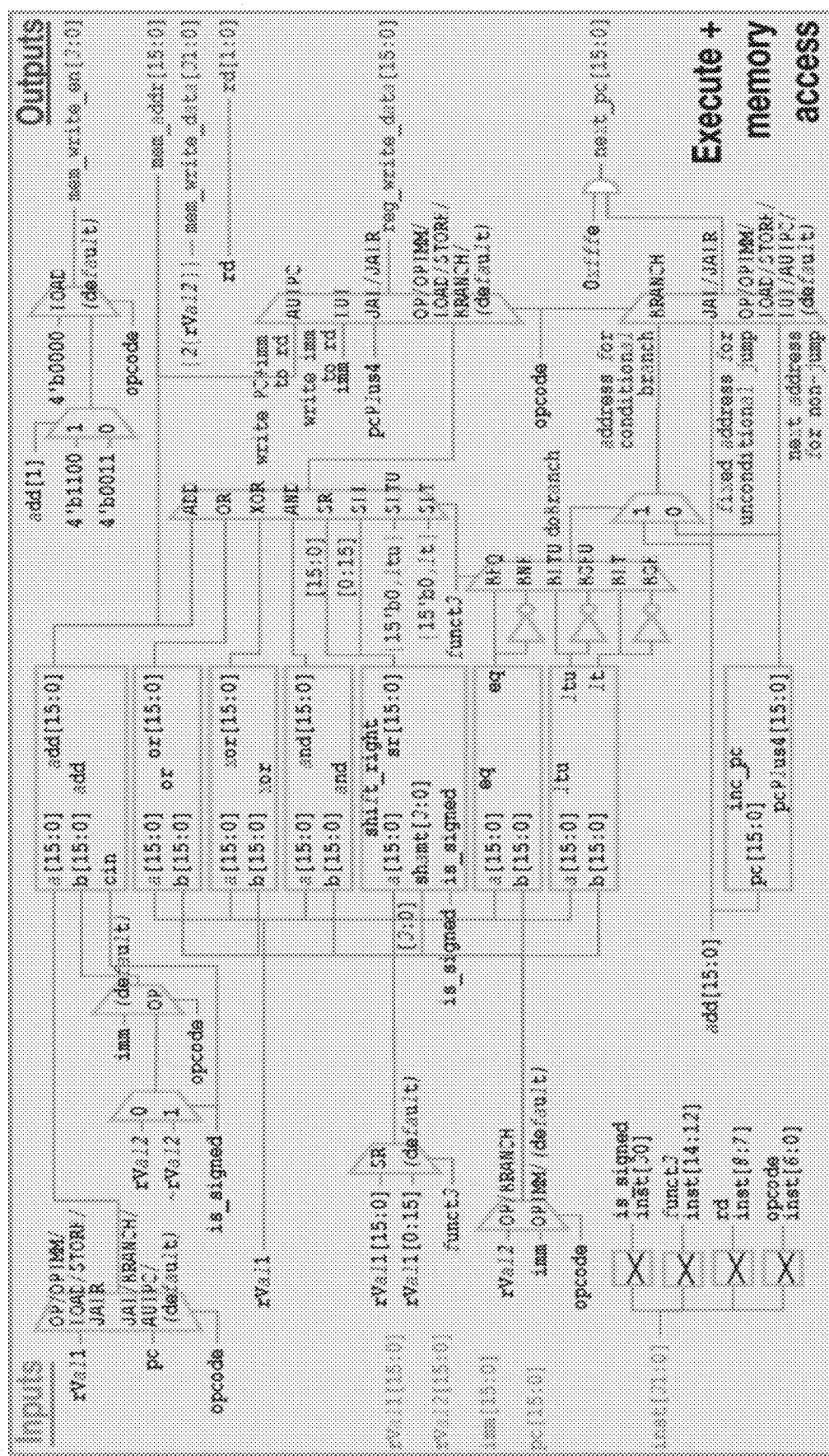

FIG. 19B is a schematic describing the high-level register transfer level (RTL) description of each stage of the design of FIG. 19A, including inputs, outputs and signal connections.

Figure 20A:
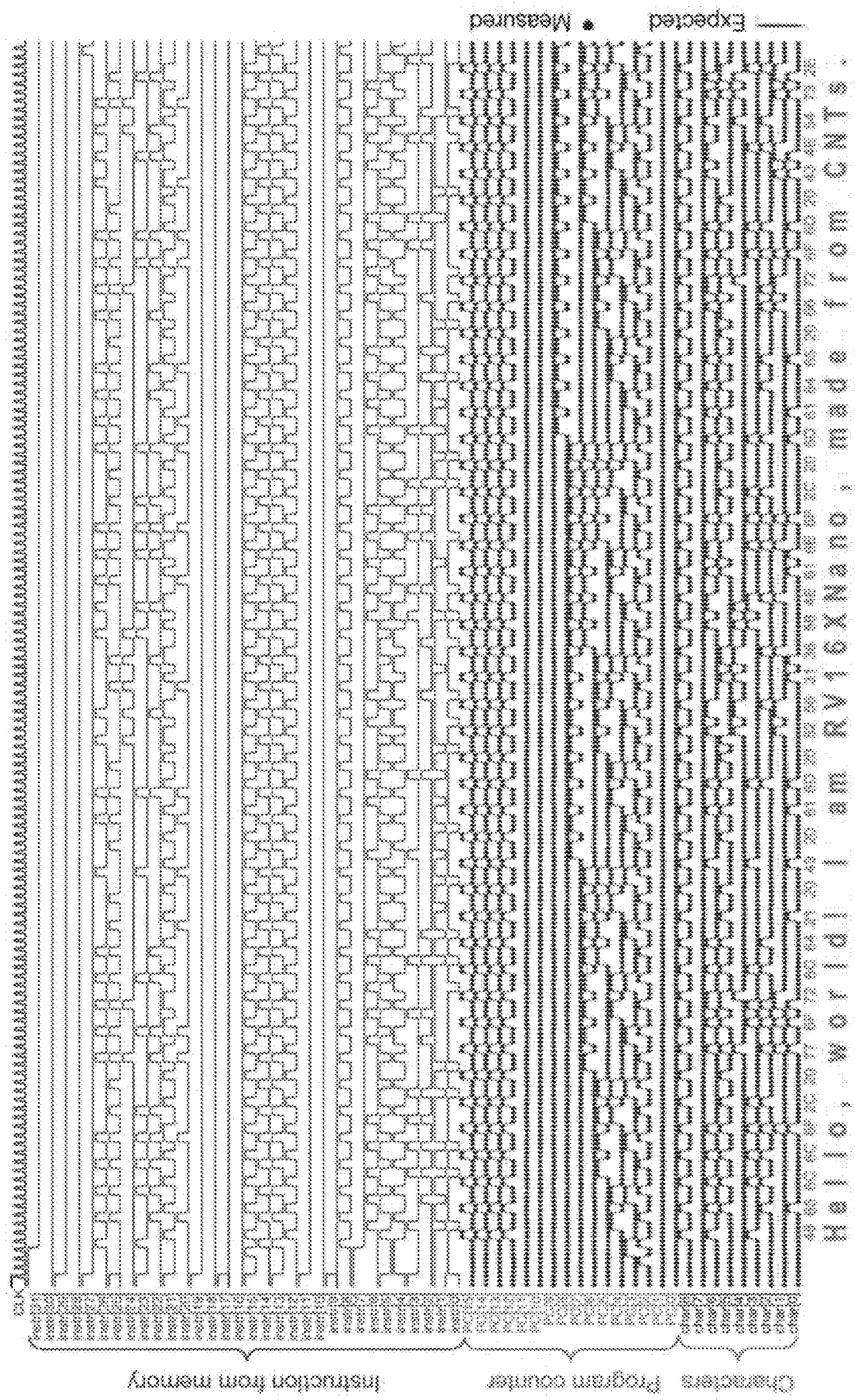

FIG. 20A shows an experimentally measured waveform from RV16X-NANO, executing the 'Hello, World' program. The waveform shows the 32-bit instruction fetched from memory, the program counter stored in RV16X-NANO, as well as the character output from RV16X-NANO. Below the waveform, the binary output (shown in hexadecimal code) is converted to their ASCII characters to their ASCII characters, showing RV16X-NANO printing out "Hello, world! I am RV16XNano, made from CNTs." In addition to this program, functionality was tested by executing all of the 31 instructions within RV32E (see Example 3).

Figure 20B:
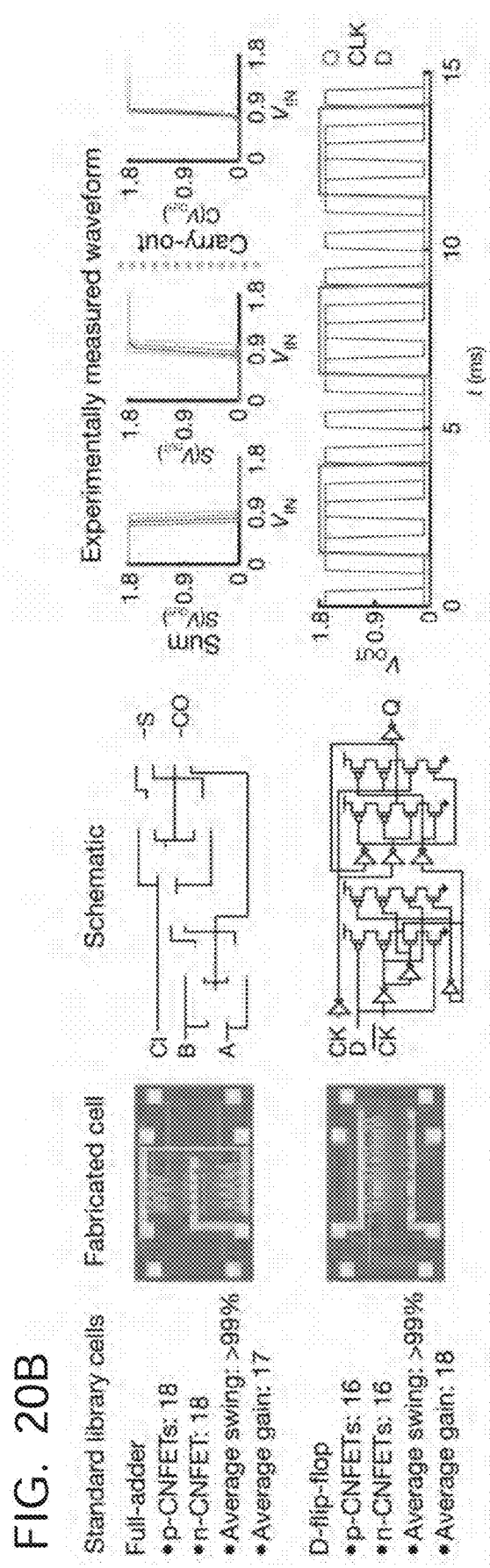

FIG. 20B shows RV16X-NANO as designed using conventional electronic design automation (EDA) tools, leveraging a CNT process design kit as disclosed here, and a CNT CMOS standard cell library. An example combinational cell (full-adder) and example sequential cell (D-flip-flop) are shown alongside an optical microscopy image of the fabricated cells, their schematics, as well as their experimentally measured waveforms. For the full-adder, shown here are the outputs (sum and carry-out outputs) for all possible biasing conditions in which sweeping the voltage of input (from 0 to $V_{DD}$) causes a change in the logical state of the output (that is, for the full adder, with $C_{OUT}$=A*B+B*$C_{IN}$+A*$C_{IN}$, with A=logical '0' and B=logical '1', then sweeping $C_{IN}$ from '0' to '1' causes $C_{OUT}$ to change from logical '0' to logical '1'). ($C_I$ indicates $C_{IN}$ and $C_O$ indicates $C_{OUT}$.) For the sum output $S(V_{OUT})$, there are 12 such conditions: six where $V_{OUT}$ has the same polarity as the swept input (positive unate) and six where $V_{OUT}$ has the opposite polarity to the swept input (negative unate). For the carry-out output $C(V_{OUT})$ there are six such conditions (all positive unate); the measurements are overlaid over one another. Gain for all transitions is >15, with output voltage swing >99%. The D-flip-flop waveform (voltage versus time) illustrates correct functionality of the positive edge-triggered D-flip-flop (output state Q shows correct functionality based on data input D and clock input CLK). CK and C⁻K⁻ are the clock input and the inverse of the clock input, respectively.

Figure 21A:
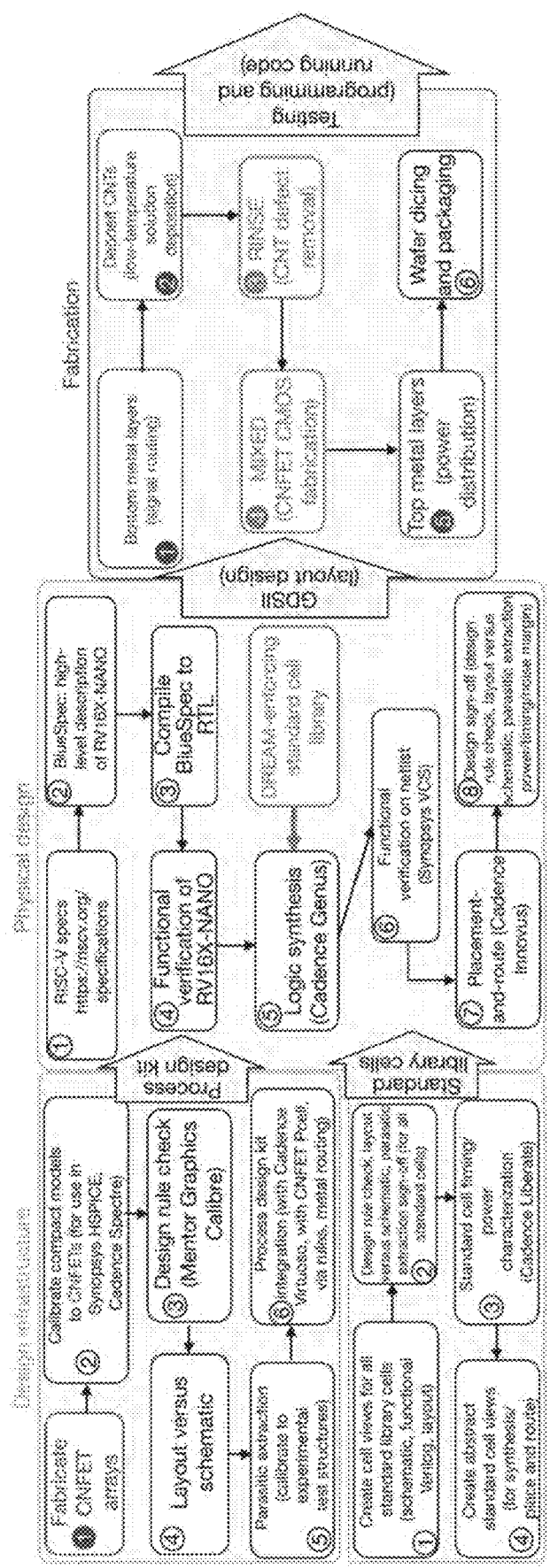

FIG. 21A illustrates design and manufacturing flow for RV16X-NANO, illustrating how the manufacturing methodology described herein seamlessly integrates within conventional silicon-based EDA tools. Black boxes show conventional steps in silicon-CMOS design flows. The "fabricate CNFET . . . ", "Bottom metal layers", "Deposit CNTs . . . " and "Top metal layers . . . " steps are adjusted for CNTs instead of silicon. The "DREAM-enforcing . . . ", "MIXED . . . " and "RINSE" steps represent the additions to implement the manufacturing methodology. RV16X-NANO is the first hardware demonstration of a beyond-silicon emerging nanotechnology leveraging a complete RTL-to-GDS physical design flow. Software packages are from Synopsys, Cadence, and Mentor Graphics.

FIG. 21B illustrates scanning electron microscopy images showing that CNTs inherently bundle together, forming thick CNT aggregates. These aggregates result in CNFET failure (reduced CNFET yield) as well as prohibitive particle contamination for VLSI manufacturing.

FIG. 21C illustrates the Removal of Incubated Nanotubes through Selective Exfoliation (RINSE) process steps: (1) CNT incubation, (2) adhesion coating, (3) mechanical exfoliation (see text for details).

FIG. 21D shows how, after performing RINSE, CNT aggregates are removed from the wafer.

FIG. 21E shows that after performing RINSE, the individual CNTs not in aggregates are not removed from the wafer, while without RINSE, sonication inadvertently removes large areas of all CNTs from the wafer. Top panel shows CNT incubation pre-RINSE, middle panel shows CNTs left on the wafer post-RINSE, and the bottom panel shows CNTs inadvertently removed from the wafer after sonicating a wafer to remove CNT aggregates without performing the adhesion-coating step in RINSE.

FIG. 21F illustrates particle contamination reduction due to RINSE. RINSE decreases particle density by >250×.

FIG. 21G shows how increasing the time of step 3 of FIG. 21C (sonication time) to over 7 hours results in no change in CNT density across the wafer.

Figure 22A:
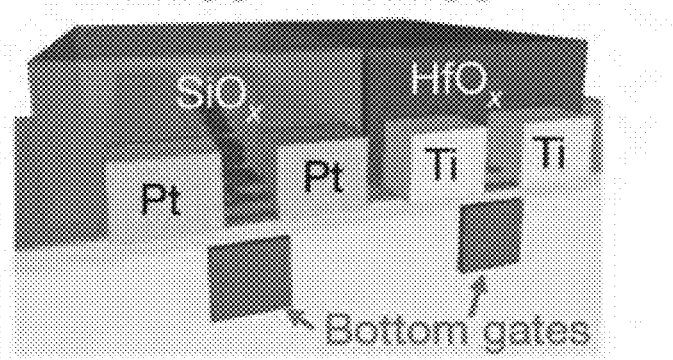

FIG. 22A is a schematic of CNFET CMOS fabricated using Metal Interface engineering Crossed with Electrostatic Doping (MIXED). MIXED is a combined doping process that leverages both metal contact work-function engineering as well as electrostatic doping to realize a robust wafer-scale CNFET CMOS process. Employed here are platinum contacts and SiOx passivation for p-CNFETs, and titanium contacts and HfOx passivation for n-CNFETs.

Figure 22B:
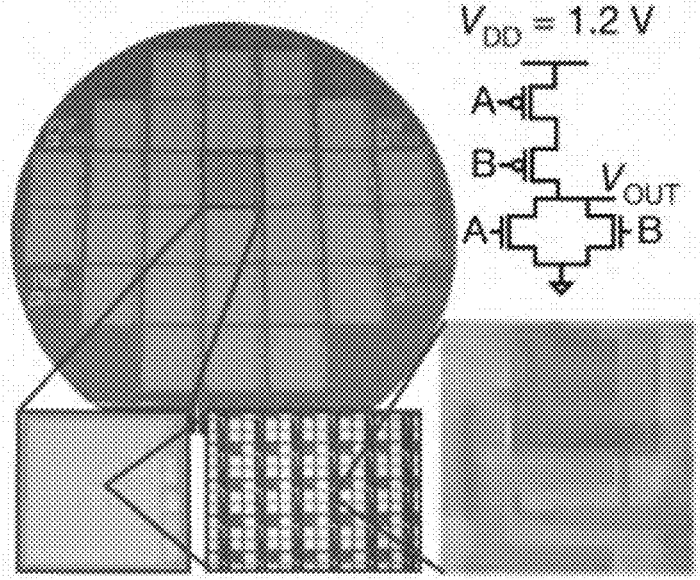

FIG. 22B shows dies fabricated with 10,400 CNFET CMOS digital logic gates across 150-mm wafers to characterize MIXED.

Figure 22C:
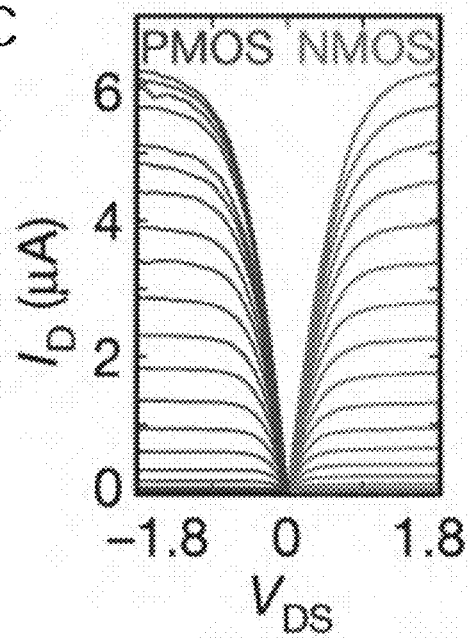

FIG. 22C illustrates $I_D$ versus $V_{DS}$ characteristics showing p-CNFETs and n-CNFETs that exhibit similar $I_D$-$V_{DS}$ characteristics (for opposite polarity of input bias conditions, for example, $V_{DS,P}=-V_{DS,N}$), achieved with MIXED. The gate-to-source voltage $V_{GS}$ is swept from $-V_{DD}$ to $V_{DD}$ in increments of 0.1 V. See Example 2 for $I_D$-$V_{GS}$ and additional CNFET characteristics.

Figure 22D:
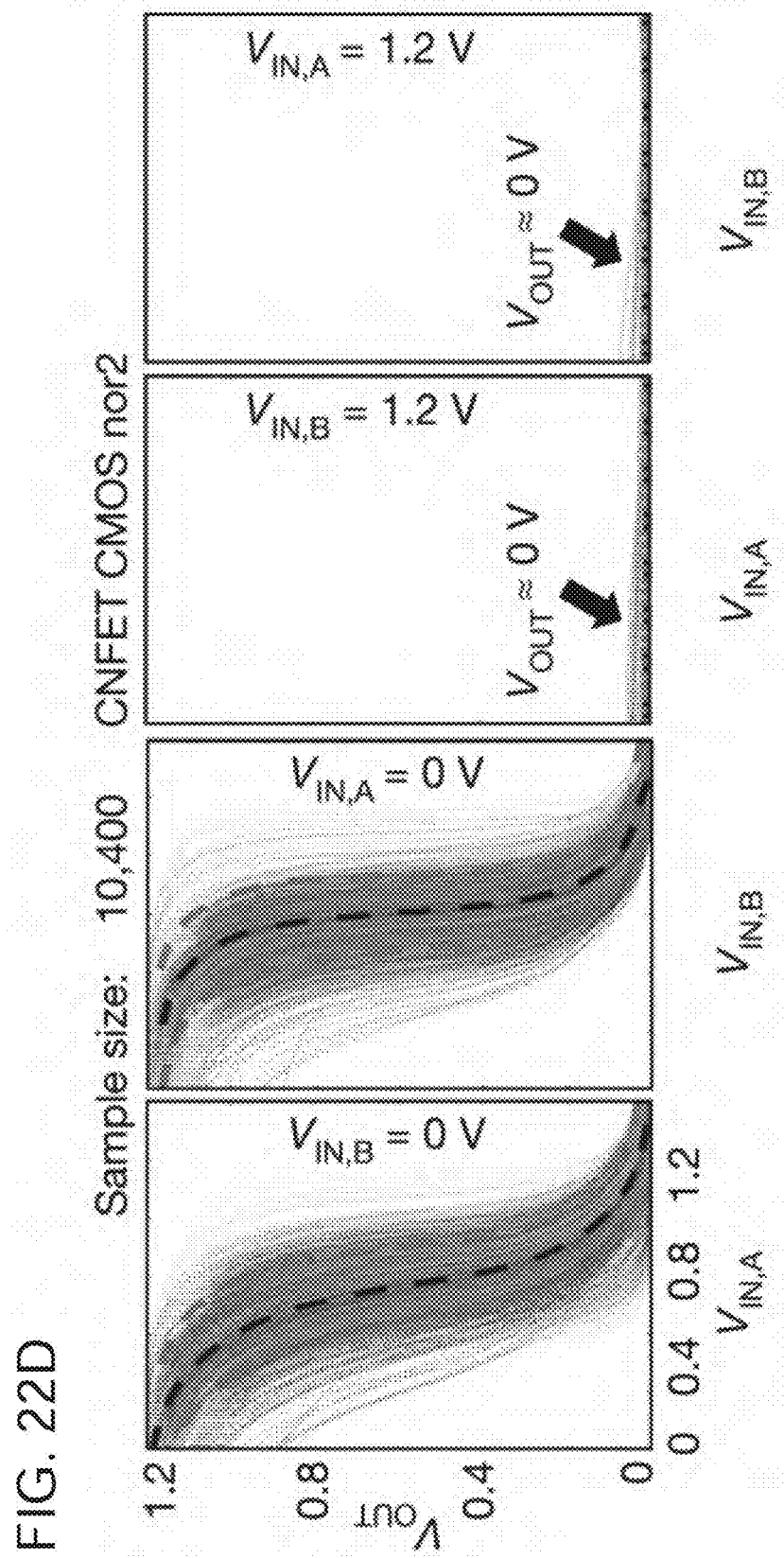

FIG. 22D illustrates output voltage transfer curves (VTCs, $V_{OUT}$ versus $V_{IN}$) for all 10,400 CNT CMOS logic gates (nor2) within a single die of FIG. 22B. Each VTC illustrates $V_{OUT}$ as a function of the input voltage of one input ($V_{IN}$), while the other input is held constant. For each nor2 logic gate (with logical function OUT=!($IN_A|IN_B$), the VTC is measured for each of two cases: $V_{OUT}$ versus $V_{IN,A}$ with $V_{IN,B}=0$ V and $V_{OUT}$ versus $V_{IN,B}$ with $V_{IN,A}=0$ V). All 10,400/10,400 exhibit correct functionality (defined as having output voltage swing >70%). The middle dotted line represents the average VTC (average $V_{IN}$ across all measured VTC for each value of $V_{OUT}$), while the outer dotted lines represent the boundary of ±3 standard deviations (again, across all $V_{IN}$ values for each value of $V_{OUT}$). See Example 4 for extracted distributions of key metrics from these experimental measurements (gain, output voltage swing and SNM analyzing >100 million possible cascaded logic gates pairs formed from these 10,400 samples), as well as uniformity characterization across the 150-mm wafer. Despite the high yield and robust CNFET CMOS enabled by MIXED and RINSE, there are outlier gates with degraded output swing (the outermost lines). These outliers are caused by CNT CMOS logic gates that contain metallic CNTs; the third component of the manufacturing methodology (DREAM), is a design technique for overcoming the presence of these metallic CNTs.

Figure 23A:
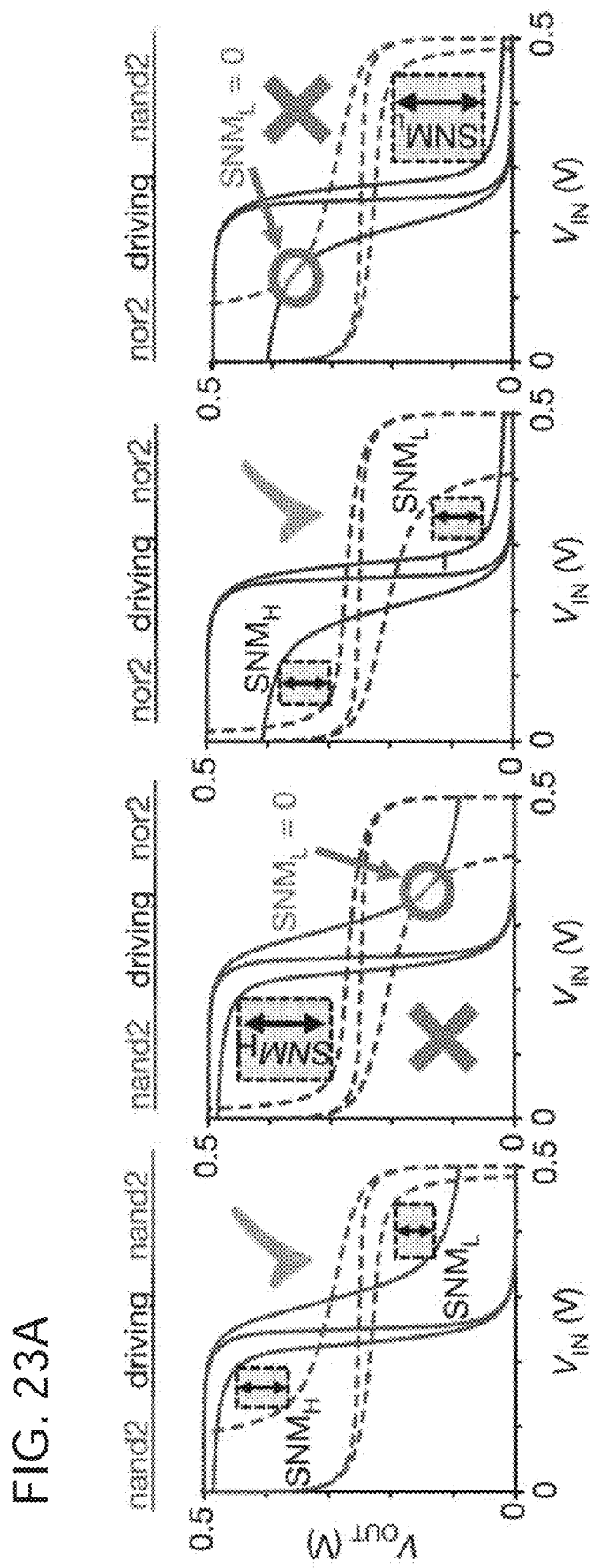

FIG. 23A illustrates, for DREAM, VTCs for driving logic stages and mirrored VTCs for loading logic stages, showing SNM simulated for 4 different logic stage pairs, with up to two metallic CNTs in all CNFETs. The logic stage pairs: (nand2, nand2) and (nor2, nor2) have lower SNMs than do (nand2, nor2) and (nor2, nand2) despite all logic stages having exactly the same VTCs. Logic stages (for example, an inverter) are distinguishable from logic gates (for example, a buffer, by cascading two inverters), where a logic gate can include multiple logic stages. Generally, DREAM overcomes the presence of metallic CNTs through circuit design, and is one component of the manufacturing methodology. DREAM relaxes the requirement on metallic CNT purity by about 10,000×, without imposing any additional processing steps or redundancy. DREAM is implemented using standard EDA tools, has minimal cost (≤10% energy, ≤10% delay and ≤20% area), and enables digital VLSI systems with CNT purities that are available commercially today (e.g., 99.99% semiconducting CNT purity).

Figures 23B, 23C:
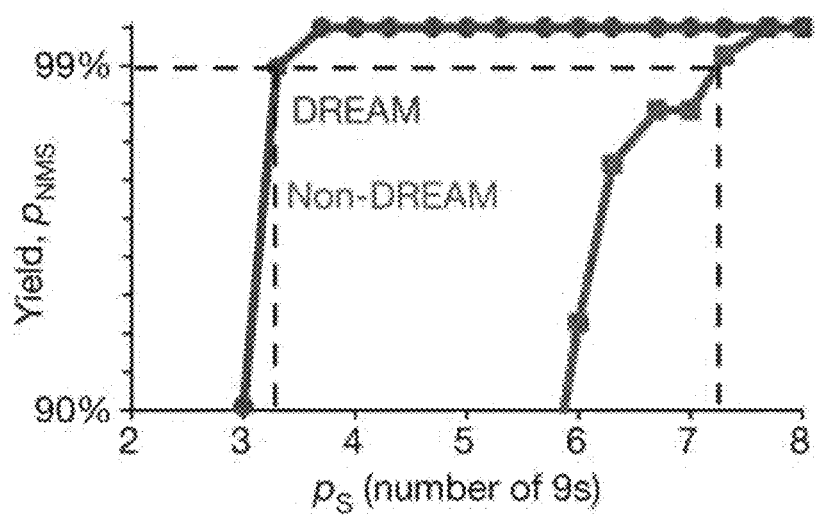

FIG. 23B is an example DREAM SNM table (analyzed for a projected 7-nm node with a scaled VDD of 500 mV), which shows the minimum SNM for each pair of connected logic stages. As an example, values less than 83 mV are highlighted and indicate that these combinations would not be permitted during design, to reduce overall susceptibility to noise at the VLSI circuit level.

FIG. 23C illustrates yield ($p_{NMS}$) versus semiconducting CNT purity for a required SNM level ($SNM_R$) of $SNM_R=V_{DD}/5$, shown for the OpenSparc 'dec' module designed using the 7-nm node CNFET standard library cells derived from the ASAP7 process design kit with a scaled VDD of 500 mV.

Figure 23D:
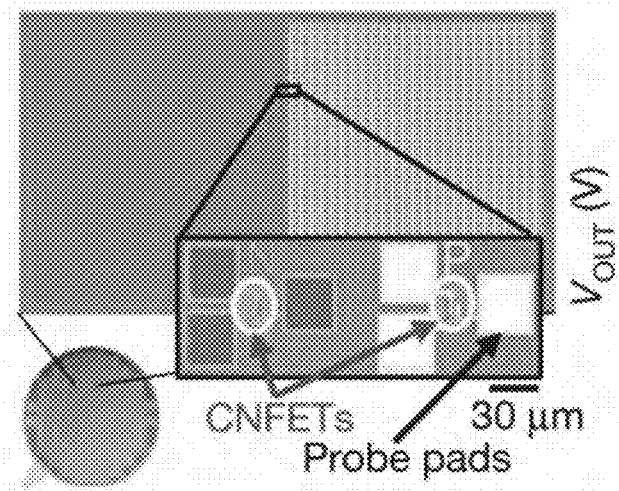

FIG. 23D shows a fabricated CNT CMOS die including 1,000 NMOS CNFETs and 1,000 PMOS CNFETs. Semiconducting CNT purity is ps≈99.99%, with around 15-25 CNTs per CNFET.

Figure 23E:
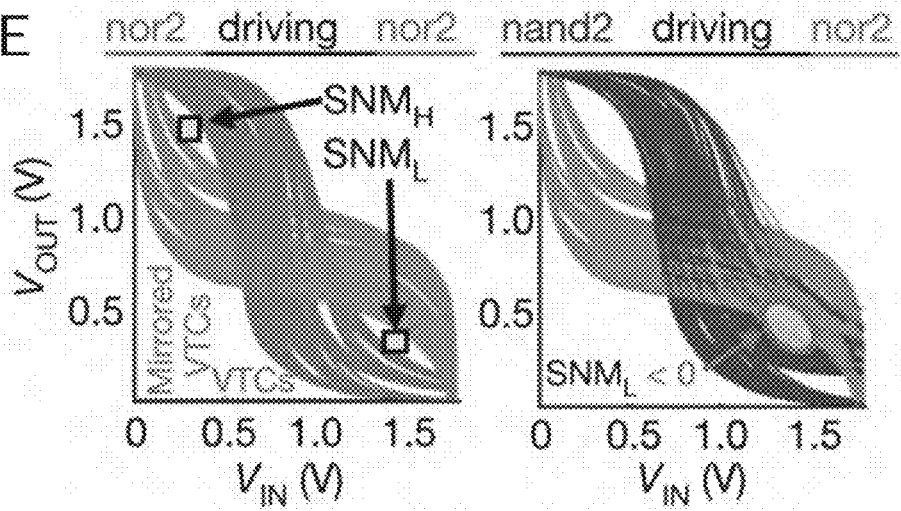

FIG. 23E illustrates VTCs for nand2 and nor2 generated by randomly selecting two NMOS and two PMOS CNFETs from FIG. 23D (some of which contain metallic CNTs). This is repeated to form 1,000 unique nor2 (left panel) and nand2 (right panel) VTCs. The (nor2, nor2) logic stage pairs maintain minimum SNM>0, while the (nand2, nor2) logic stage pairs suffer from minimum SNM<0 in the presence of metallic CNTs; >99.99% of the (nor2, nor2) and (nand2, nand2) logic stage pairs achieve SNM>0 V, while about 97% of the (nand2, nor2) logic stage pairs achieve SNM>0 V.

Figure 23F:
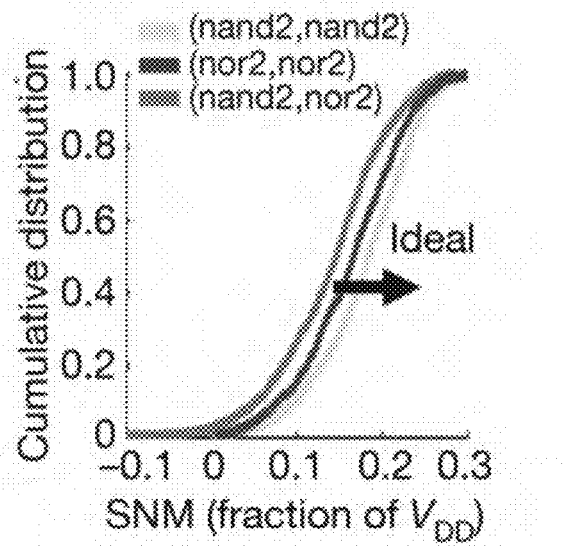

FIG. 23F illustrates cumulative distributions of SNM over one million logic stage pairs. The SNMs for over one million logic stage pairs are analyzed and correspond to all combinations of 1,000 VTCs for the driving logic stage and 1,000 VTCs for the loading logic stage shown in FIG. 23E.

FIGS. 24A-24N illustrate the fabrication process flow for RV16X-NANO. The fabrication process is a 5-metal-layer (M1 to M5) process and involves >100 individual process steps. s-CNT, semiconducting CNT; S/D, source/drain. FIG. 24A illustrates patterning of the first metal layer.

FIG. 24B illustrates deposition of an interlayer dielectric.

FIG. 24C illustrates patterning and etching of vias.

FIG. 24D illustrates bottom gate formation.

FIG. 24E illustrates atomic layer deposition of the gate dielectric.

FIG. 24F illustrates additional etching of vias.

FIG. 24G illustrates CNT deposition.

FIG. 24H illustrates etching to remove CNTs outside the CNFET.

FIG. 24I illustrates PMOS source and drain formation via metal layer deposition.

FIG. 24J illustrates passivation via SiO$_2$ deposition.

FIG. 24K illustrates NMOS source and drain formation via metal layer deposition.

FIG. 24L illustrates deposition of a nonstoichiometric doping oxide (NDO).

FIG. 24M illustrates additional etching of vias and removal of the NDO over the PMOS CNFET.

FIG. 24N illustrates formation of terminals for power distribution.

Figure 25:
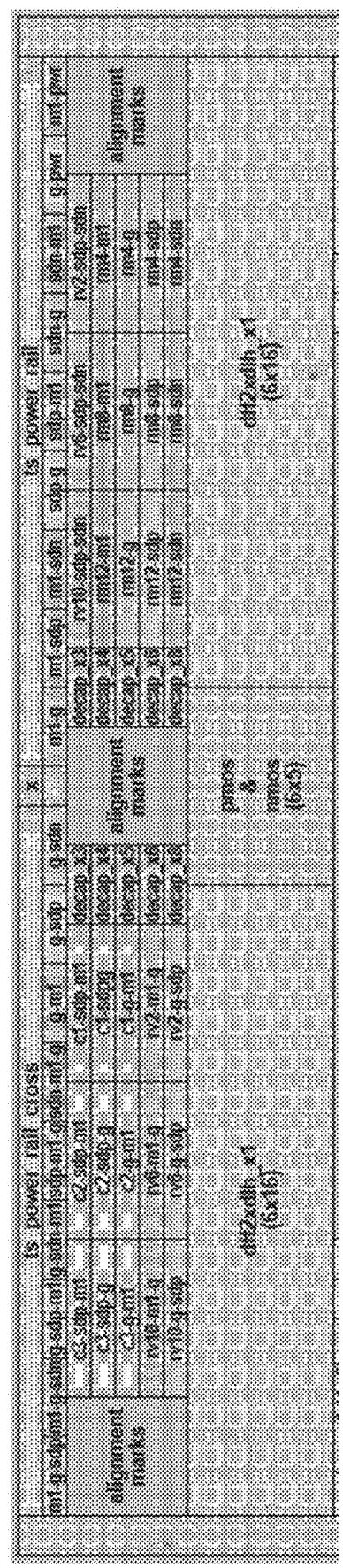

FIG. 25 is a microscopy image of a full fabricated RV16X-NANO die. The processor core is in the middle of the die, with test circuitry surrounding the perimeter (when the RV16X-NANO is diced for packaging, these test structures are removed). The test structures include test structures for monitoring fabrication, as well as for measuring and characterizing all of the 63 standard cells in the standard cell library of FIG. 26.

Figure 26:
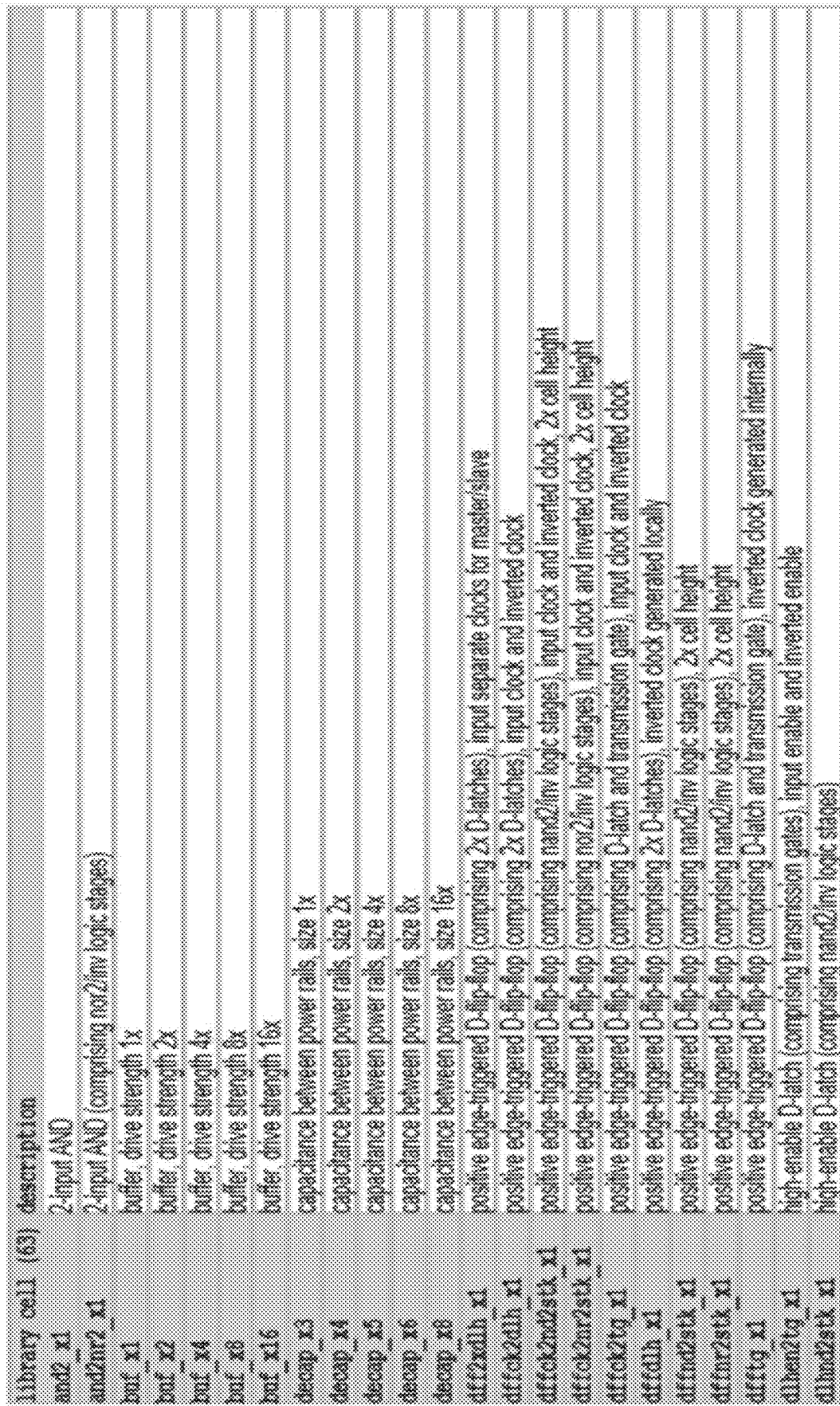

FIG. 26 illustrates a CNFET standard cell library. This is a list of all of the standard cells in a standard cell library as disclosed herein, along with a microscopy image of each fabricated standard cell, the schematic of each cell, and a typical measured waveform from each fabricated cell. As expected for static CMOS logic stages, the CNFET logic stages exhibit output voltage swing exceeding 99% of VDD, and achieve gain of >15. Experimental waveforms are not shown for cells whose functionality is not demonstrated by output voltage as a function of either input voltage or time; for example, for cells without outputs (for example, fill cells: cell names that start with 'fill_' or decap cells: cell names that start with 'decap_'), for cells whose output is constant (tied high/low: cell names that start with 'tie_'), or for transmission gates (cell names that start with 'tg_').

Figure 27:
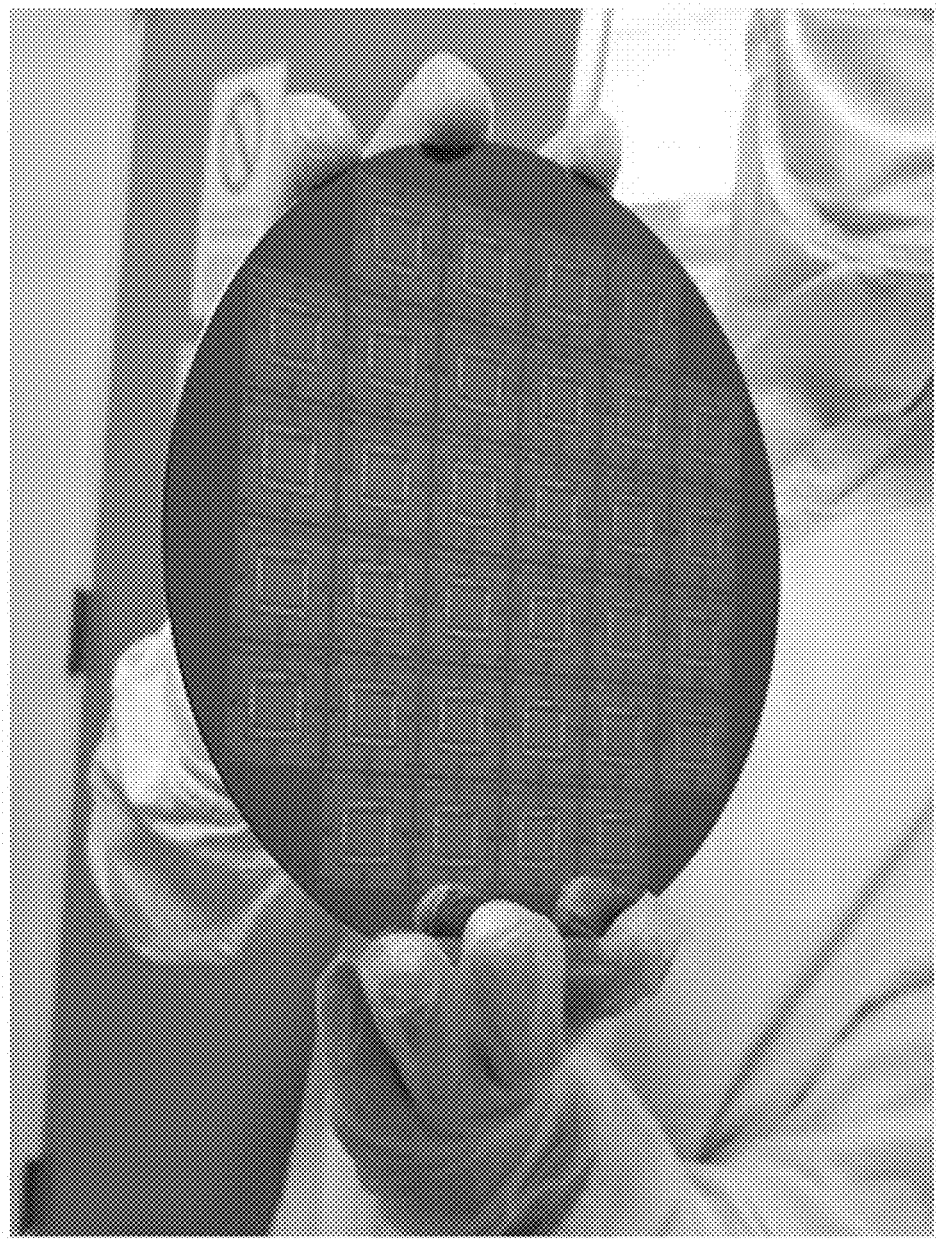

FIG. 27 is an image of a completed RV16X-NANO 150-mm wafer. Each wafer includes 32 dies.

Figure 28A:
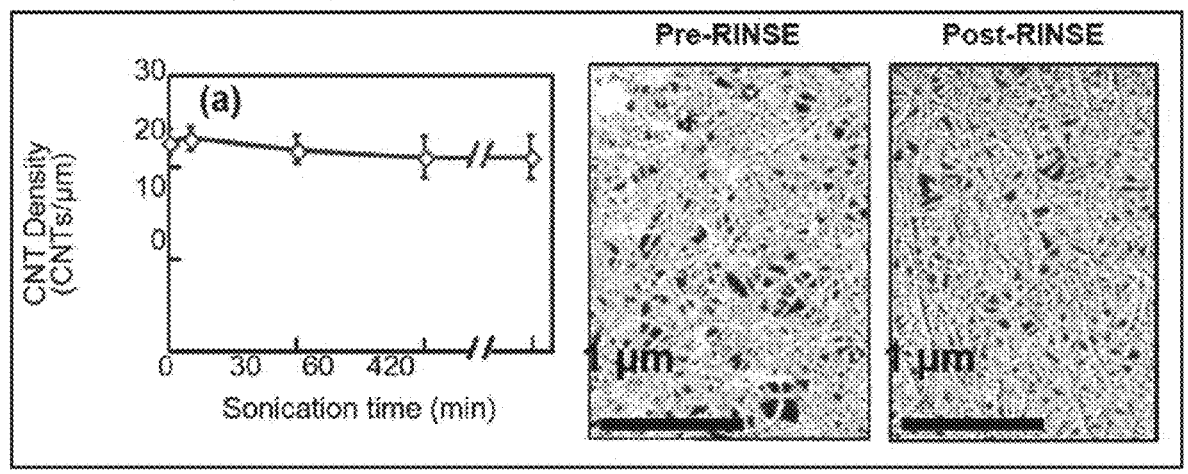

FIG. 28A illustrates the negligible effect of RINSE on CNTs and CNFETs, and that CNT density is the same pre- versus post-RINSE.

Figure 28B:
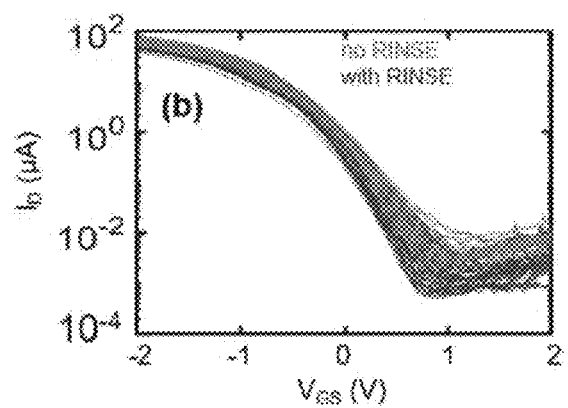

FIG. 28B illustrates how the CNFET $I_D$-$V_{GS}$ curve exhibit minimal change for sets of CNFETs fabricated with and without RINSE ($V_{DS}$=−1.8 V for all measurements shown). Both samples came from the same wafer, which was diced after the CNT deposition but before the RINSE process. One sample underwent RINSE while the other sample did not.

Figure 28C:
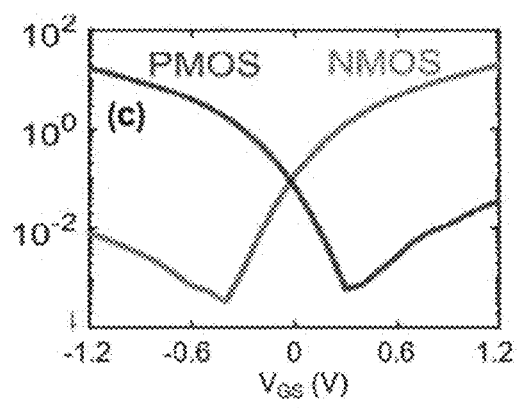

FIG. 28C is a plot illustrating that CNFETs can still be doped NMOS after the RINSE process, leveraging the MIXED process ($V_{DS}$=−1.2 V for all measurements shown).

Figure 29A:
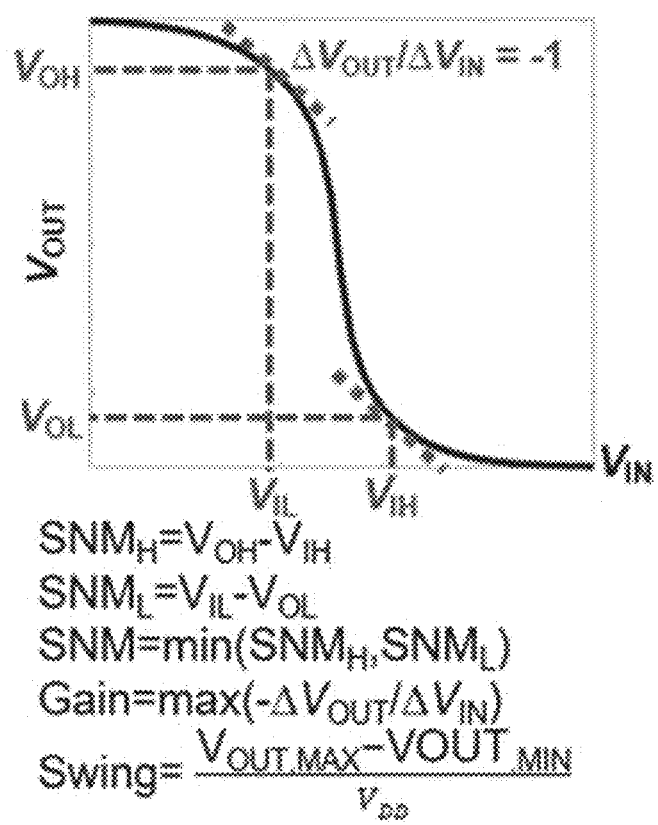

FIG. 29A shows definitions of metrics for characterizing logic gates, including SNM, gain and swing. $V_{OH}$, $V_{IH}$, $V_{IL}$ and $V_{IL}$ (labelled on the VTCs, where ($V_{IL}$, $V_{OH}$) and ($V_{IH}$, $V_{OL}$) are the points on the VTC where $\Delta V_{OUT}/\Delta V_{IN}$=−1) are used to extract the noise margin: SNM=min($SNM_H$, $SNM_L$).

Figure 29B:
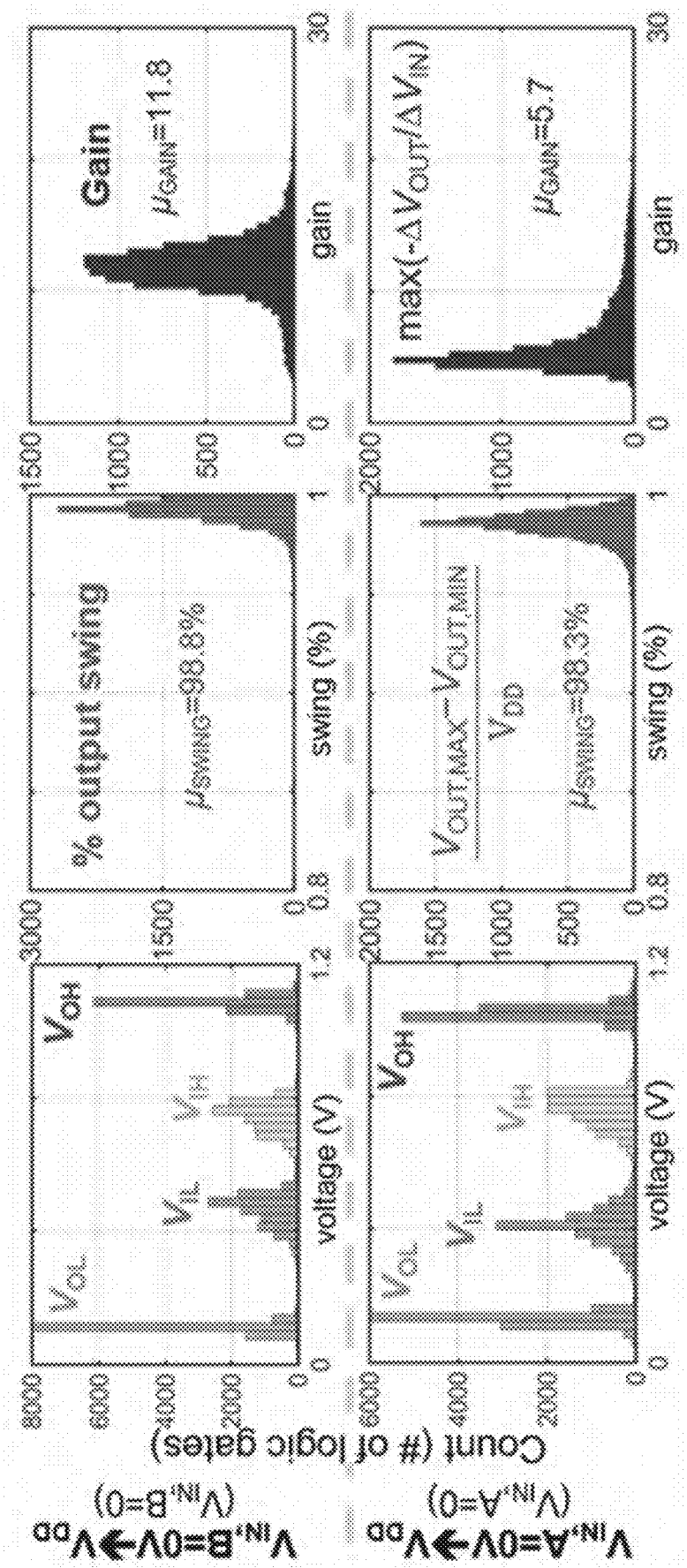

FIG. 29B illustrates metrics (defined in FIG. 29A) extracted for the 10,400 CNFET CMOS nor2 logic gates. $V_{DD}$ is 1.2 V.

Figure 29C:
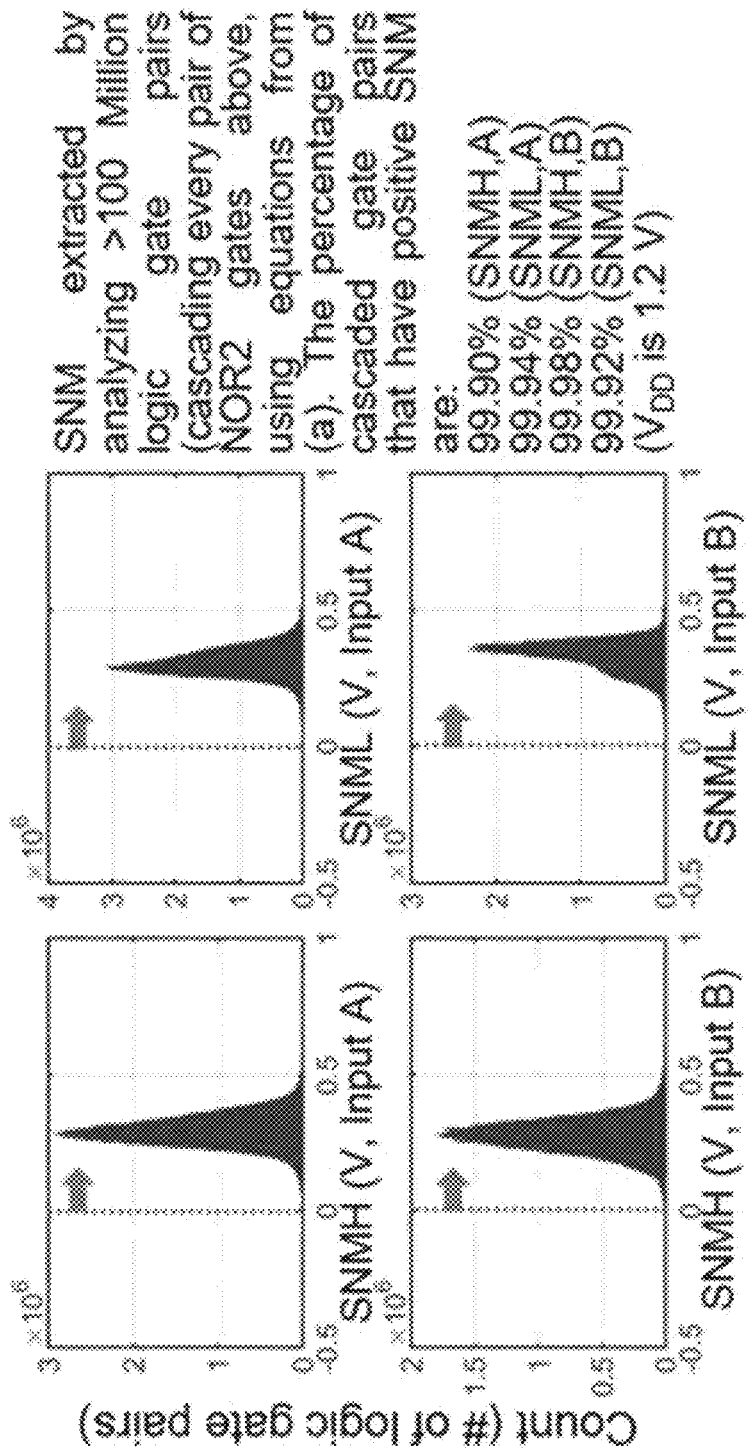

FIG. 29C illustrated SNM extraction based on the distributions from FIG. 29B. >100 million logic gate pairs are analyzed based on these experimental results.

Figure 29D:
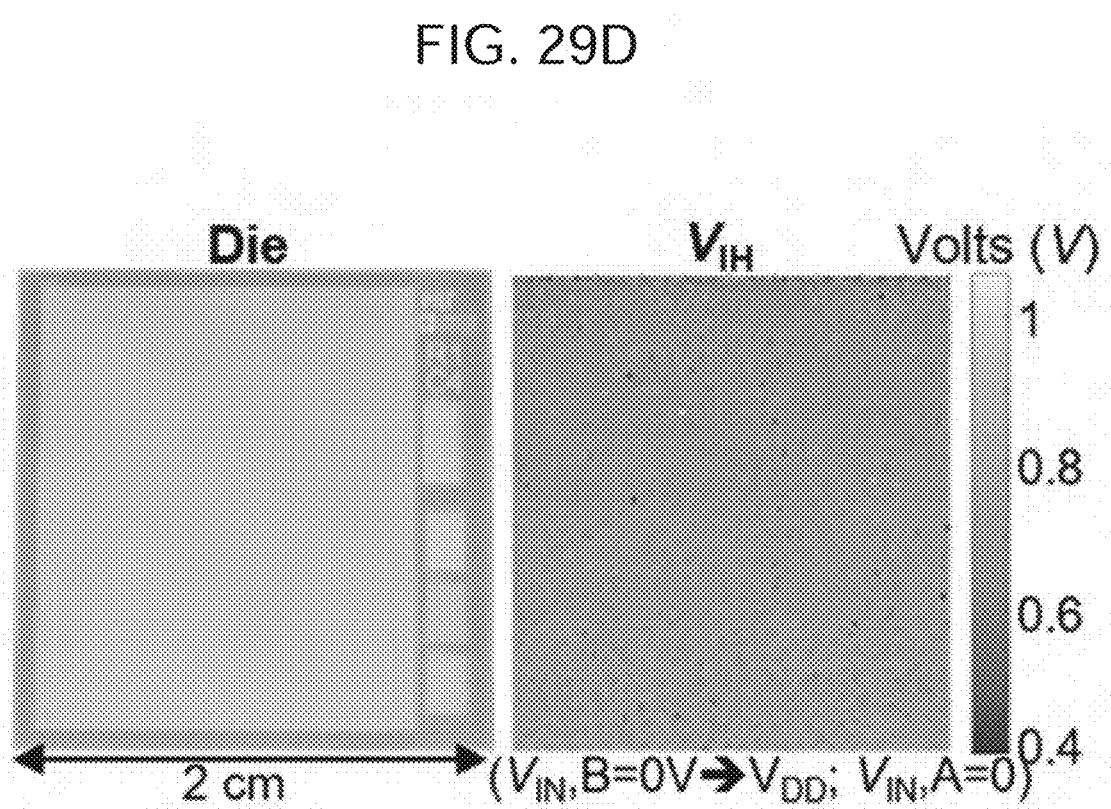

FIG. 29D shows spatial dependence of $V_{IH}$ (as an example parameter to compute SNM). Each pixel represents the VIH of the nor2 at that location in the die. VIH increases across the die (from top to bottom). The change in VIH corresponds with slight changes in CNFET threshold voltage. The fact that the threshold voltage variations are not independently and identically distributed (i.i.d.), but rather have spatial dependence, illustrates that a portion of the threshold voltage variations (and therefore variation in SNM) is due to wafer-level processing-related variations (CNT deposition is more uniform across the 150-mm wafer).

Figure 29E:
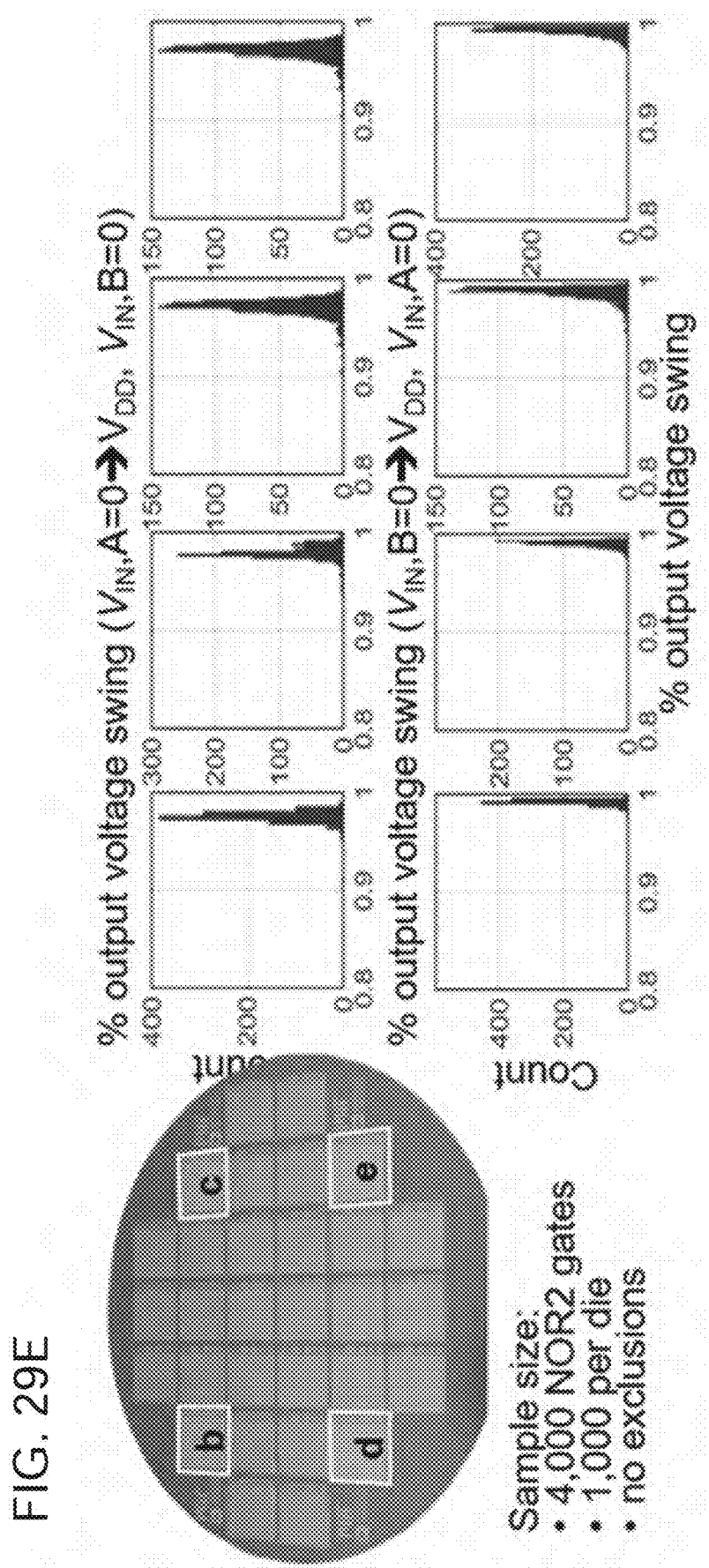

FIG. 29E illustrates wafer-scale CNFET CMOS characterization. Measurements from 4 dies across 150-mm wafer (1,000 CNFET CMOS nor2 logic gates are sampled randomly from the 10,400 such logic gates in each die). No outliers are excluded. Yield and performance variations are negligible across the wafer, as illustrated by the distribution of the output voltage swing.

Figure 30B:
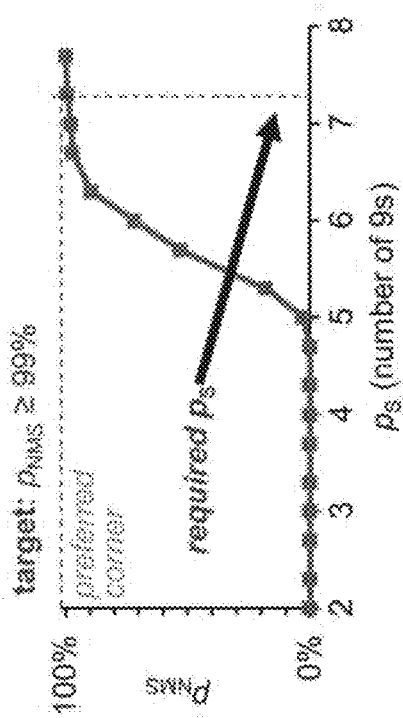
Figure 30A:
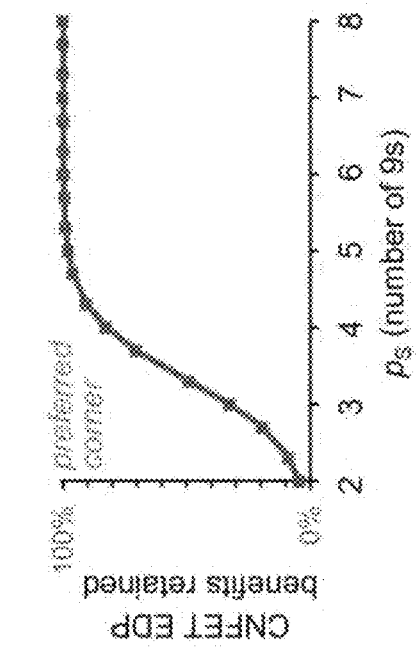

FIG. 30A generally illustrates the effect of metallic CNTs on digital VLSI circuits, and specifically shows reduction in CNFET EDP benefits versus $p_S$ (metallic CNTs increase $I_{OFF}$, degrading EDP). $p_S$≈99.999%, sufficient to minimize EDP cost due to metallic CNTs to ≤5%. Results are simulated for VLSI circuit modules from a 7-nm node processor core.

FIG. 30B illustrates, $p_{NMS}$ versus $p_S$ (metallic CNTs degrade SNM), (shown for $SNM_R$=$V_{DD}$/5, and for a circuit of one million logic gates). Although 99.999% $p_S$ is sufficient to limit EDP degradation to ≤5%, this plot shows that SNM imposes stricter requirements on purity: $p_S$≈99.999999% to achieve pNMS≥99%. Results are simulated for VLSI circuit modules from a 7-nm node processor core.

FIG. 31A generally shows a methodology to solve VTCs using CNFET I-V measurements, and specifically illustrates experimentally measured 1D versus VGS for all 1,000 NMOS ($V_{DS}$=1.8 V) and 1,000 PMOS CNFETs ($V_{DS}$=−1.8 V), with no CNFETs omitted. Metallic CNTs (m-CNTs) present in some CNFETs result in high off-state leakage current ($I_{OFF}$=$I_D$ at $V_{GS}$=0 V). CNFETs are fabricated at a ~1 µm technology node, and the CNFET width is 19 µm.

FIG. 31B shows VTC and SNM parameter definitions, for example, for (nand2, nor2). DR is the driving logic stage; LD is the loading logic stage. SNM=min($SNM_H$, $SNM_L$), where $SNM_H$=$V_{OH}$(DR)−$V_{IH}$(LD) and $SNM_L$=$V_{IL}$(LD)−$V_{OL}$(DR).

Figure 31C:
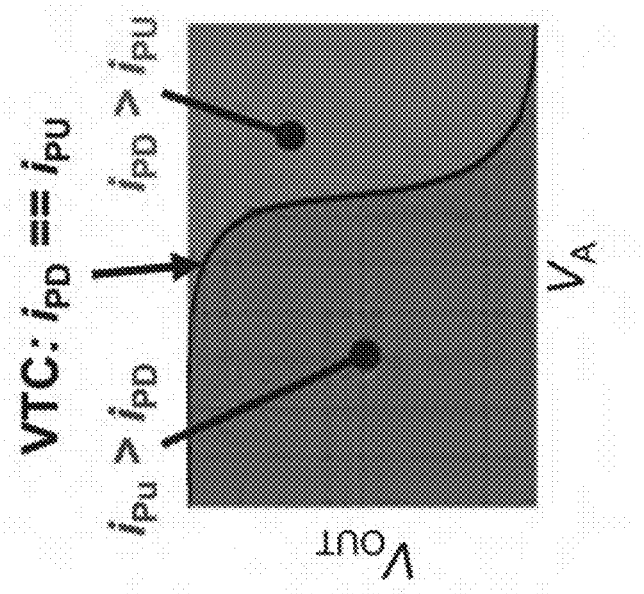

FIG. 31C illustrates example $I_D$ versus $V_{DS}$ for NMOS and PMOS CNFETs ($V_{GS}$ is swept from −1.8 V to 1.8 V in 0.1-V increments).

Figure 31D:
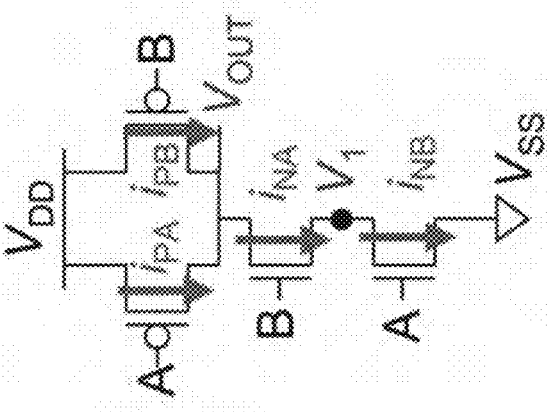

FIG. 31D is a circuit schematic to solve a VTC (for example, $V_{OUT}$ versus $V_A$ with $V_B$=$V_{DD}$): for each $V_A$, find $V_1$ and $V_{OUT}$ such that $i_{PA}$+$i_{PB}$=$i_{NA}$=$i_{NB}$ (DC, direct current, convergence).

Figure 31E:
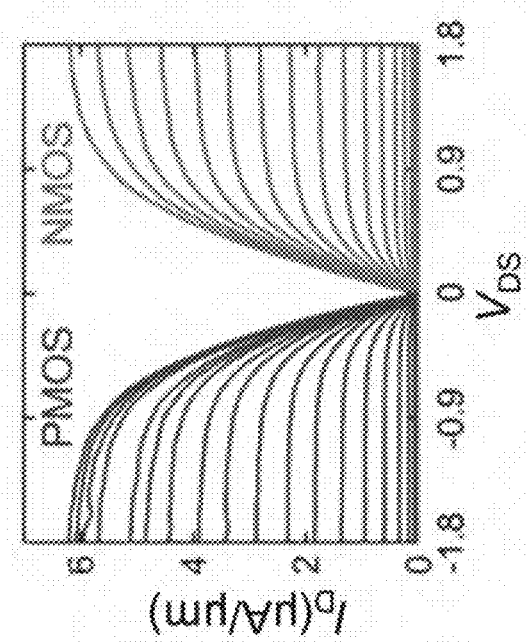

FIG. 31E illustrates current in the pull-up network ($i_{PU}$, where $i_{PU}$=$i_{PA}$+$i_{PB}$, and $i_{PA}$ and $i_{PB}$ are the labelled drain currents of the PMOS FETs gated by A and B, respectively) and current in the pull-down network ($i_{PD}$, where $i_{PD}$=$i_{NA}$=$i_{NB}$, and $i_{NA}$ and $i_{NB}$ are the labelled drain currents of the NMOS FETs gated by A and B, respectively) versus $V_{OUT}$ and $V_A$. The VTC is seen where these currents intersect.

Figure 32A:
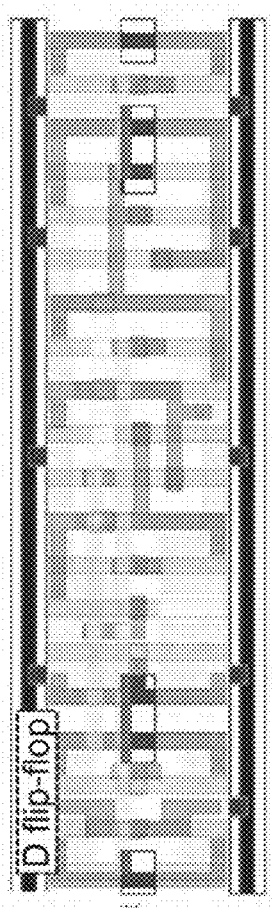

FIG. 32A generally illustrates DREAM implementation and methodology, and specifically shows standard cell layouts (derived using the 'asap7sc7p5t' standard cell library), illustrating the importance of CNT correlation: because the length of CNTs (which can be of the order of hundreds of micrometers) is typically much longer compared with the CNFET contacted gate pitch (CGP, for example about 42-54 nm for a 7-nm node), the number of s-CNTs and m-CNTs in CNFETs can be uncorrelated or highly correlated depending on the relative physical placement of CNFET active regions. For many CMOS standard cell libraries at sub-10-nm nodes, the active regions of FETs are highly aligned, resulting in highly correlated number of m-CNTs among CNFETs in library cells, further degrading VTCs (because one m-CNT can affect multiple CNFETs simultaneously).

Figure 32B:
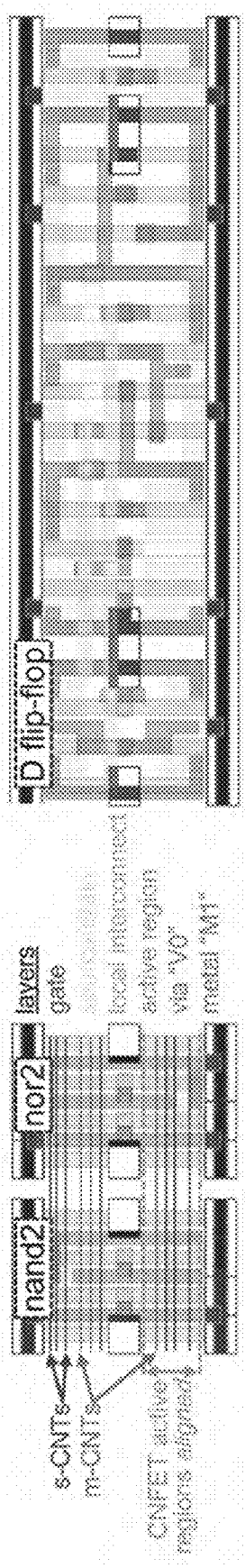

FIG. 32B generally illustrates how to generate a variation-aware CNFET SNM model, shown for a D-flip-flop (dff) derived from the asap7sc7p5t standard cell library. Specifically, shown is a layout used to extract netlists for each logic stage.

Figure 32C:
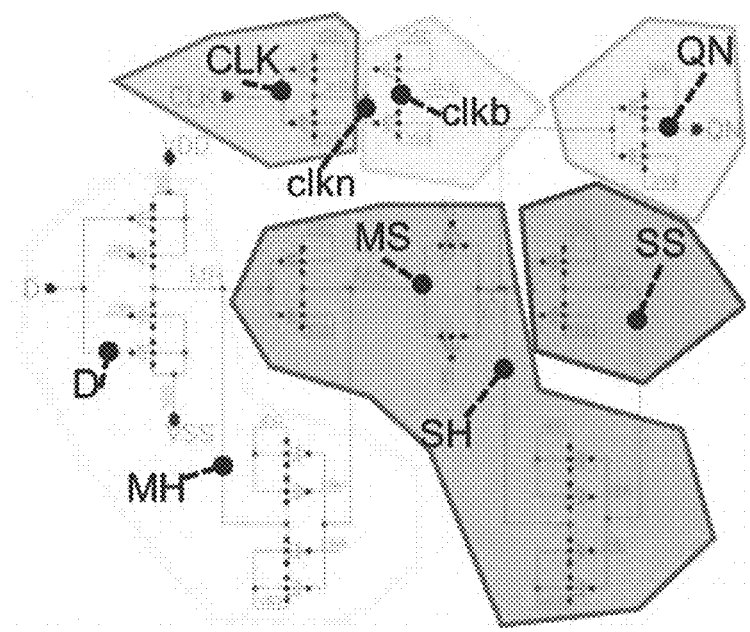

FIG. 32C is a schematic illustrating how CNFETs are grouped by logic stage (with nodes arbitrarily labelled 'D', 'MH', 'MS', 'SH', 'SS', 'CLK', 'clkn', 'clkb' and 'QN' for ease of reference).

Figure 32D:
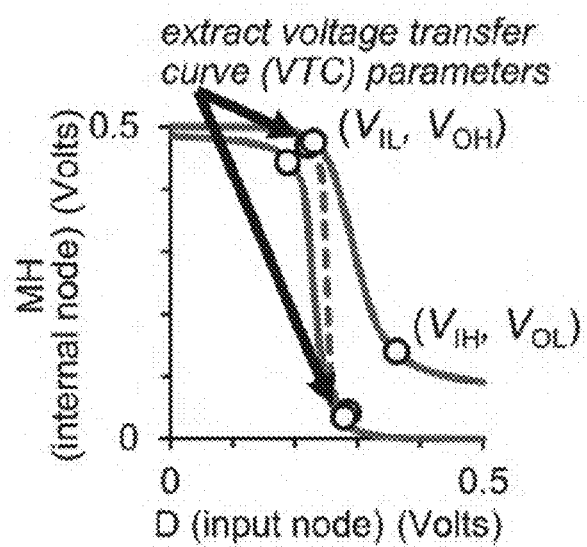

FIG. 32D shows that for each extracted netlist, there can be multiple VTCs: for each logic stage output, a logic stage input is sensitized if the output state (0 or 1) depends on the state of that input (given the states of all the other inputs).

For example, for a logic stage with Boolean function: Y=!(A*B+C), C is sensitized when (A, B)=(0, 0), (0, 1) or (1, 0). All possible VTCs are simulated (over all logic stage outputs and sensitized inputs), and also in the presence of m-CNTs. For example, FIG. 32D shows a subset of the VTCs for the logic stage in FIG. 32B with output node 'MH' (labelled in FIG. 32C), and sensitized input 'D' (with labelled nodes ('clkb', 'clkn', 'MS')=(0, 1, 0)). The dashed line indicates VTC with no m-CNTs, and the solid lines are example VTCs in the presence of m-CNTs (including the effect of CNT correlation). In each case, VOH, VIH, VIL and VOL are modeled as affine functions of the number of m-CNTs ($M_i$) in each of r regions ($M_1, \ldots, M_r$), with calibration parameters in the static noise margin (SNM) model matrix T (shown in FIG. 32F).

FIG. 32E illustrates an example calibration of the SNM model matrix T for the VTC parameters extracted in FIG. 32D. The symbols are VTC parameters extracted from circuit simulations (using Cadence Spectre), and solid lines are the calibrated model.

FIG. 32F illustrates the Affine model form used to compute SNM in the presence of metallic carbon nanotubes (m-CNTs).

Figure 32G:
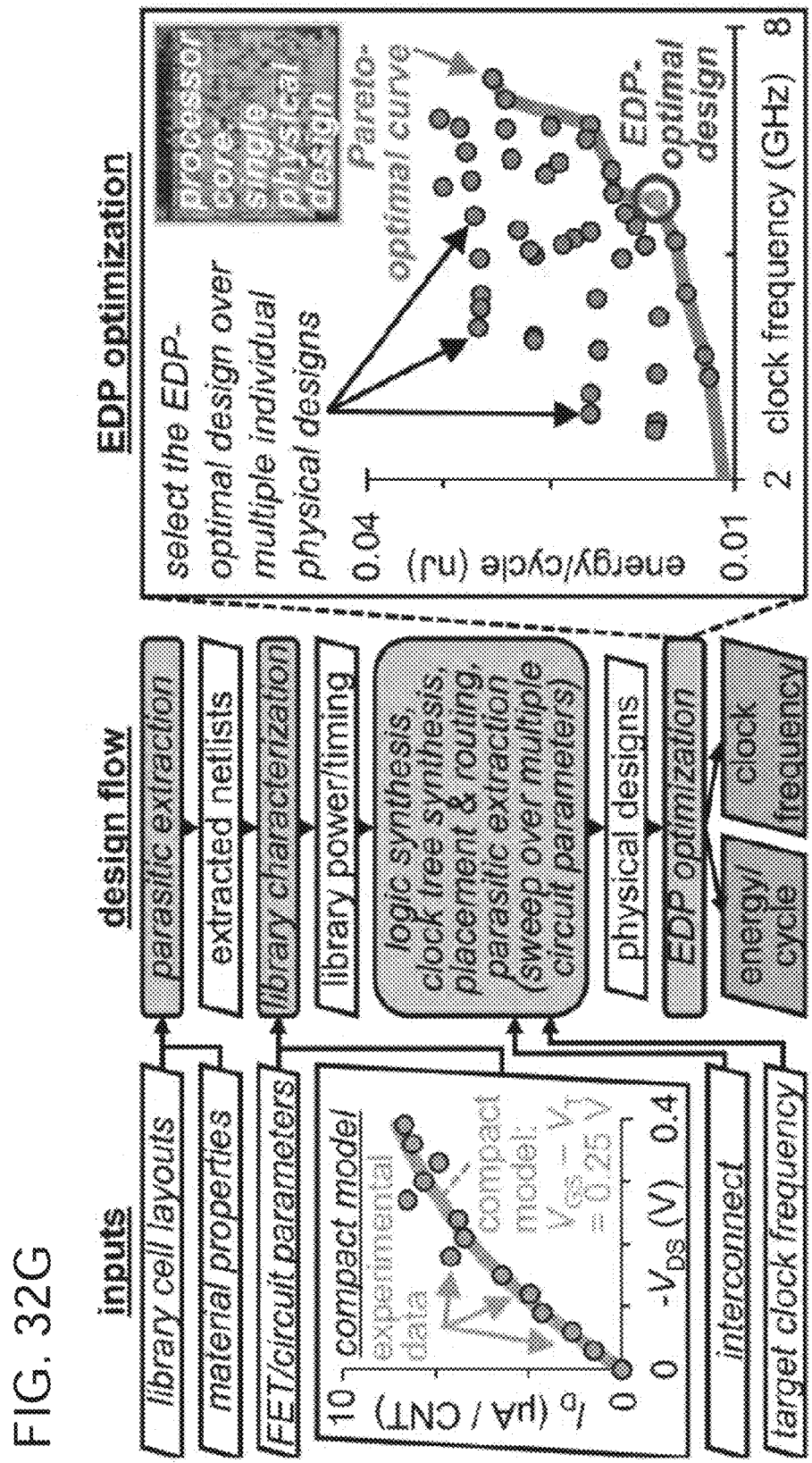

FIG. 32G illustrates design flow to optimize energy and delay of CNFET digital VLSI circuits, including: (1) library power/timing characterization (using Cadence Liberate) across multiple VDD and using parasitics extracted from standard cell layouts (derived from the asap7sc7p5t standard cell library), in conjunction with a CNFET compact model; (2) Synthesis (using Cadence Genus), place-and-route (using Cadence Innovus) with back-end-of-line (BEOL) wire parasitics from the ASAP7 process design kit (PDK); (3) Circuit EDP optimization: both VDD and target clock frequency are swept (during synthesis/place-and-route) to create multiple physical designs. The one with best EDP is used to compare design options (for example, DREAM versus baseline).

Figure 32H:
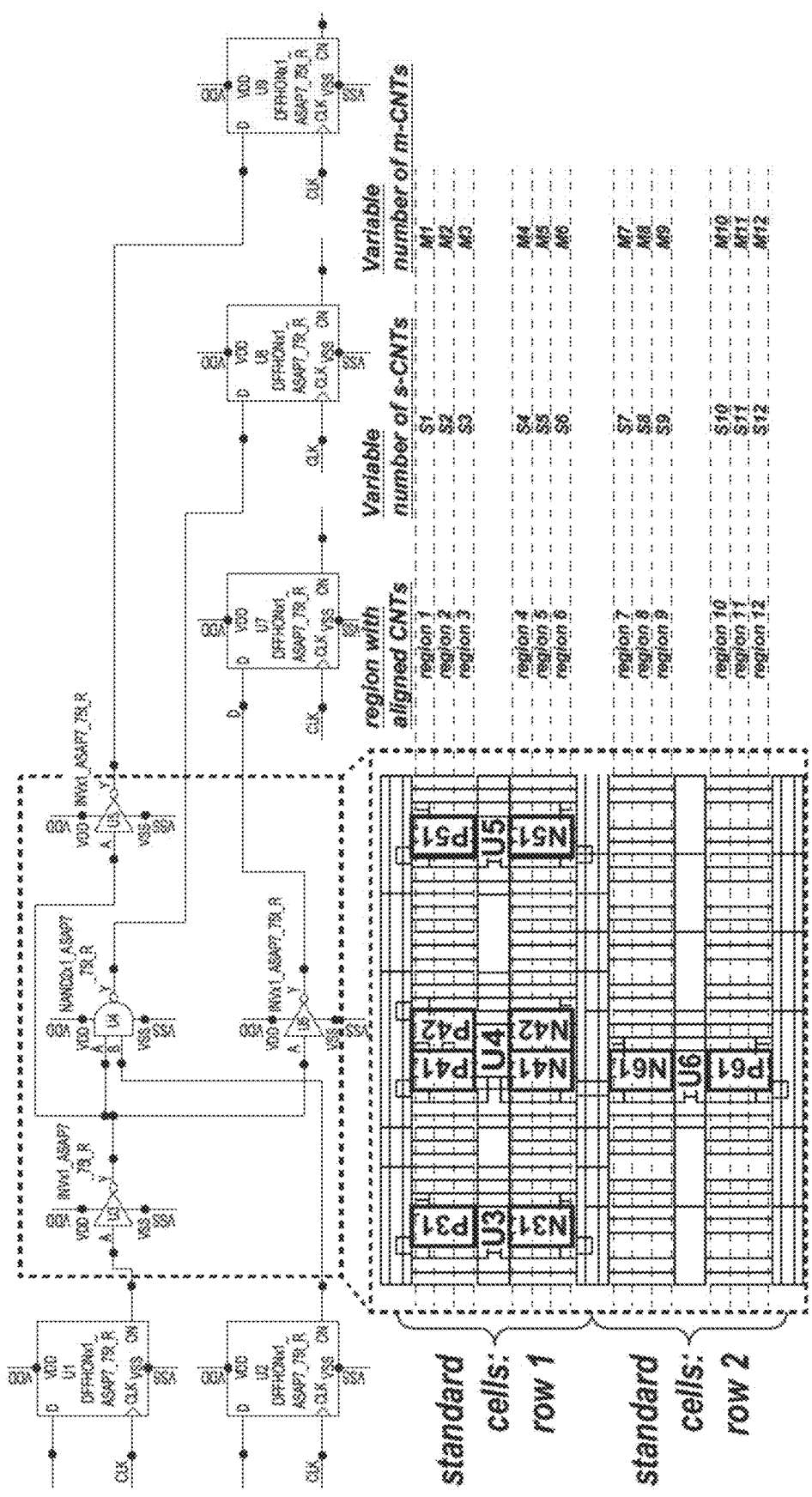

FIG. 32H illustrates a subset of logic gates in an example circuit module, showing the effect of CNT correlation at the circuit level (for example, the m-CNT counts of CNFETs $P_{3,1}$ and $P_{5,1}$ are both equal to $M_1+M_2+M_3$).

FIG. 32I illustrates distribution of SNM over all connected logic stage pairs, for a single sample of the circuit m-CNT counts. The minimum SNM for each trial limits the probability that all noise margin constraints in the circuit are satisfied ($p_{NMS}$).

FIG. 32J illustrates cumulative distribution of minimum SNM over 10,000 Monte Carlo trials, shown for multiple target $p_S$ values, where $p_S$ is the probability that a given CNT is a semiconducting CNT. These results are used to find $p_{NMS}$ versus $p_S$ for a target SNM requirement ($SNM_R$), where $p_{NMS}$ is the fraction of trials that meet the SNM requirement for all logic stage pairs. Note that $p_{NMS}$ can then be exponentiated to adjust for various circuit sizes based on the number of logic gates.

FIG. 32K illustrates CNFET compact model parameters (for example, for a 7-nm node).

FIG. 33 illustrates details of implementing RISC-V instruction set architecture. The top panel shows all supported instructions implemented in RV16X-NANO, adhering to RISC-V format specifications for RV32E, with high-level description summary for each. Each instruction is categorized into one of six formats, including instruction type (R-type, I-type, S-type, U-type) and immediate variant (I-immediate, U-immediate, B-immediate, J-immediate, S-immediate), forming one of six formats (type immediate): R, I-I, I-U, S-B, S-S, U-J (shown in the bottom panel). For the assembly code, 'rd' is the destination register, 'rs1' is the source register 1, 'rs2' is the source register 2, 'imm' is immediate. The bottom panel shows the bit-level description of each instruction format. The bottom 7 bits (inst[6:0]) are always the OPCODE, and then the remaining bits are decoded depending on the instruction format (determined by the OPCODE). Values that are crossed out indicate bits that are not used for the 16-bit data path implementation (RV16E) with four registers, instead of 32-bit data path implementation (RV32E) with 16 registers. For example, for instruction 'auipc', only 2 of the 5 reserved bits for 'rd' are required to address the register file for register 'rd' (because there are only $2^2=4$ registers instead of $2^5=32$), and also the upper 16 bits of the 32-bit immediate (that is, imm[31:16]) are not used because the data path is truncated to 16 bits.

DETAILED DESCRIPTION

Conventional CNT deposition processes result in CNT bundles (bundles of CNTs are sometimes referred to as "CNT aggregates"), resulting in prohibitive particle contamination and reduced CNFET yield. Disclosed and demonstrated herein is a new technique, called RINSE (Removal of Incubated Nanotubes through Selective Exfoliation), that reduces CNT aggregate density by >250× without affecting CNT deposition or CNFET performance. In RINSE, CNTs are deposited on a substrate, coated with a thin adhesive layer, and sonicated. The adhesive layer is strong enough to keep the individual CNTs on the substrate, but not the larger CNT aggregates. While the sonication removes a significant portion of the adhesive layer, although a residual adhesive layer can remain. This residual layer can aid in maintaining adherence of the deposited CNTs on the substrate. RINSE can be used to deposit other "solution-processed" nanomaterials, i.e., materials that are spin-coated, ink-jet printed, or dropped onto wafer surface, including 2D materials (e.g., graphene), and/or to remove dust or other aggregates in silicon processing.

By combining RINSE with a CNT doping process as described herein, high yield and robust wafer scale CNFET CMOS can be achieved. For example, entire dies with 10,400 CNFET CMOS digital logic gates (functional yield 10,400/10,400 CMOS gates, 41,600 CNFETs) are achievable, and presented herein is the first wafer-level CNFET CMOS uniformity characterization across 150 mm wafers, such as extracting static noise margin by analyzing >100 million possible cascaded logic gate pairs. These methods meet the stringent contamination levels required inside silicon HVM facilities, leverages conventional materials and processing techniques available within silicon HVM facilities, and can realize high yields for thousands of CNFET CMOS digital logic gates.

RINSE: Removal of Incubated Nanotubes through Selective Exfoliation

Figure 2:
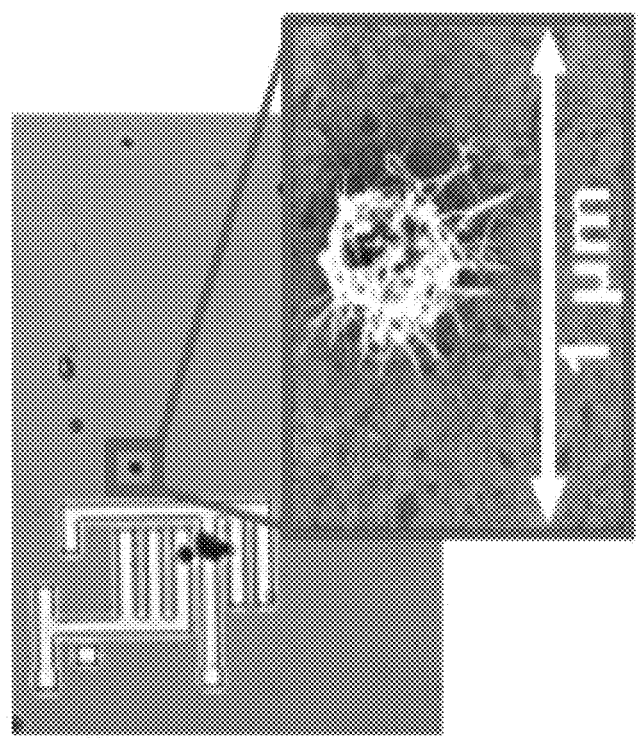
FIG. 2 illustrates CNFETs whose yield is limited by CNT aggregates ("bundles") that deposit on wafers (the bottom SEM image shows a CNT aggregate over a CNT monolayer).
Figure 1:
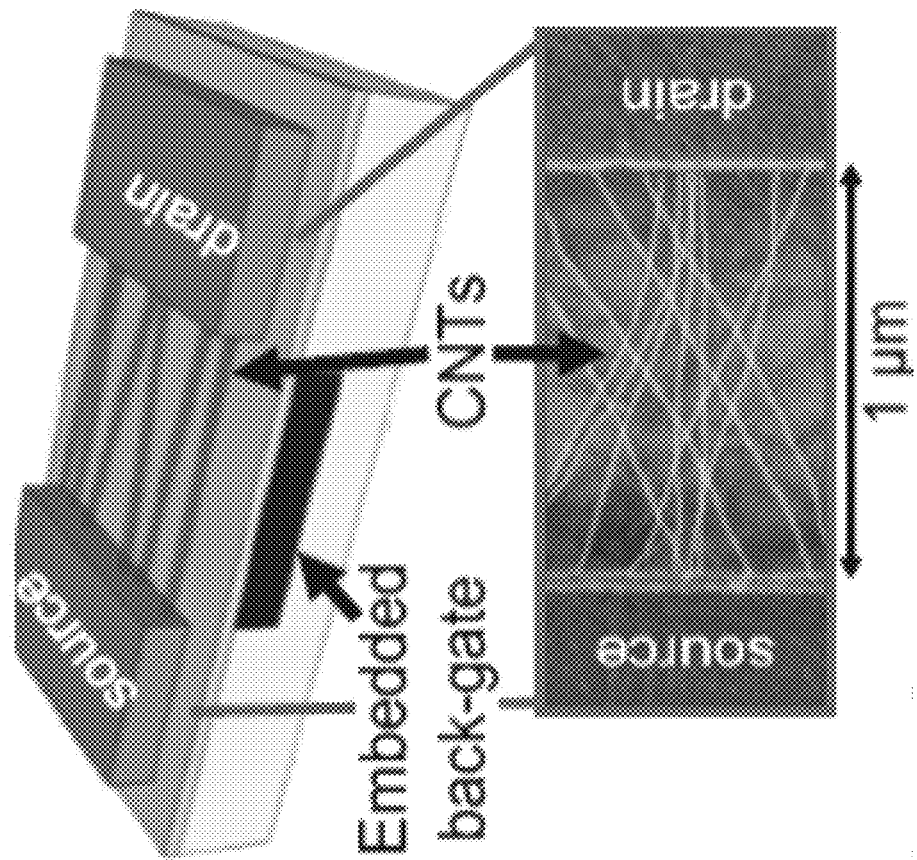
FIG. 1 shows schematic (top) and scanning electron microscope (SEM) (bottom) images of a typical back-gate CNFET.

FIG. 2 shows a wafer for forming CNFETs, on which CNTs have been deposited from solution. As a result, CNT aggregates 210 are inadvertently deposit on the wafer as well, as illustrated. The CNFET yield, or the die yield of such a substrate, is limited by such CNT aggregates 210 ("bundles") that deposit on wafers.

Current techniques for removing these particle contaminants include high-power sonication, centrifugation, and filtering. Unfortunately, these techniques are insufficient for at least four reasons. First, excessive high-power sonication for dispersing aggregates in solution damage CNTs degrades CNFET performance and does not disperse all CNTs. Second, centrifugation does not remove all smaller aggregates, and aggregates can re-form post centrifugation. Third, excessive filtering can remove both aggregates and the CNTs themselves from the solution. Fourth, etching the aggregates is infeasible due to a lack of selectivity relative to the underlying individual CNTs themselves.

Figure 3:
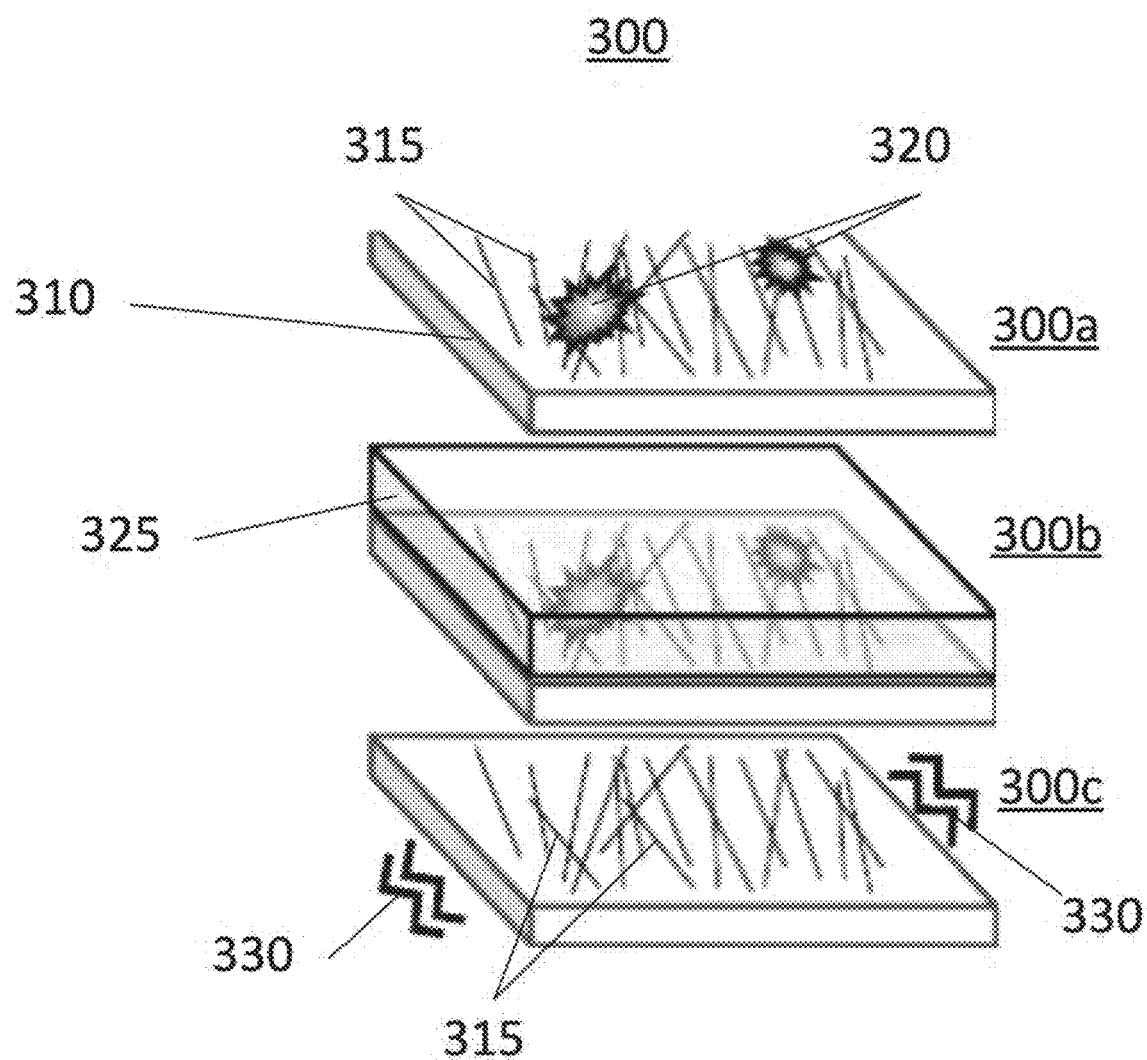
FIG. 3 illustrates an example of the RINSE process: step (1) deposit CNTs; step (2) deposit polydimethyldiglutarimide (PMGI) photoresist and cure; and step (3) sonicate in solvent.

FIG. 3 illustrates a RINSE process/method 300 that can remove CNT aggregates. A first step 300a in the process 300 includes CNT incubation, where individual CNTs (e.g., in solution) are deposited on a substrate/wafer 310 that can be pre-treated with a CNT adhesion promoter (e.g., HMDS, Bis(trimethylsilyl)amine). For example, the pre-treatment can involve exposing the substrate/wafer 310 to HMDS vapor at a reduced pressure, at about 150° C. This results in formation of a monolayer of HMDS on the surface that can aid promote CNT adhesion. This can result in the deposition of desirable, individual CNTs 315, and undesirable CNT aggregates 320 on the substrate 310.

The CNT solution concentration can range from 1 mg/100 mL to 0.01 mg/100 mL (including all values and sub-ranges in between) with a semiconducting CNT purity ranging from 99.9% to 99.99% (including all values and sub-ranges in between). Said another way, when the purity is 99.99%, then 99.99% of CNTs in solution are semiconducting and 0.01% of CNTs in solution are metallic. A higher concentration of CNTs can generally yield faster CNT deposition, and can result in more and/or larger CNT aggregates 320. The CNT solution includes individual CNTs dispersed in an organic solvent such as, for example, xylene or toluene. The CNTs may or may not be wrapped in a selective polymer, i.e., be polymer-wrapped CNTs.

The CNTs can be deposited by submerging/incubating the wafer in the CNT solution for >10 minutes, during which time the CNTs form a uniform film on the wafer. For example, the time duration of immersion of the wafer in the CNT solution can be based on the concentration of the CNT solution (i.e., grams of CNTs per unit volume of solution). More concentrated CNT solutions will require less time to deposit, whereas less concentrated CNT solutions can require more time, e.g., over 48 hours of wafer immersion in the CNT solution, to achieve a desired deposition density. The deposition can be carried out at room temperature, though the use of higher and/or lower temperatures is also possible. Once a desired CNT film/network of deposited CNTs of uniformity and thickness is achieved, the wafer is removed from the CNT solution, rinsed in a solvent such as acetone or IPA (iso-propyl alcohol) to remove any CNT solution that remains on the wafer after the wafer is removed from the CNT solution, and then dried with nitrogen gas. Similar results can be attained through techniques other than incubation such as, for example, spin-coating, dip-coating, and/or the like. For example, CNTs can be deposited onto a wafer by spin coating the CNT solution onto the wafer and allowing the CNT solution to uniformly spread over the wafer during the spinning process. CNTs can also be deposited onto a wafer by dip-coating for example, where the wafer is dipped into bath of CNT solution and removed at a controlled rate while CNTs deposit at the interface where the wafer meets the surface of the CNT solution bath.

The next step 300b in the process 300 can include adhesion coating, where an adhesive layer 325, such as a photoresist material, is spin-coated on the wafer 310 (including on the individual CNTs 315 as well as the CNT aggregates 320) and then cured to evaporate any remaining solvent. The photoresist can include, for example, polymethylglutarimide (PMGI), hexamethyldisilazane (HMDS), SPR, and/or the like. Generally, any suitable positive resist, the exposure of which to UV light will change the chemical properties of the resist so that the resist can be developed, can be used. The curing can be carried out at, for example, about 235° C. for PMGI or about 90° C. for SPR, and can generally be any suitable temperature less than about 400° C. Curing aids in developing the photoresist so that it acts as an adhesion layer. The adhesive layer 325 may have a thickness of about less than 1 nm to about 1.5 μm (e.g., less than about 1 nm for HMDS, about 100-150 nm for PMGI, or about 1-1.5 μm for SPR), including all values and sub-ranges in between.

In this manner, when an adhesion promoter is used as described in relation to step 300a, the layer of adhesion promoter can be considered a first adhesive layer than is useful for promoting CNT adhesion, and the adhesive layer 325 can be considered a second adhesive layer than is useful for maintaining adhesion of the desirable CNTs during exfoliation as described below for step 300c. The first adhesive layer, the second adhesive layer, or both, can be optional in some cases.

The next step 300c in the process 300 can include exfoliation, such as mechanical exfoliation to remove the CNT aggregates 320. While described here with respect to removing the aggregates 320, the exfoliation at step 300c can also remove other undesirable particles, such as nanoparticles, dust, polymer residue, undesirable particle contaminants, and/or the like, that may be present on and/or deposited on the wafer 310, such as during deposition of the CNTs at step 300a.

The wafer 310 is placed in a solvent (e.g., N-Methyl-2-Pyrrolidone (NMP) for PMGI photoresist) and sonicated, as indicated by the sonication waves 330 in FIG. 3, for long enough to remove a portion of the adhesive layer 325. For instance, a wafer 310 with a PMGI adhesive layer 325 may be submerged in an NMP bath (not shown) for one hour at room temperature to remove some portion of the PMGI. Another portion of the adhesive layer 325, e.g., about 1 to 2 nm of PMGI, may be left behind to form a remaining portion (e.g., about 1-2 nm thick, including all values and sub-ranges in between), as indicated by an increase in surface roughness of the CNTs. This remaining portion can act as an adhesive to maintain the desirable, individual CNTs on the water. The wafer with the remaining portion is then sonicated for about 40 minutes to remove the aggregates 320. Generally, the duration of sonication can be about 5 minutes, 10 minutes, 30 minutes, 40 minutes, one hour, or more (including all values and sub-ranges in between), and the degree of removal of the aggregates is relatively greater for a longer duration of sonication. The solvent in the sonicator (not shown) may be filtered and/or circulated to prevent the build-up and dispersion of the aggregates 320 shaken off the wafer 310. Accordingly, the step 300c can sometimes encompass two separate steps or sub-steps, where the first step includes placing the water 310 in the solvent to be submerged for some suitable duration. The second step can then include sonication. In this way, there is a time gap between the first step and the second step during which the water 310 is submerged in the solvent but not sonicated.

Figures 4A, 4B:
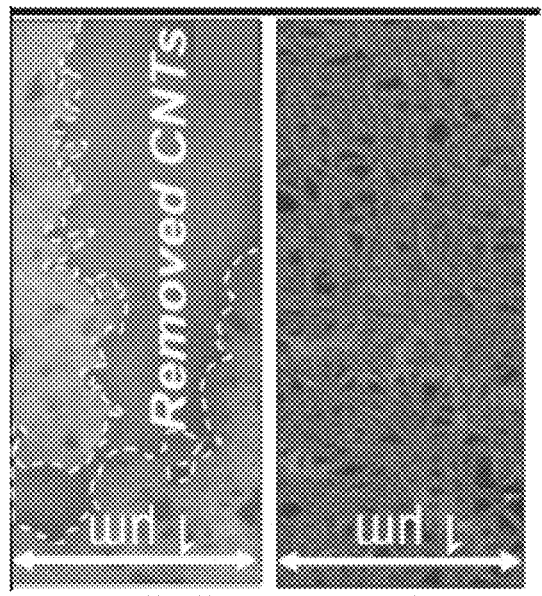
FIG. 4A shows CNFETs made without the adhesion coating in RINSE. Without the adhesion coating, sonicating the wafer removes CNTs.
FIG. 4B shows CNFETs made without the adhesion coating in RINSE. The adhesion coating leaves an atomic layer of carbon that remains after sonication, adhering CNTs to the wafer after removing aggregates.

The adhesion coating/layer 325 deposited in step 300b can prevent the sonication from inadvertently removing desirable sections of individual CNTs 315 in addition to the aggregates 320 (see FIG. 4). Without being bound by any particular theory, the adhesion coating can leave an atomic layer of carbon that remains after step 300c, which exerts sufficient force to adhere the CNTs to the wafer surface while still allowing for the removal of the aggregates.

Experimental results of RINSE are shown in FIGS. 4-6. By optimizing the adhesion coating cure temperature and time as well as the sonication power and time, RINSE can reduce CNT aggregate density by >250× (when quantified by the number of CNT aggregates per unit area) without damaging the desirable CNTs or impacting CNFET performance, as best illustrated in FIG. 5. The reduction in CNT aggregate density can be to fewer than ten CNT aggregates per square millimeter, or to fewer than one CNT aggregate per square millimeter, including all values and sub-ranges in between.

Step 300b can be optional. Specifically, depending on the sonication parameters, the adhesion coating/layer 325 formed in step 300b may not be required. Instead, the substrate 310 can be submerged in a CNT solution for CNT deposition as in step 300a above. Then the substrate would be sonicated as in step 300c, skipping the adhesion coating as in step 300b, with a sonication pulse sequence, sonication frequency, sonication amplitude, and/or sonication medium selected to remove the CNT aggregates without exfoliating the individual CNTs from the substrate. For example, the sonication parameters for step 300c when the adhesion coating is formed at step 300b can include a sonication frequency at 35 kHz at 180 W RF power. If step 300b is not employed, a reduced sonication frequency and/or RF power setting can be used, such as, for example, a sonication frequency below 35 kHz and/or a RF power setting below 180 W.

Further, as described below for FIG. 7 and in even further detail in Example 2, the individual CNTs 315 retained on the wafer 310 can be electrostatically doped to be n-channel CNTs.

Wafer-Scale CNFET CMOS

Leveraging RINSE, FIG. 7 illustrates an example process flow/method 700 for fabricating a wafer-scale CNFET CMOS, and/or any CNT-based logic device generally. At step (1) of the method 700, back-gates 705a, 705b are deposited on a wafer/substrate 710, where both back-gates 705a, 705b can be composed of platinum. At step (2) of the method 700, a dielectric layer 715 is deposited on the substrate 710. The layer 715 can be composed of a nonstoichiometric oxide, such as $HFO_2$. The layer 715 can be deposited via atomic layer deposition (ALD).

At step (3) of the method 700, CNT channels 720a, 720b can be selectively deposited and patterned. Deposition of the CNT channels can be carried out using the RINSE approach as detailed above for FIG. 3. In some cases, steps 300a, 300b, and 300c can be executed for creating the CNT channels 720a, 702b, while in other cases, as noted for FIG. 3, step 300b (depositing an adhesion layer) may be omitted. For example, step (3) of the method 700 can encompass deposition of individual CNTs and (as a result) of CNT aggregates on the substrate 710. It can also encompass forming a photoresist layer, such as a layer of PMGI, on the CNT channels 720a, 720b. The photoresist layer can have a thickness of about 100 nm to about 150 nm. Then, the substrate 710 can be immersed, submerged, and/or otherwise incubated in a solvent for a time period as necessary or desirable to remove a portion of the photoresist layer and to retain some remaining portion of it. The substrate 710 can be sonicated in the solvent to mechanically remove any CNT aggregates without removing individual CNTs. In some cases, fewer than 1-10 CNT aggregates per square millimeter remain on the substrate 710, and the remaining portion of the adhesive layer aids in maintaining adherence of the individual CNTs to the substrate 710. As noted above for FIG. 3, in some cases, a CNT adhesion promoter is deposited on the substrate 710 prior to deposition of the CNTs to form the CNT channels 720a, 720b.

At step (4) of the method 700, a source terminal/electrode 725a and drain terminal/electrode 730a are formed for the PMOS CNFET in electrical contact with the CNT channel 720a. These electrodes can be formed of platinum as illustrated in FIG. 7. At step (5) of the method 700, a passivation layer 735 (e.g., composed of or including $SiO_2$ as illustrated in FIG. 7) is deposited on the PMOS CNFET to protect the PMOS CNFET from oxide deposition at step (7) (explained below for method 700, and in greater detail in Example 2).

At step (6) of the method 700, source terminal/electrode 725b and drain terminal/electrode 730b is formed for the NMOS CNFET in electrical contact with the CNT channel 720b, and can be formed of titanium as illustrated. The use of a lower work function metal (titanium) as contacts for NMOS CNFETs and a higher work function metal (platinum) as contacts for PMOS CNFETs improve the on-state drive current of both (for a given off-state leakage current).

Returning to FIG. 7, at step (7) of the method 700, nonstoichiometric HfOx is deposited over the CNTs 720b via atomic layer deposition (ALD). The oxide electrostatically dopes the CNTs 720b, while the CNTs 720a in the PMOS CNFET are protected by the passivation layer 735 deposited in step (5).

In summary, both the PMOS and NMOS CNFETs in FIG. 7 use a back-gate geometry, and the doping to realize the NMOS CNFET is accomplished through (1) engineering of metal contact work function (platinum is used for the PMOS source/drain, while titanium is used for NMOS source/drain), and (2) electrostatic doping. This process leverages silicon CMOS compatible materials, allows for precise threshold voltage tuning through controlling the stoichiometry of the ALD doping oxide, and is robust due to tight process control afforded by ALD.

FIG. 9A shows a 150 mm wafer with test patterns that are duplicated on each die and include the NOR2 gates to be measured. Each die of the wafer has 10,400 CNFET CMOS two-input "not-or" (NOR2) logic gates. Separate NOR2 logic gates are fabricated and measured as this can enable characterization of several gate-level metrics, including the voltage transfer curves (VTCs, which are used to compute the static noise margin of cascaded logic gates) V, gain, and output voltage swing (see FIG. 10 for definitions of relevant metrics). The experimentally measured VTCs for all 10,400 CNFET CMOS NOR2 logic gates are shown in FIG. 9B, and no logic gates have been excluded. The functional yield, which is defined as having an output voltage swing >70% $V_{DD}$, for all logic gates within the die is 10,400/10,400.

To illustrate the uniformity of the CNFET CMOS, FIGS. 11A-11F show distributions and extraction of the key metrics for all of the 10,400 logic gates in FIG. 9A (for instance, the average output voltage swing is >98% $V_{DD}$ with <1% standard deviation). By extracting $V_{OH}$, $V_{OL}$, $V_{IH}$, and $V_{IL}$ from the VTCs associated with each of the 10,400 logic gates, one can calculate the static noise margin (SNM) of all combinations of two cascaded NOR2 gates (i.e., with driving logic gate and loading logic gate). FIGS. 12A-12D show the distributions of the SNM for the >100 million possible combinations of cascaded logic gate pairs (i.e., with a driving logic gate and a loading logic gate): 99.93% of logic gate pairs have positive noise. FIGS. 12A-12D show the VTC (for example, $V_{IH}$) has spatial dependency. The CNT deposition is highly uniform across the substrate and exhibits substantially no spatial dependencies, which is indicative that sources of threshold variations are likely processing induced.

FIG. 13 shows that the noise margin violations (SNM<0) can partially be attributed to the wafer processing (i.e., not the CNTs), and therefore can be improved by optimizing processing (e.g., by increasing ALD doping oxide uniformity over the 150 mm wafer). Additionally, FIGS. 14A-14B show wafer-scale CNFET CMOS characterization: measurements across four additional dies distributed across the 150 mm wafer (1000 CNFET CMOS NOR2 logic gates are sampled randomly from the 10,000 ensemble in each die; as before no logic gates are removed) illustrating yield across the 150 mm wafer (total yield across wafer: 14,400/14,400 logic gates, 57,600 CNFETs). This is the first demonstration of large-area, uniform, and high-yield CNFET CMOS logic, enabled by combining RINSE with the CNFET CMOS fabrication process.

Example 1—Fabrication in an HVM Facility

To demonstrate that the entire CNFET process is HVM-compatible, shown here is an implementation of CNFETs within a commercial silicon manufacturing facility. The CNFETs are fabricated on upper circuit layers in the BEOL. Planarized tungsten plugs are used as the embedded back-gates and all CNFET-related fabrication was at low temperature (e.g., <400° C.) to avoid damaging BEOL metal layers or devices fabricated beneath the CNFETs. (FIG. 15, $I_D$-$V_{GS}$ curves in FIG. 16). Customized CNT solution preparations successfully removed chemical contaminants from the CNT solution as confirmed through inductively coupled plasma mass spectrometry (ICP-MS) analysis of the wafers post-CNT deposition (FIG. 17). The CNFET process was the same as detailed for FIG. 7, showing that the same high-yield process is HVM-compatible as well as scalable to more scaled nodes. The CNFETs are manufactured at a range of nodes in the commercial silicon facility, down to sub-250 nm nodes (sub-10 nm CNFETs have been experimentally demonstrated previously).

Example 2—Microprocessor Built from Carbon Nanotube Transistors

Electronics is approaching a major paradigm shift as silicon transistor scaling no longer yields historical energy efficiency benefits, spurring research on beyond-silicon nanotechnologies. In particular, carbon nanotube (CNT) field-effect transistor (CNFET)-based digital circuits promise significant energy efficiency benefits, but the inability to perfectly control intrinsic nanoscale defects and variability in CNTs have made realizing very-large-scale systems infeasible. Here, these challenges are overcome to experimentally show a beyond-silicon microprocessor built entirely from CNFETs. This 16-bit microprocessor is based on the RISC-V instruction set, runs standard 32-bit instructions on 16-bit data and addresses, comprises >14,000 complementary metal-oxide-semiconductor (CMOS) CNFETs, and is designed and fabricated using industry-standard design flows and processes. This demonstration uses a set of combined processing and design techniques for overcoming nanoscale imperfections at macroscopic scales.

With diminishing returns of silicon field-effect transistor (FET) scaling, the need for FETs leveraging nanotechnologies has been steadily increasing. Carbon nanotubes (or CNTs, nano-scale cylinders made of a single sheet of carbon atoms with diameters of ~10-20 Å) are prominent among a variety of nanotechnologies that are being considered for next generation energy-efficient electronic systems. Due to the nano-scale dimensions and simultaneously high carrier transport of CNTs, digital systems built from FETs fabricated with CNTs as the transistor channel (i.e., CNFETs) are projected to improve energy efficiency of today's silicon-based technologies by an order of magnitude.

Over the past decade, CNT technology has progressed in maturity: from single CNFETs to individual digital logic gates to small-scale digital circuits and systems. In 2013, this progress led to the demonstration of a complete digital system: a miniature computer comprising 178 CNFETs that implemented only a single instruction operating on only a single bit of data (see Example 3 for a full discussion of prior work). However, as with all emerging nanotechnologies, there remained a significant disconnect between these small-scale demonstrations and modern systems comprising tens of thousands of FETs (e.g., microprocessors) to billions of FETs (e.g., high performance computing servers). Perpetuating this divide is the inability to achieve perfect atomic-level control of nanomaterials across macroscopic scales (e.g., yielding consistent 10 Å diameter CNTs uniformly across industry-standard 150-300 mm diameter wafer substrates). Resulting intrinsic defects and variations have made realizing such modern systems infeasible. For CNTs, these major intrinsic challenges are:

Material defects: while semiconducting CNTs (s-CNTs) form energy-efficient FET channels, the inability to precisely control CNT diameter and chirality results in every CNT synthesis containing some percentage of metallic CNTs (m-CNTs). m-CNTs have little to no bandgap and therefore their conductance cannot be sufficiently modulated by the CNFET gate, resulting in high leakage current and potentially incorrect logic functionality.

Manufacturing defects: during wafer fabrication, CNTs "bundle" together forming thick CNT aggregates. These aggregates can result in CNFET failure (reducing CNFET circuit yield), as well as prohibitively high particle contamination rates for very-large-scale integration (VLSI) manufacturing.

Variability: energy-efficient complementary metal-oxide-semiconductor (CMOS) digital logic requires the ability to fabricate CNFETs of complementary polarities (p-CNFETs and n-CNFETs) with well-controlled characteristics (e.g., tunable and uniform threshold voltages, and p- and n-CNFETs with matching on- and off-state current). Prior techniques for realizing CNFET CMOS have relied on either extremely reactive, not air-stable, non-silicon CMOS compatible materials or have lacked tunability, robustness, and reproducibility. This severely limited the complexity of CNT CMOS demonstrations, and no complete CNT CMOS digital system has ever been fabricated till date.

While substantial prior work has focused on overcoming these challenges, none meets all of the strict requirements for realizing VLSI systems. In this work, the intrinsic CNT defects and variations are overcome to enable the first demonstration of a beyond-silicon modern microprocessor: RV16X-NANO, designed and fabricated entirely using CNFETs. RV16X-NANO is a 16-bit microprocessor based on the open-source and commercially available RISC-V instruction set processor, running standard RISC-V 32-bit instructions on 16-bit data and addresses. It integrates >14,000 CMOS CNFETs, and operates as modern microprocessors today (e.g., it can run compiled programs; in addition, its functionality is demonstrated by executing all types and formats of instructions in the RISC-V instruction-set architecture (ISA)). This is made possible by a set of original processing and circuit design techniques that are combined to overcome the intrinsic CNT challenges. The elements of this manufacturing methodology for CNTs are:

RINSE (Removal of Incubated Nanotubes through Selective Exfoliation): removes CNT aggregate defects through a new selective mechanical exfoliation process. RINSE can reduce CNT aggregate defect density by >250× without affecting non-aggregated CNTs or degrading CNFET performance.

MIXED (Metal Interface engineering Crossed with Electrostatic Doping): this combined CNT doping process leverages both metal contact work function engineering as well as electrostatic doping to realize the first robust wafer-scale CNFET CMOS process. Entire dies with >10,000 CNFET CMOS digital logic gates (2-input "not-or" gates with functional yield 14,400/14,400, comprising 57,600 total CNFETs) are made, and presented here is the first wafer-scale CNFET CMOS uniformity characterization across 150 mm wafers (such as analyzing yield for >100 million combinations pairs of cascaded experimental logic gates).

DREAM (Designing Resiliency Against Metallic CNTs): overcomes the presence of m-CNTs entirely through circuit design. DREAM relaxes the requirement on m-CNT purity by ~10,000× (from 99.999,999% m-CNT purity requirement relaxed to 99.99%), without imposing any additional processing steps or redundancy. DREAM is implemented using standard electronic design automation (EDA) tools, has minimal cost, and enables digital VLSI systems with CNT purities that are available commercially today.

The entire Manufacturing Methodology for CNTs is wafer-scale, VLSI-compatible, and is seamlessly integrated within existing infrastructures for silicon CMOS—both in terms of design and processing. RV16X-NANO is designed with standard EDA tools, and leverages materials and processes that are compatible with and exist within commercial silicon CMOS manufacturing facilities.

RV16X-NANO—FIG. 18A shows an optical microscopy image of a fabricated RV16X-NANO die alongside three-dimensional to-scale rendered schematics of the physical layout. It is the largest CMOS electronic system ever realized using beyond-silicon nanotechnologies: comprising 3,762 CMOS digital logic stages, totaling 14,702 CNFETs containing >10 million CNTs, and includes logic paths comprising up to 86 stages of cascaded logic between flip-flops (i.e., that evaluate sequentially in a single clock cycle). It operates with 1.8 supply voltage ($V_{DD}$), receives an external referenced clock (generating local clock signals internally), receives inputs (instructions and data) from and writes directly to an off-chip main memory (dynamic random-access memory: DRAM), and stores data on-chip in a register file—no other external biasing or control signals are supplied. Furthermore, RV16X-NANO demonstrates a new three-dimensional (3D) physical architecture, as the metal interconnect layers are fabricated both above and below the layer of CNFETs (see FIG. 18B). This is in stark contrast to silicon-based systems where all metal routing can only be fabricated above the bottom layer of silicon FETs. In RV16X-NANO, the metal layers below the CNFETs are primarily used for signal routing, while the metal layers above the CNFET are primarily used for power distribution (FIG. 18B). The fabrication process implements 5 metal layers and includes >100 individual processing steps. Such new 3D layout promises improved routing congestion (a major challenge for today's systems), and is uniquely enabled by CNTs (due to their low-temperature fabrication)

Physical Design—The design flow of RV16X-NANO can leverage industry-standard tools and techniques: here, a standard process design kit (PDK) for CNFETs as well as a library of standard cells for CNFETs was created that is compatible with existing EDA tools and infrastructure without modification. This CNFET PDK includes a compact model for circuit simulations that is experimentally calibrated to the fabricated CNFETs. The standard cell library comprises 63 unique cells, and includes both combinational and sequential circuit elements implemented with both static CMOS and complementary transmission-gate digital logic circuit topologies (see Example 4 for a full list of standard library cells, including circuit schematic and physical layouts). The CNFET PDK is used to characterize the timing and power for all of the library cells, which are experimentally validated by fabricating and measuring all cells individually (see Example 4 for full description and experimental characterization of the standard cell library). A full description of the VLSI design methodology, including how DREAM is implemented during logic synthesis and place-and-route, is provided below.

Computer Architecture—FIGS. 19A-19B illustrate the architecture of RV16X-NANO, which can follow conventional microprocessor design (implementing instruction fetch, instruction decode, register read, execute/memory access, and write-back stages). It is designed from RISC-V, a standard open instruction set architecture used in commercial products today and gaining wide-spread popularity in both academia and industry. RV16X-NANO is derived from a full 32-bit RISC-V microprocessor supporting the RV32E instruction set (31 different 32-bit instructions, see Supplemental Information), while truncating the data path width from 32-bits to 16-bits, and reducing the number of registers from 16 to 4. It is designed using publicly available Bluespec, and is verified using SMT-based bounded model checking against a formal specification of the RISC-V ISA (see Supplemental Information). Correct functionality of the microprocessor is demonstrated by experimentally running and validating correct functionality of all types and formats of instructions on the fabricated RV16X-NANO. FIGS. 20A-20B show the first program executed on RV16X-NANO: the famous "Hello, world", as described further below Manufacturing Methodology for CNTs—Described here is a manufacturing methodology for CNTs—a set of combined processing and design techniques for making the RV16X-NANO (FIG. 21A). All design and fabrication processes are wafer-scale and VLSI compatible, not requiring any per-unit customization or redundancy.

RINSE—The CNFET fabrication process begins by depositing CNTs uniformly over the wafer. 150 mm wafers (with the bottom metal signal routing layers and gate stack of the CNFET already fabricated for the 3D design) are submerged in solutions containing dispersed CNTs (Methods). While CNTs uniformly deposit over the wafer, the CNT deposition also inherently results in manufacturing defects, where CNT aggregates deposited randomly across the wafer (FIG. 21B). These CNT aggregates act as particle contamination, reducing die yield. While several existing techniques have attempted to remove these aggregates prior to CNT deposition, none is sufficient to meet wafer-level yield requirements for VLSI systems: (a) excessive high-power sonication for dispersing aggregates in solution damages CNTs, resulting in degraded CNFET performance, and does not disperse all CNTs; (b) centrifugation does not remove all smaller aggregates (and aggregates can re-form post centrifugation), (c) excessive filtering removes both aggregates and the CNTs themselves from the solution, and (d) etching the aggregates is infeasible due to lack of selectivity versus the underlying CNTs themselves. To remove these aggregates, a new process technique, RINSE, is developed that consists of three steps (FIG. 21C):

1) CNT incubation: solution-based CNTs are deposited on wafers pre-treated with a CNT adhesion promoter (HMDS, Bis(trimethylsilyl)amine).

2) Adhesion coating: a standard photoresist (Polymethylglutarimide, PMGI) is spin-coated on the wafer and cured at ~200° C.

3) Mechanical exfoliation: the wafer is placed in solvent (NMP) and sonicated.

Without adhesion coating (step 2), sonicating the wafer may inadvertently remove section of CNTs in addition to the aggregates (FIG. 21D). The adhesion coating leaves an atomic layer of carbon that remains after step 3, which can exert sufficient force to adhere the CNTs to the wafer surface while still allowing for the removal of the aggregates. Experimental results for RINSE are shown in FIGS. 21D-21G. By optimizing the adhesion-coating cure temperature and time as well as the sonication power and time, RINSE reduces CNT aggregate density by >250× (quantified by the number of CNT aggregates per unit area) without damaging the CNTs or impacting CNFET performance (see Example 4).

MIXED—After using RINSE to overcome intrinsic CNT manufacturing defects, CNFET circuit fabrication continues. While energy-efficient CMOS logic requires both p-CNFETs and n-CNFETs with controlled and tunable properties (such as threshold voltage), techniques for realizing CNT CMOS today result in significant FET-to-FET variability that has made realizing large-scale CNFET CMOS systems infeasible. Moreover, the vast majority of existing techniques are not air-stable (e.g., they use materials that are extremely reactive in air), are not uniform or robust (e.g., they do not always successfully realize CMOS), or rely on materials not compatible with conventional silicon CMOS processing (e.g., molecular dopants that contain ionic salts prohibited in commercial fabrication facilities).

These challenges are overcome by the processing technique MIXED, described in FIGS. 22A-22D. MIXED is based on a combined doping approach that engineers both the oxide deposited over the CNTs to encapsulate the CNFET as well as the metal contact to the CNTs. First, the CNFETs are encapsulated in oxide (deposited by atomic-layer deposition, ALD) to isolate them from their surroundings. By leveraging the atomic-layer control of ALD, the precise stoichiometry of this oxide encapsulating the CNTs is engineered, which enables simultaneous electrostatic doping of the CNTs (the stoichiometry dictates both the amount of redox reaction at the oxide-CNT interface as well as the fixed charge in the oxide). In addition, the metal source/drain contacts to the CNTs are engineered to further optimize the p- and n-CNFETs. A lower work function metal (Titanium) is employed as contacts to n-CNFETs and a higher work function metal is employed as contacts to p-CNFETs (Platinum), improving the on-state drive current of both (for a given off-state leakage current). In contrast to previous approaches, MIXED leverages silicon CMOS-compatible materials, allows for precise threshold voltage tuning through controlling the stoichiometry of the ALD doping oxide, and is robust due to tight process control by using ALD and air-stable materials.

FIG. 22C shows the current-voltage (I-V) characteristics of p-CNFETs and n-CNFETs, demonstrating well-matched characteristics (such as on- and off-state currents). To demonstrate the reproducibility of MIXED at a wafer scale, FIG. 22D shows measurements from 10,400/10,400 correctly functioning 2-input "not-or" (NOR2) CNFET logic gates within a single die, and 1,000/1,000 correctly functioning NOR2 gates randomly selected from across a 150 mm wafer. Additional characterization results (including output voltage swing, gain, and static noise margin for >100 million possible combinations of cascaded logic gate pairs), are in Example 4. This is the first wafer-scale demonstration of solid-state, air-stable, VLSI- and silicon-CMOS compatible CNFET CMOS.

DREAM—Despite the robust CNFET CMOS enabled by RINSE and MIXED, a small percentage (~0.01%) of CNTs are m-CNTs, which stems from a major fundamental CNT material defect: the random presence of m-CNTs. Unfortunately, 0.01% m-CNT fraction can be prohibitively large for VLSI-scale systems, due to two major challenges: (1) increased leakage power, degrading EDP benefits, and (2) degraded noise immunity, potentially resulting in incorrect logic functionality. To quantify noise immunity of digital logic, the static noise margin (SNM) is extracted for each pair of connected logic stages, using the voltage transfer curves (VTCs) of each stages (details in FIGS. 32A-32K). The probability that all connected logic stages meet a minimum SNM requirement ($SNM_R$, typically chosen by the designer as a fraction of $V_{DD}$, e.g., $SNM_R=V_{DD}/4$) is $p_{NMS}$: the probability that all noise margin constraints are satisfied. While previous works have set requirements on s-CNT purity ($p_S$) based on limiting m-CNT-induced leakage power, no existing works have provided VLSI circuit-level guidelines for ps based on both increased leakage and the resulting degraded SNM. While 99.999% $p_S$ is sufficient to limit EDP degradation to ≤5%, SNM imposes far stricter requirements on purity: $p_S$ ~99.999,999% to achieve $p_{NMS}$≥99% (analyzed for 1 million gate circuits, Example 4).

Unfortunately, typical CNT synthesis today achieves $p_S$ ~66%. While many different techniques have been proposed to overcome the presence of m-CNTs (Supplemental Information), the highest reported purity is ~99.99% $p_S$: 10,000× below the requirement for VLSI circuits[34,35,36]. Moreover, these techniques have significant cost, requiring either: (a) additional processing steps (e.g., applying high voltages for electrical "breakdown" of m-CNTs during fabrication[10]) or (b) redundancy incurring significant energy efficiency penalties. Presented and experimentally validated here is a new technique, DREAM, that overcomes, for the first time, the presence of m-CNTs entirely through circuit design. DREAM reduces the required ps by ~10,000×, allowing 99% $p_{NMS}$ with $p_S$=99.99% (for 1 million logic gate circuits). This enables digital VLSI circuits using CNT processing available today: $p_S$=99.99% is already commercially available (and can be achieved through several means, including solution-based sorting which is used in the process for fabricating RV16X-NANO).

The key insight for DREAM is that m-CNTs affect different pairs of logic stages uniquely depending on how the logic stages are implemented (considering both the schematic and physical layout). As a result, the SNM of specific combinations of logic stages is more susceptible to m-CNTs. To improve overall $p_{NMS}$ for a digital VLSI circuit, DREAM applies a logic transformation during logic synthesis to achieve the same circuit functionality, while prohibiting the use of specific logic stage pairs whose SNM is most susceptible to m-CNTs. As an example, let ($G_D$, $G_L$) be a logic stage pair with driving logic stage $G_D$ and loading logic stage $G_L$. FIGS. 23A-23F show that some logic stage pairs have better SNM in the presence of m-CNTs versus others, despite using the exact same VTCs for the logic stages comprising the circuit (in this instance, logic stage pairs (nand2, nand2) and (nor2, nor2) have better SNM than (nand2, nor2) or (nor2, nand2)). Thus, a designer can improve $p_{NMS}$ by prohibiting the use of logic stage pairs that are more susceptible to m-CNTs, while permitting logic stage pairs that maintain better SNM despite the presence of m-CNTs. Beyond this example to illustrate DREAM, the benefit of DREAM is quantified using both simulation and experimental analysis for VLSI-scale circuits; in simulation, a compact model for CNFETs is leveraged, which accounts for both s-CNTs and m-CNTs, to analyze the impact of m-CNTs on the leakage power, energy consumption, speed, and noise susceptibility of physical designs of VLSI-scale circuits at a 7 nm technology node designed using standard EDA tools, with and without DREAM (results in FIGS. 23A-23F, additional discussion in Example 4). 2,000 CMOS CNFETs are fabricated with MIXED (1,000 PMOS and 1,000 NMOS CNFETs: FIGS. 23A-23F) and characterized. Using I-V measurements from these 2,000 CNFETs, 1 million combinations of CNFET digital logic gates are analyzed (whose electrical characteristics are solved using the I-V characteristics of the measured CNFETs, FIGS. 32A-32K) to show the benefits of DREAM to improve circuit susceptibility to noise. Further details of these analysis and implementation of DREAM for arbitrary digital VLSI circuits are provided below, including how to implement DREAM using standard industry-practice physical design flows, how to implement DREAM for RV16X-NANO, and an efficient algorithm to satisfy target $p_{NMS}$ constraints (e.g., $p_{NMS} \geq 99\%$), while minimizing energy, delay, and area costs.

These combined processing and design techniques overcome the major intrinsic CNT challenges. This complete Manufacturing Methodology for CNTs enables the most advanced demonstration of a beyond-silicon modern microprocessor fabricated from CNTs, RV16X-NANO. In addition to demonstrating the RV16X-NANO microprocessor, all facets of this manufacturing methodology for CNTs is characterized and analyzed, illustrating the feasibility of this approach and more broadly of a future CNT technology.

Fabrication Process—The fabrication process is shown in FIG. 24. It uses 5 metal layers and over 100 individual processing steps.

Bottom metal routing layers—The starting substrate is a 150 mm silicon wafer with 800 nm thermal oxide for isolation. The bottom metal wire layers are defined using conventional processing (e.g., lithographic patterning, metal deposition, etching, etc.). After the first metal layer is patterned (FIG. 24, step (a)), an oxide spacer (300° C.) is deposited to separate this first metal layer from the subsequent second metal layer (FIG. 24, step (b)). To define inter-layer vias between the first and second metal layer (hereby referred to simply as vias), vias are lithographically patterned and etched through this spacer dielectric using dry reactive ion etching (RIE) that stops on the bottom metal layer (FIG. 24, step (c)). The second metal layer is then defined lithographically and deposited. The vias are formed simultaneously with the second metal wire layer, as the vias are filled during the metal deposition (FIG. 24, step (d)). RV16X-NANO has two bottom metal layers which are used for signal routing. The second metal layer also acts as the bottom gates for the CNFETs Bottom gate CNFETs—The second metal layer (FIG. 24, step (d)) acts as both signal routing (local interconnect) as well as the bottom gate for the CNFETs. To fabricate the remaining bottom gate CNFET structure, a high-k gate dielectric (dual-stack of $AlO_2$ and $HfO_2$) is deposited through atomic layer deposition (ALD, at 300° C.) over the bottom metal gates (FIG. 24, step (e)). The $HfO_2$ is used as the majority of the dielectric stack due to its high-k dielectric constant, while the $AlO_2$ is used for its improved seeding and increased dielectric breakdown voltage.

Following gate dielectric deposition, contact vias through the gate dielectric are patterned, and again RIE is used to etch the contact vias, stopping on the local bottom gates (FIG. 24, step (f)). These contact vias are used by the top metal wiring to contact and route to the bottom gates and bottom metal routing layers. Post-etch, the surface is cleaned with both a solvent rinse as well as oxygen plasma, in preparation for the CNT deposition. Prior to CNT deposition, the surface is treated with hexamethyldisilazane (HMDS), a common photoresist adhesion promoter, which improves the CNT deposition (both density and uniformity) over the high-k gate dielectric. The 150 mm wafer is then submerged in a toluene-based solution of ~99.99% s-CNT purified CNTs (similar to the commercial Isosol-100 available from NanoIntegris). The amount of time the wafer incubates in the solution, as well as the concentration of the CNT solution, both affect the final CNT density; this process is optimized to achieve ~40-60 CNTs/μm of CNTs (FIG. 24, step (g)). Immediately prior to CNT incubation, the CNT solution is diluted to the target concentration and is horn-sonicated briefly to maximize CNT suspension (some CNT aggregates will always remain). Post-CNT deposition, the RINSE method is performed to remove CNT aggregates that deposit on the wafer, leaving CNTs uniformly deposited across the 150 mm wafer. RINSE does not degrade the remaining CNTs or remove the non-aggregated CNTs on the wafer (FIGS. 29A-29E). After CNT incubation, the CNT active etch is performed in order to remove CNTs outside of the active region of the CNFETs (i.e., channel region of the CNFETs). To do so, the active region of the CNFETs is lithographically patterned (protecting CNTs in these regions with photoresist), and all CNTs are etched outside of these regions in oxygen plasma. The photoresist is then stripped in a solvent rinse, leaving CNTs patterned in the intended locations (i.e., in the channel region of the CNFETs) on the wafer (FIG. 24, step (h)). While solution-based CNTs are used, alternative methods for depositing CNTs on the substrate include aligned growth of CNTs on a crystalline substrate followed by transfer of the CNTs onto the wafer used for circuit fabrication. Both methods have shown the ability to achieve high drive current CNFETs.

MIXED method for CNT CMOS—Following active etch of the CNTs (described above), the p-CNFET source and drain metal contacts and lithographically patterned and defined. The p-CNFET contacts are deposited (0.6 nm Titanium for adhesion followed by 85 nm Platinum) through electron-beam evaporation, and the contacts are patterned through a dual-layer lift-off process (FIG. 24, step (i)). This third metal layer acts as both the p-CNFET source and drain contacts, as well as local interconnect. Following the p-CNFET source and drain contacts, the p-CNFETs are passivated by depositing 100 nm $SiO_2$ over the p-CNFETs (FIG. 24, step (j)). Following p-CNFET passivation, the wafer undergoes an oxide densification anneal in forming gas (dilute $H_2$ in $N_2$) at 250° C. for 5 minutes. This concludes the p-CNFET fabrication. To fabricate the n-CNFETs, the fourth metal layer (100 nm Titanium, n-CNFET source and drain contacts) is defined (FIG. 24, step (k), similar to p-CNFET source and drain contact definition). For the electrostatic doping, nonstoichiometric HfOx is deposited through ALD at 200° C. uniformly over the wafer. Finally, contact vias are lithographically patterned and etched (FIG. 24, step (m)) through the HfOx for metal contacts to the bottom metal layers, as well as etch the HfOx covering the p-CNFETs (the p-CNFETs are protected during this etch by the SiO$_2$ passivation oxide deposited previously).

Back-end-of-line (BEOL) metal routing—Following the CNT CMOS fabrication, back-end-of-line metallization is used to define additional metal layers over the CNFETs, e.g., for power distribution and signal routing. As the metal layers below the CNFETs are primarily used for signal routing, the top (5$^{th}$) metal layer in the process is used for power distribution (FIG. 24, step (n)). Additional metal can be deposited over the input/output (I/O) pads for wire bonding and packaging. At the end of the process, the wafer undergoes a final anneal in forming gas at 325° C. The finished wafer is diced into chips, and each chip can be packaged for testing or probed for standard cell library characterization.

This 3D physical architecture (with metal routing below and above the CNFETs) in uniquely enabled by the low-temperature processing of the CNFETs. The solution-based deposition of the CNTs decouples the high-temperature CNT synthesis from the wafer, enabling the entire CNFET to be fabricated with a maximum processing temperature <325° C. This enables metal layers and the gate stack to be fabricated prior to the CNFET fabrication. This is in stark contrast to silicon CMOS, which requires high temperature processing (e.g., >1,000° C.) for steps such as doping activation annealing. This prohibits fabricating silicon CMOS over pre-fabricated metal wires, as the high-temperature silicon CMOS processing would damage or destroy these bottom metal layers.

Experimental measurements—Supply voltage ($V_{DD}$) of 1.8 V is chosen to maximize noise resilience of the CNT CMOS digital logic, given the experimentally-measured transfer characteristics of the fabricated CNFETs (noise resilience is quantified by the static noise margin metric: see DREAM in the manuscript). To interface with each RV16X-NANO chip, a high channel count data acquisition system (120 channels) is used that offers a maximum clock frequency of 10 kHz while simultaneously sampling all channels. This limits the frequency of running RV16X-NANO to 10 kHz, at which the power consumption is 969 µW (dominated by leakage current). However, this is not the maximum clock speed of RV16X-NANO; during physical design, using an experimentally-calibrated CNFET compact model and process design kit (PDK) in an industry-practice VLSI design flow, the maximum reported clock frequency is 1.19 MHz, reported by Cadence Innovus® following placement-and-routing of all logic gates.

VLSI design methodology—The design flow of RV16X-NANO leverages industry-standard tools and techniques: a standard process design kit (PDK) for CNFETs as well as a library of standard cells for CNFETs is created that is compatible with existing EDA tools and infrastructure without modification. This enables leveraging of decades of existing EDA tools and infrastructure to design, implement, analyze, and test arbitrary circuits using CNFETs, which can be significant for CNFET circuits to be widely adopted in the mainstream.

A high-level description of RISC-V implementation is written in Bluespec and then compiled into a standard register transfer level (RTL) hardware description language (HDL): Verilog. Bluespec enables testing of all instructions (listed in FIGS. 28A-28C) written in assembly code (e.g., using the assembly language commands) to verify proper functionality of the RV16X-NANO. The functional tests for each instruction are also compiled into waveforms and tested on the RTL generated by Bluespec, they are verified using Verilator® to verify proper functionality of the RTL (inputs and outputs are recorded and analyzed as Verilog change dump (.vcd) files). RTL descriptions of each module are shown in FIGS. 19A-19B.

Next is the physical design of RV16X-NANO, including logic synthesis with a DREAM-enforcing standard cell library (see Methods: DREAM implementation), placement and routing, parasitic extraction, and design sign-off (i.e., design rule check (DRC), layout versus schematic (LVS), verification of the final GDSII), as shown in FIGS. 21A-21G. The RTL is synthesized into digital logic gates using Cadence Genus®, using the following components of the CNFET PDK and standard cell library: LIBERTY file (.lib) containing power/timing information for all standard library cells, cell macro layout exchange format (LEF) file (.macro.lef) containing abstract views of all standard library cells (e.g., signal/power pin locations and routing blockage information), technology LEF file (.tech.lef) containing metal routing layer information (e.g., metal/via width/spacing), and back-end-of-line (BEOL) parasitic information (.qrcTech file). To enforce DREAM, a subset of library cells in the standard cell library is used, including cells with inverter- and nor2-based logic stages (for combinational logic), and logic stages using tri-state inverters (for sequential logic), as well as fill cells (to connect power rails) and decap cells (to increase capacitance between power rails $V_{DD}$ and $V_{SS}$); specifically, these 23 cells comprise (see FIG. 26): and2_x1, buf_x1, buf_x2, buf_x4, buf_x8, decap_x3, decap_x4, decap_x5, decap_x6, decap_x8, dff2xdlh_x1, fand2stk_x1, inv_x1, inv_x2, inv_x4, inv_x8, inv_x16, mux2nd2_x1, nand2_x1, nor2nd2_x1, or2nd2_x1, xnor2nd2_x1, and xor2nd2_x1. During synthesis, all output pads are buffered with library cell buf_x8 to drive the output pad so that no signal simultaneously drives an output pad as well as another logic stage to prevent excessive capacitive loading in the core. Also, to minimize routing congestion in preparation for place-and-route, the register file (containing 4 registers as described in FIGS. 19A-19B) is directly synthesized from the Verilog HDL (instead of being designed "by hand" or using a memory compiler) so that the D-flip-flops (dff2xdlh_x1: FIG. 26) including the state elements (registers) can be dispersed throughout the chip to lower overall total wire length. The final netlist is flattened so there is no hierarchy, and so logic can be optimized across module boundaries, and is then exported for place and route.

Placement-and-routing is performed using Cadence Innovus®, loading the synthesized netlist output from Cadence Genus®. The core floorplan for standard library cells is defined as 6.912 mm×6.912 mm. Given the standard cell library and logic gate counts from synthesis (and2_x1: 188, buf_x1: 3, buf_x8: 82, buf_x16: 25, dff2xdlh_x1: 68, fand2stk_x1: 15, inv_x1: 75, inv_x2: 15, inv_x4: 10, inv_x8: 27, mux2nd2_x1: 189, nand2_x1: 625, nor2nd2_x1: 27, or2nd2_x1: 211, xnor2nd2_x1: 14, xor2nd2_x1: 8), the resulting standard cell placement utilization is 40%. The pad ring for I/O is defined as another cell with 160 pads: 40 on each side, with 170 µm minimum width and 80 µm minimum spacing totaling 250 µm pitch. Inputs are primarily toward the top of the chip, outputs are primarily on the bottom, and power/ground ($V_{DD}/V_{SS}$) pads are on the sides (FIGS. 18A-18B). In addition to the core area, an additional boundary of 640 µm is permitted for signal routing around the core area (containing all standard library cells), e.g., for relatively long global routing signals. Placement is performed while optimizing for uniform cell density and low routing congestion. The power grid is defined on top of the core area using the 5$^{th}$ metal layer (as shown in FIGS. 18A-18B), while not consuming any additional routing resources within the metal layers for signal routing. The clock tree is implemented as a single high-fanout net loaded by all 68 D-flip-flops (for each of CLK and the inverted clock: CLKN), which is directly connect to an input pad, to minimize clock skew variations between registers.

All routing signals and vias are defined on a grid, with routing jogs enabled on each metal layer to enable optimization targeting maximum spacing between adjacent metal traces. After this stage of routing, incremental placement is performed to further optimize congestion, and then filler cells and decap cells are inserted to connect the power rails between adjacent library cells and to increase capacitance between $V_{DD}$ and $V_{SS}$ to improve signal integrity. After this incremental placement, the final routing takes place, reconnecting all the signals and routing to the pads, including detailed routing to fix all DRC violations (e.g., metal shorts and spacing violations). Finally, parasitic resistance and capacitances are extracted to finalize power/timing analysis, and the final netlist is output to quantify static noise margin for all pairs of connected logic stages. The GDSII is streamed out from Cadence Innovus® and is imported into Cadence Virtuoso® for final DRC and LVS, using the standard verification rule format (SVRF) rule files with Mentor Graphics Calibre®. The synthesized netlist is again used in the RTL functional simulation environment to verify proper functionality of all instructions, using Synopsys VCS®, with waveforms for each test stored in a Verilog change dump (.vcd) file. Note that these waveforms constitute the input waveforms to test the final fabricated CNFET RV16X-NANO, as well as the expected waveforms output from the core, as shown in FIGS. 20A-20C.

Once the GDSII for the core is complete, it is instantiated in a full die, which contains the core in the middle, alignment marks, and test structures (including all standard library cells, CNFETs, and test structures to extract wire/via parasitic resistance and capacitance) around the outside of the core as shown in FIG. 25. This die (2 cm×2 cm) is then tiled onto a 150 mm wafer, each of which comprises 32 dies (6×6 array of dies minus 4 dies in the corners). Each layer in the GDS is flattened for the entire wafer and then released for fabrication.

To implement DREAM:

Generate "DREAM SNM table"—for each pair of logic stages in the standard cell library, quantify its susceptibility to m-CNTs as follows: use the variation-aware CNFET SNM model to compute SNM for all possible combinations of whether or not each CNFET comprises an m-CNT (e.g., in a (nand2, nor2) logic stage pair, there are $2^8$ such combinations since there are 8 total CNFETs). Record the minimum computed SNM in a table: the DREAM SNM table (FIG. 23B).

Determine prohibited logic stage pairs—choose an SNM cut-off value ($SNM_C$), such that all logic stage pairs whose SNM in the DREAM SNM table is less than $SNM_C$ are prohibited during physical design (example in FIG. 23B, entries with values greater than 82 satisfy $SNM_C$ and are allowable while entries with values 82 and below are prohibited cascaded logic gate pairs).

Physical design—use industry-practice design flows and electronic design automation (EDA) tools to implement VLSI circuits without using the prohibited logic stage pairs. Ideally, EDA tools will enable designers to set which logic stage pairs to prohibit during power/timing/area optimization, but this is currently not a supported feature. To demonstrate DREAM, a DREAM-enforcing library is created that comprises a subset of library cells such that no possible combination of cells can be connected to form a prohibited logic stage pair One parameter for DREAM is $SNM_C$ (described above): larger $SNM_C$ prohibits more logic stage pairs, resulting in better $p_{NMS}$ with higher energy/delay/area cost (and vice versa). To satisfy target $p_{NMS}$ constraints (e.g., $p_{NMS} \geq 99\%$), while minimizing cost, $SNM_C$ can be optimized via bisection search:

1) Initialize a lower bound (L) and upper bound (U) for $SNM_C$. L=0, and U is the maximum value of $SNM_C$ that enables EDA tools to synthesize arbitrary logic functions (e.g., prohibiting all logic stage pairs except (inv, inv) would be insufficient);

2) Find $p_{NMS}$ using $SNM_C=(L+U)/2$. Record the set of prohibited logic stage pairs, as well as the circuit physical design, $p_{NMS}$, energy, delay, and area;

3) If $p_{NMS}$ satisfies the target constraint (e.g., $p_{NMS} \geq 99\%$), set $U=SNM_C$. Otherwise set $L=SNM_C$;

4) Set $SNM_C=(L+U)/2$. If $p_{NMS}$ has already been analyzed for the resulting set of prohibited logic stage pairs, terminate. Otherwise, return to #2.

For all physical designs recorded in #2, choose the one that satisfies the target $p_{NMS}$ constraint with minimum energy/delay/area cost. The cost of implementing DREAM is 10% energy, <10% delay, and <20% area; integrating DREAM within EDA tools—enabling $p_{NMS}$ optimization simultaneously with power/timing/area optimization is future work for improving ps versus power/timing/area trade-offs.

Example 3

Standard Cell Library—As part of the CNFET PDK, parameterized cells (Pcells) are created using Cadence Virtuoso® for both n-CNEETs and p-CNFETs, with the following open access (OA) layers: CNFET gate, goxcut (via between CNFET gate and source/drain), active, sdp (p-CNFET source/drain), pp (passivation over p-CNFETs to shield from doping oxide for n-CNFETs), sdn (n-CNFET source/drain), dopecut (etch doping oxide over p-CNFETs), and m5 (top-layer metal). CNFET Pcells offer the following user-controlled component description format (CDF) parameters, which are both provided as inputs by the designer, and extracted using design rule check (DRC) and layout versus schematic (LVS) rules: CNFET width, physical gate length, channel length, gate underlap, source/drain/gate extension width over the horizontal edge of the CNT active region, and source/drain extension length over the vertical edge of the CNT active region. These CDF parameters are also automatically checked using DRC, along with other design rules such as minimum spacing between CNT active region and goxcut via (connecting layers: gate and sdp). CNFET devices extracted using LVS (using Standard Rule Verification Format (SVRF) compatible with Mentor Graphics Calibre® integrated within Cadence Virtuoso®) instantiate CNFETs using the widely-used virtual source FET model calibrated to experimentally measured data from CNFETs (compact model written in Verilog-A).

The CNFET Pcell is used in conjunction with other OA layers in the PDK (e.g., m1=metal routing layer, v1g=via between m1 and CNFET gate, v_sd_m5=via between NMOS source/drain and metal 5 power distribution) to create 63 cells in the standard library cell; images, layouts, schematics, and experimentally measured waveforms for each standard cell are shown in FIG. 26. To facilitate automated and compact placement and routing, standard cells are designed with the convention of having standard cell height equal to 16 metal tracks, including one shared power rail ($V_{DD}$) and one shared ground ($V_{SS}$) rail (shared between vertically adjacent rows of standard cells), and some cells are "double height cells" comprising 32 metal tracks and conforming to the same conventional site-based placement method used by placement-and-routing tools (e.g., Synopsys IC Compiler® and Cadence Innovus®). Standard library cells also conform to conventional CMOS-based layout styles with PMOS FETs aligned horizontally (e.g., on the top half of the layout towards the $V_{DD}$ rail) and NMOS FETs aligned horizontally (e.g., on the bottom half of the layout toward the $V_{SS}$ rail). Of the 16 metal tracks for standard cells, 3 are used for power rails, 3 are used for each of n-CNFET and p-CNFET width, and 7 are used for signal routing (2 tracks between p-CNFET and $V_{DD}$, 2 tracks between n-CNFET and $V_{SS}$, and 3 tracks between n-CNFET and p-CNFET), creating routing resources for local interconnects (e.g., within standard cells and between standard cells), and for global signal routing (for place-and-route tools).

Layouts for each cell are shown in FIG. 26, as well as schematics for each standard cell that are automatically extracted using LVS (and verified against drawn schematics in Cadence Virtuoso®). These netlists are then used in conjunction with Cadence Liberate® for library power/timing characterization, e.g., to compute rise/fall delay/output slew rate/energy consumption as functions of output load capacitance and input slew rate. Additional metrics quantified by Cadence Liberate® include cell leakage power and timing constraint tables for sequential logic (e.g., setup time, hold time, minimum clock pulse width). The results are written to standard file formats (LIBERTY file: .lib) for synthesis & place-and-route. In addition to .lib files, layout exchange format (.lef) files (defining abstracted standard cell views for place and route, including pin locations, power rail locations, and blockage information) are created using Cadence Abstract®. These .lib and .lef files for standard library cells are then used for synthesis & place and route, in conjunction with other technology files in the PDK (.lef for technology layers, e.g., defining layers and rules for metal routing, and .ict/.qrcTech files defining parasitic information between technology layers).

To experimentally characterize and calibrate the standard cell library, each of the standard cells is fabricated alongside the RV16X-NANO. As shown in FIG. 25, each die contains the RV16X-NANO processor core in its center, surrounded by test circuitry on the perimeter. For packaging, these test structures are removed during dicing to isolate the RV16X-NANO processor core. The test circuitry contains both test structures for process monitoring throughout the >100 fabrication process steps utilized for RV16X-NANO, but also contains all of the standard cells. FIG. 26 shows images, schematics, and measurements for each of the standard cells in the library, illustrating correct functionality, high output voltage swing (>99% $V_{DD}$ swing), and high gain (>15). Output voltage swing is defined as the difference between the maximum output voltage and the minimum output voltage as the input voltage is swept from 0 to $V_{DD}$. Gain is defined as the maximum value of $|dV_{OUT}/dV_{IN}|$ as $V_{IN}$ is swept from 0 to $V_{DD}$.

RISC-V: Operational Details—The RV16X-NANO processor is implemented as a finite state machine (FSM) with 3 different states: INST_FETCH (when it is requesting an instruction from memory), EXECUTE (when it is executing an instruction), and LOAD_FINISH (when it is loading data from memory). It comes out of reset initialized in INST_FETCH, with the program counter set to 0, and so it fetches the instruction from address 0 in the memory and advances to the EXECUTE state. Adhering to RISC-V specification, the 32-bit instruction is one of 4 base instruction types (R-type, I-type, S-type, or U-type) with 5 immediate variations within the instruction (I-immediate, U-immediate, S-immediate, B-immediate, J-immediate), forming 6 possible instruction formats (type-immediate): R, I-I, I-U, S-B, S-S, U-J: see FIGS. 28A-28C for bit-level descriptions of these instructions. The instruction is decoded as one of these formats in the "decode" block (FIGS. 19A-19B), which then access to the register file (e.g., which registers to read) and provides inputs the execute block. These inputs include: 16-bit values read from the register file, immediate values decoded from the instruction, the current value of the program counter, and control signals to select instructions from the sub-blocks including: add, shift, bitwise- and, bitwise-or, bitwise-xor, less than comparison, equal comparison (FIGS. 19A-19B). The outputs of these control blocks determine which values to write back into registers (e.g., for arithmetic operation such as add/subtract), and values to write back into memory. The execute block also computes the next value of the program counter, e.g., based on either incrementing (next pc=pc+4) or otherwise for conditional branch or unconditional jump. For loads and stores, the specified memory access is performed in the EXECUTE state. For loads, the processor continues to the LOAD_FINISH state to write the load response to the register file and then request the next instruction. For stores, the processor continues to the INST_FETCH state to fetch the next instruction. All other instructions fetch the next instruction as part of the EXECUTE state. This mode of operation continues during full execution of programs and adheres to the specification in riscv.org according to RV32E specification, but a reduced number of registers (4 instead of 16) and with 16-bit data words instead of 32-bit data words (all registers in the register file are 16-bit instead of 32-bit), though instructions remain 32-bits. A full list of all instructions is in FIG. 33, which is the full list for the RV32E in the RISC-V specification. To adjust RV32E to 16-bit, the instruction length remains 32 bits, and all data operations are performed on 16-bit values instead of 32-bit values, by truncating the upper-32 bits.

The full 32-bit RISC-V processor from which the 16-bit processor was derived was formally verified using the riscv-formal suite of RISC-V specifications and tools for SMT-based hardware model checking. The riscv-formal suite contains a set of specifications that describe correct behavior of RISC-V processors. These specifications are in the form of checks performed on packets emitted from a trace-emitting interface added to processors under test called the RISC-V Formal Interface (RVFI). There are specifications for each RISC-V instruction that check individual RVFI packets to make sure each instruction is implemented correctly, e.g., the add instruction correctly implements addition. There are also specifications to make sure the microarchitecture is implemented correctly that check bounded sequences of RVFI packets for necessary properties, e.g., reading a register returns the last value written to it. Both groups of specifications are implemented in Verilog with simple synthesizable code and immediate assertion statements. The specifications in the riscv-formal suite have been verified against the reference RISC-V software simulator Spike and another formal specification written in Haskell.

The riscv-formal suite also contains tools to perform SMT-based hardware model checking on each of these specifications using the SymbiYosys framework. A script within the riscv-formal suite produces a SymbiYosys configuration file for each piece of the specification. These configuration files can be used with SymbiYosys to perform bounded model checking for each piece of the specification separately.

To verify the 32-bit RISC-V processor against riscv-formal, an RVFI port was added to emit information about each instruction executed and implemented a wrapper for the processor to match the rest of the interface expected by riscv-formal. The SymbiYosys framework is used to run bounded model checking with a depth of 30 clock cycles using the Boolector SMT solver resulting in all 42 tests passing. The free variables used by the SMT solver were the memory responses and the register file reset values. This allowed the SMT solver to explore arbitrary sequences of instructions from arbitrary initial states of the register file up to 30 clock cycles. Using a depth of 30 clock cycles is more than sufficient to cover all reachable microarchitectural states of the processor.

RINSE Method Characterization—In addition to demonstrating the ability for RINSE to reduce CNT aggregate defect density by >250×, RINSE is further characterized to show that the RINSE process does not negatively impact CNFET performance. As shown in FIGS. 29A-29E, scanning electron microscopy (SEM) images of CNT deposition pre- and post-RINSE show negligible change in the CNT density. Therefore, RINSE does not remove CNTs from the wafer surface, even after >60 minutes of performing RINSE sonication. Moreover, CNFETs fabricated on samples that have and have not undergone RINSE exhibit minimal change in electrical characteristics (FIG. 29B, note negligible change in the $I_D$-$V_{GS}$ for a set of CNFETs). Not only does RINSE not impact the p-CNFETs, the CNFETs can still undergo the MIXED doping process (including the electrostatic doping oxide) to realize n-CNFETs (FIG. 29C).

MIXED Method Characterization—FIGS. 30A-30B provide additional characterization of the MIXED CNFET CMOS process, realizing the first demonstration of large-area (150 mm substrates), uniform, and high-yield CNFET CMOS logic.

FIG. 29B shows the 150 mm wafer with the test patterns (each die has 10,400 CNFET CMOS two-input "not-or" (NOR2) logic gates). Separate NOR2 logic gates are fabricated and measured as it enables characterization of key gate-level metrics, e.g. the voltage transfer curves (VTCs, which are used to compute the static noise margin of cascaded logic gates), gain, and output voltage swing. Explanations of these metrics are shown in FIG. 30A. FIG. 30B shows the extracted distributions of these key metrics for all of the experimentally measured VTCs from the 10,400 logic gates shown in FIG. 22D (these are the VTCs for all 10,400 CNFET CMOS NOR2 logic gates within a die, no logic gates have been excluded). To illustrate uniformity, the functional yield (output voltage swing >70%) for all logic gates within the die is 10,400/10,400, and the average output voltage swing is >98% with a standard deviation of <2%. By extracting $V_{OH}$, $V_{OL}$, $V_{IH}$, $V_{IL}$ from the VTCs associated with each of the 10,400 logic gates, one is able to calculate the static noise margin (SNM) of all combinations of two cascaded NOR2 gates (i.e., with driving logic gate and loading logic gate). FIG. 29C shows the distributions of the SNM for the >100 million combinations of cascaded logic gate pairs (i.e., with a driving logic gate and a loading logic gate): 99.93% of logic gate pairs have positive noise margin (i.e., $V_{OH}^{(DR)}$>$V_{IH}^{(LD)}$ and $V_{OL}^{(DR)}$<$V_{IL}^{(LD)}$, where (DR) is for the driving logic gate and (LD) is for the loading logic gate), indicating correct cascaded logic gate functionality. All of this characterization is performed at the scaled supply voltage of 1.2 $V_{DD}$.

Moreover, FIG. 29D shows the noise margin violations (SNM<0) can partially be attributed to the wafer processing (i.e., not the CNTs), and therefore can be improved by optimizing processing (e.g., ALD doping oxide uniformity over the 150 mm wafer). As can be seen in FIG. 29D, there is a spatial dependence of $V_{IH}$ (as an example parameter to compute SNM; the other parameters exhibit similar spatial dependence): $V_{IH}$ increases across the die (increasing from top to bottom). The change in $V_{IH}$ corresponds with slight changes in CNFET threshold voltage. The fact that the threshold voltage variations are not uniformly distributed, but rather have spatial dependence, illustrates that a portion of the threshold voltage variations (and therefore variation in SNM) is due to wafer-level processing-related variations (CNT deposition is more uniform across the 150 mm wafer).

Additionally, to demonstrate that MIXED is wafer-scalable across 150 mm substrates, FIG. 29E shows the first 150 mm wafer-scale CNT CMOS characterization: measurements across 4 additional dies distributed across the 150 mm wafer (1,000 CNT CMOS NOR2 logic gates are sampled randomly from the 10,000 ensemble in each die, with no logic gates omitted from the analysis) illustrating yield across the 150 mm wafer (total yield across wafer: 14,400 logic gates, 57,600 CNFETs). This is the first demonstration of large-area, uniform, and high-yield CNT CMOS logic, enabled by combining RINSE with the robust MIXED CNT CMOS process.

Prior work for overcoming metallic CNTs—The presence of m-CNTs has been a major obstacle in the field of CNTs since the first CNFET demonstrations over a decade ago. While a wide range of techniques have been developed in response to m-CNTs, no technique achieves the required s-CNT purity for realizing CNFET digital VLSI systems. While previous works have set ps requirements based on limiting m-CNT-induced leakage power, no existing works have provided guidelines for ps based on both increased leakage and degraded SNM due to m-CNTs for physical designs of VLSI circuits; while 99.999% $p_S$ is sufficient to limit EDP degradation to <5%, FIGS. 31A-31E show that SNM imposes far stricter requirements on purity: $p_S$ 99.999, 999% to achieve $p_{NMS}$≥99% (for 1 million gate circuits).

To quantify the impact of m-CNTs on VLSI circuits, circuit modules are analyzed that are synthesized from the processor core of OpenSparc T2, a large multi-core chip that closely resembles the commercial Oracle/SUN Niagara 2 system; thus, these results account for effects present in realistic VLSI circuits—such as wire parasitics, buffer insertion to meet timing constraints, and SNM for cross-coupled logic stages in sequential logic elements—that are not present in small circuit benchmarks. Standard cell libraries derived from the reference library "asap7sc7p5t" included with the ASAP7 process design kit (PDK) are leveraged to create physical designs of the OpenSparc modules at an example 7 nm technology node, to compare optimized energy, delay, area, and $p_S$ required to achieve $p_{NMS}$=99% for VLSI circuits. The baseline case, which permits all pairs of logic stages, requires $p_S$≥99.999,996,3% to achieve $p_{NMS}$≥99% (for $SNM_R$=$V_{DD}$/5).

Performance Cost of Manufacturing Methodology for CNTs—the manufacturing methodology for CNTs (RINSE, MIXED, and DREAM) overcomes the major obstacles facing a future CNT technology with minor cost in performance or energy efficiency. First, RINSE does not degrade CNFET performance: this is validated experimentally in FIGS. 29A-29E. Second, MIXED enables CMOS CNFETs without significant (or costly) changes to transistor structure (e.g., additional FET gates or 3D FET geometries that would increase parasitics), and without imposing additional design rules that would impact circuit layouts (in fact, although it is not discussed in this manuscript, CNFET CMOS can potentially enable more compact circuit layouts versus silicon, due to the lack of design constraints enforced by n/p-wells, well taps, or doping implants in many silicon-based technologies). Finally, DREAM also enables CNFET EDP benefits to be maintained in the presence of m-CNTs using s-CNT purity that is available today. While a perfect, variation-free CNFET technology can offer 9.0× EDP benefit versus silicon at a 7 nm node (Hills 18), DREAM would still enable—in the worst case—a 7.4× EDP benefit despite 99.99% s-CNT purity (i.e., while an ideal CNT technology promises a 9× EDP benefit, a worst-case 10% energy and 10% delay cost reduces this 9× EDP benefit to 9×/(1.1*1.1)= 7.4×, since energy and delay are both increased by 1.1×). Although the cost of DREAM in this particular case is quantified, DREAM is a general technique to trade-off circuit noise immunity with energy, delay, and area in the presence of variations (such as m-CNTs). Thus, DREAM offers circuit designers multiple solutions with varying costs and noise immunity improvements to meet design goals. There are consequently multiple paths to further reduce the cost of DREAM: (1) as s-CNT purity continues to improve, the cost of DREAM will naturally improve as well (<10% energy, <10% delay, <20% area, is for 99.99% s-CNT purity that is already commercially available today, improving s-CNT purity will decrease the cost imposed by DREAM); and (2) the analysis considers DREAM implemented using a DREAM-enforcing standard cell library (as described in Methods), so that standard EDA tools today (even though they are currently unaware of DREAM) can still implement DREAM by avoiding the use of prohibited logic stage during logic synthesis and place-and-route. However, integrating DREAM directly into synthesis and place-and-route algorithms can further optimize power/timing/area while simultaneously meeting noise margin constraints, further reducing any cost associated with DREAM.

DREAM is a major step towards realizing the benefits of CNFETs, overcoming the major obstacle of m-CNTs. Contrary to previous works, DREAM requires no additional CNT-specific processing for removing m-CNTs, enabling CNFET circuits to be fabricated with commercially-available CNT purities today (relaxing the required CNT purity by ~10,000×). As a general technique for improving noise margin resilience, DREAM can be applied both to arbitrary digital logic VLSI circuits as well as a broad range of technologies.

Integrated circuits designed specifically for improved SNM as described herein can be useful for (for example) space applications, by making such circuits more robust to several different types of radiation effects such as total-ionizing-dose and soft-errors. They can also be useful for ultra-low-power applications and sub-threshold circuits to enable lower supply voltages to be used. While described herein with respect to circuits including CNTs, such design approaches can be generally applicable to any transistor based circuits/technology.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of forming a layer of carbon nanotubes on a substrate, the method comprising:
    depositing individual carbon nanotubes and at least one carbon nanotube aggregate on the substrate;
    forming an adhesive layer on the individual carbon nanotubes and the at least one carbon nanotube aggregate on the substrate, the adhesive layer adhering the individual carbon nanotubes to the substrate; and
    mechanically exfoliating the at least one carbon nanotube aggregate from the substrate.

2. The method of claim 1, further comprising, before depositing the individual carbon nanotubes and the at least one carbon nanotube aggregate on the substrate:
    coating the substrate with a carbon nanotube adhesion promoter.

3. The method of claim 1, wherein depositing the individual carbon nanotubes and the at least one carbon nanotube aggregate includes depositing via incubation, spin-coating, or dip coating.

4. The method of claim 1, wherein depositing the individual carbon nanotubes and the at least one carbon nanotube aggregate includes incubating the substrate with a solution containing carbon nanotubes having a semiconducting carbon nanotube purity from about 99.9% to about 99.99%.

5. The method of claim 1, wherein forming the adhesive layer includes forming a layer of a photoresist material on the individual carbon nanotubes.

6. The method of claim 5, wherein the photoresist material is selected from the group consisting of polydimethyldiglutarimide (PMGI), hexamethyldisilazane (HMDS), and SPR.

7. The method of claim 1, wherein forming the adhesive layer comprises:
    depositing a layer of polydimethyldiglutarimide (PMGI) on the individual carbon nanotubes and the at least one carbon nanotube aggregate on the substrate; and
    curing the layer of PMGI at a temperature of about 235° C.

8. The method of claim 7, wherein the layer of PMGI has a thickness of from about 100 nm to about 150 nm.

9. The method of claim 1, wherein mechanically exfoliating the at least one carbon nanotube aggregate from the substrate comprises:
    submerging the substrate in a solvent for a duration sufficient to remove a first portion of the adhesive layer and to retain a remaining portion of the adhesive layer; and
    sonicating the substrate in the solvent to remove the at least one carbon nanotube aggregate from the substrate, the remaining portion of the adhesive layer adhering the individual carbon nanotubes to the substrate during the sonicating.

10. The method of claim 9, further comprising, while sonicating the substrate:
    filtering and/or circulating the solvent to remove carbon nanotube aggregates released from the substrate into the solvent.

11. The method of claim 9, wherein the remaining portion of the adhesive layer is from about less than about 1 nm to about 2 nm in thickness.

12. The method of claim 1, wherein mechanically exfoliating the at least one carbon nanotube aggregate from the substrate yields a substrate surface having fewer than ten carbon nanotube aggregates per square millimeter.

13. The method of claim 1, wherein mechanically exfoliating the at least one carbon nanotube aggregate from the substrate yields a substrate surface having fewer than one carbon nanotube aggregate per square millimeter.

14. The method of claim 1, wherein mechanically exfoliating the at least one carbon nanotube aggregate comprises mechanically exfoliating the at least one carbon nanotube aggregate without exfoliating the individual carbon nanotubes.

15. The method of claim 1, further comprising:
    doping at least some of the individual carbon nanotubes to be n-channel carbon nanotubes.

16. The method of claim 1, further comprising, prior to the depositing, coating the substrate with a carbon nanotube adhesion promoter to promote adhesion of the individual carbon nanotubes and the at least one carbon nanotube aggregate to the substrate.

17. A method of making a carbon nanotube logic device, the method comprising:
    depositing individual carbon nanotubes and carbon nanotube aggregates on a substrate;
    forming a polydimethyldiglutarimide (PMGI) layer on the substrate, the PMGI layer having a thickness of about 100 nm to about 150 nm;
    submerging the substrate in a solvent for a duration sufficient to remove a portion of the PMGI layer and to retain a remaining portion of the PMGI layer; and sonicating the substrate in the solvent to remove the carbon nanotube aggregates from the substrate to yield a substrate surface coated with individual carbon nanotubes and fewer than 10 carbon nanotube aggregates per square millimeter, the remaining portion of the adhesive layer adhering the individual carbon nanotubes to the substrate during the sonicating.

18. A method of making a carbon nanotube field effect transistor (CNFET) complementary metal-oxide semiconductor (CMOS) device, the method comprising:
   depositing a first channel of individual carbon nanotubes (CNTs) and a second channel of individual CNTs on the substrate, such that at least one carbon nanotube aggregate is also deposited on the substrate;
   forming an adhesive layer on the substrate, the adhesive layer adhering the first channel and the second channel to the substrate;
   mechanically exfoliating the at least one carbon nanotube aggregate from the substrate;
   forming, in electrical contact with the first channel, a first source electrode and a first drain electrode to generate a p-type metal-oxide semiconductor (PMOS) CNFET; and
   forming, in electrical contact with the second channel, a second source electrode and a second drain electrode to generate an n-type metal-oxide semiconductor (NMOS) CNFET.

19. The method of claim 18, wherein the first source electrode and the first drain electrode are composed of platinum and the second source electrode and the second drain electrode are composed of titanium.

20. The method of claim 18, further comprising:
   forming a layer of a nonstoichiometric oxide on the second channel via atomic layer deposition (ALD).

21. The method of claim 18, further comprising, before depositing the first channel, the second channel, and the at least one carbon nanotube aggregate on the substrate:
   coating the substrate with a carbon nanotube adhesion promoter.

22. The method of claim 18, wherein forming the adhesive layer includes forming a layer of a photoresist material on the first channel and the second channel.

23. The method of claim 18, wherein mechanically exfoliating the at least one carbon nanotube aggregate from the substrate comprises:
   submerging the substrate in a solvent for a duration sufficient to remove a first portion of the adhesive layer and to retain a remaining portion of the adhesive layer; and
   sonicating the substrate in the solvent to remove the at least one carbon nanotube aggregate from the substrate, the remaining portion of the adhesive layer adhering the first channel and the second channel to the substrate during the sonicating.

* * * * *